(12) United States Patent
Kakeda

(10) Patent No.: US 6,777,269 B2
(45) Date of Patent: Aug. 17, 2004

(54) SEMICONDUCTOR INTEGRATED CIRCUIT DEVICE, DESIGN METHOD FOR SEMICONDUCTOR INTEGRATED CIRCUIT DEVICE, DESIGN AIDING DEVICE FOR SEMICONDUCTOR INTEGRATED CIRCUIT DEVICE, PROGRAM, AND PROGRAM RECORDING MEDIUM

(75) Inventor: Masahide Kakeda, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/411,916

(22) Filed: Apr. 11, 2003

(65) Prior Publication Data

US 2004/0036083 A1 Feb. 26, 2004

Related U.S. Application Data

(62) Division of application No. 10/186,760, filed on Jul. 1, 2002, now Pat. No. 6,573,605.

(30) Foreign Application Priority Data

Jul. 2, 2001 (JP) ........................................ 2001-201493

(51) Int. Cl.[7] .............................................. H01L 21/82
(52) U.S. Cl. ........................ 438/128; 438/128; 438/130
(58) Field of Search ................................ 438/128, 130, 438/131, 132; 257/211, 208, 758, 209

(56) References Cited

U.S. PATENT DOCUMENTS

| 5,631,478 A | 5/1997 | Okumura |
| 5,723,883 A | 3/1998 | Gheewalla |
| 5,877,091 A | 3/1999 | Kawakami |
| 5,898,194 A * | 4/1999 | Gheewala .................... 257/206 |
| 6,436,804 B2 | 8/2002 | Iragashi et al. |
| 6,504,187 B1 | 1/2003 | Furuichi |

* cited by examiner

Primary Examiner—David Nelms
Assistant Examiner—Thinh T Nguyen

(57) ABSTRACT

A first signal path of a circuit 300 of the present invention is formed by connecting a restricted area 331 in the electrically disconnected state, restricted areas 321 and 311 in the electrically connected state in series, using conductors 330, 320, and 310, and contacts 351 and 352. The circuit 300 is constructed by connecting in parallel six signal paths each being divided by a combination of one or two restricted areas provided thereon. Every time the circuit state is switched, a signal path disconnected by one restricted area is changed suitably to a signal path disconnected by two restricted areas, and vice versa, so as to maintain a signal path disconnected by a combination of restricted areas. By doing so, the switch of the circuit between the disconnected state and the connected state can be repeated an unlimited number of times by a change in one freely-chosen layer.

20 Claims, 34 Drawing Sheets

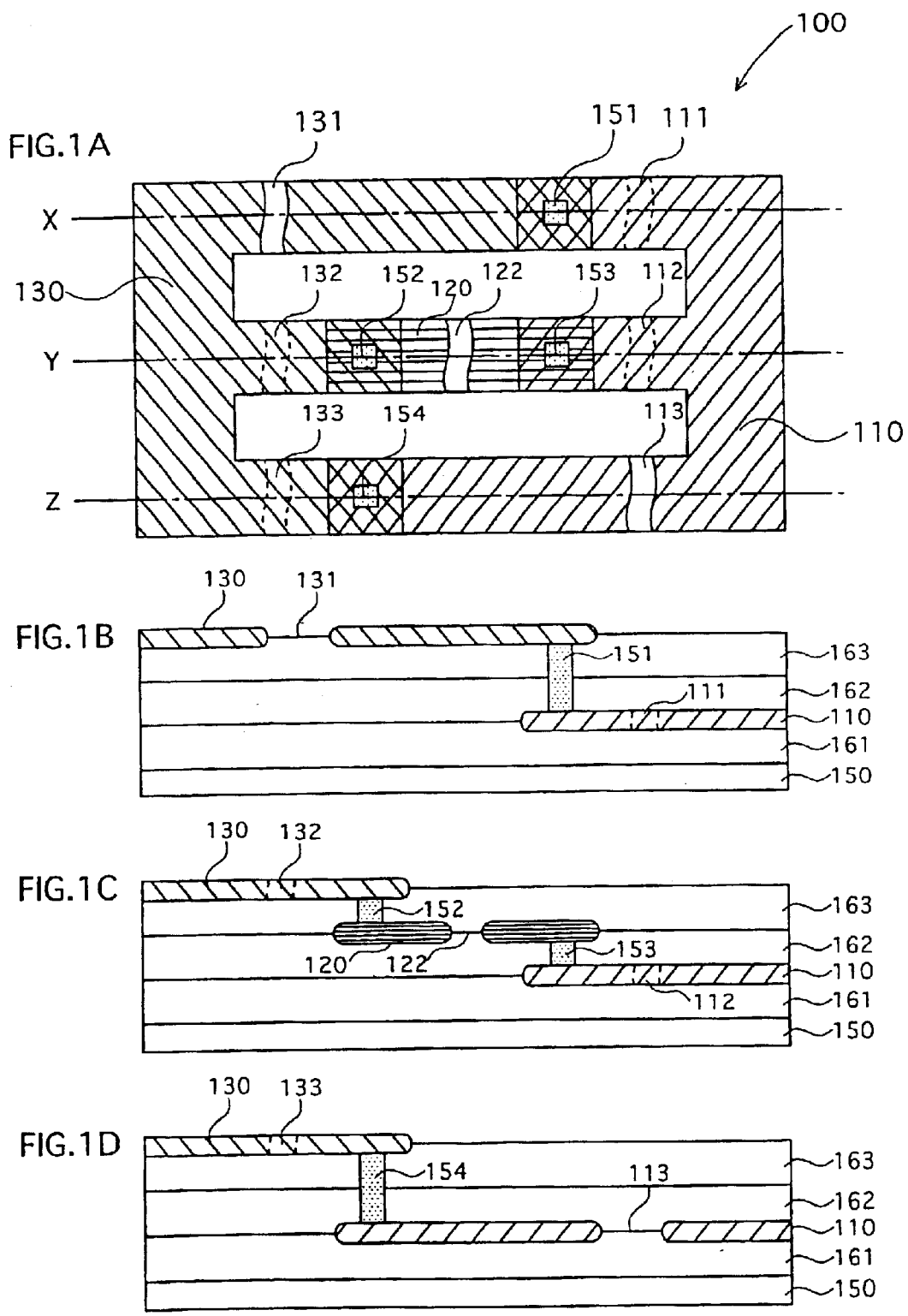

FIG.4

| | FIRST SIGNAL PATH | SECOND SIGNAL PATH | THIRD SIGNAL PATH |
|---|---|---|---|
| THIRD LAYER | OFF | ON | ON |
| SECOND LAYER | — | OFF | — |
| FIRST LAYER | ON | ON | OFF |

FIG. 7
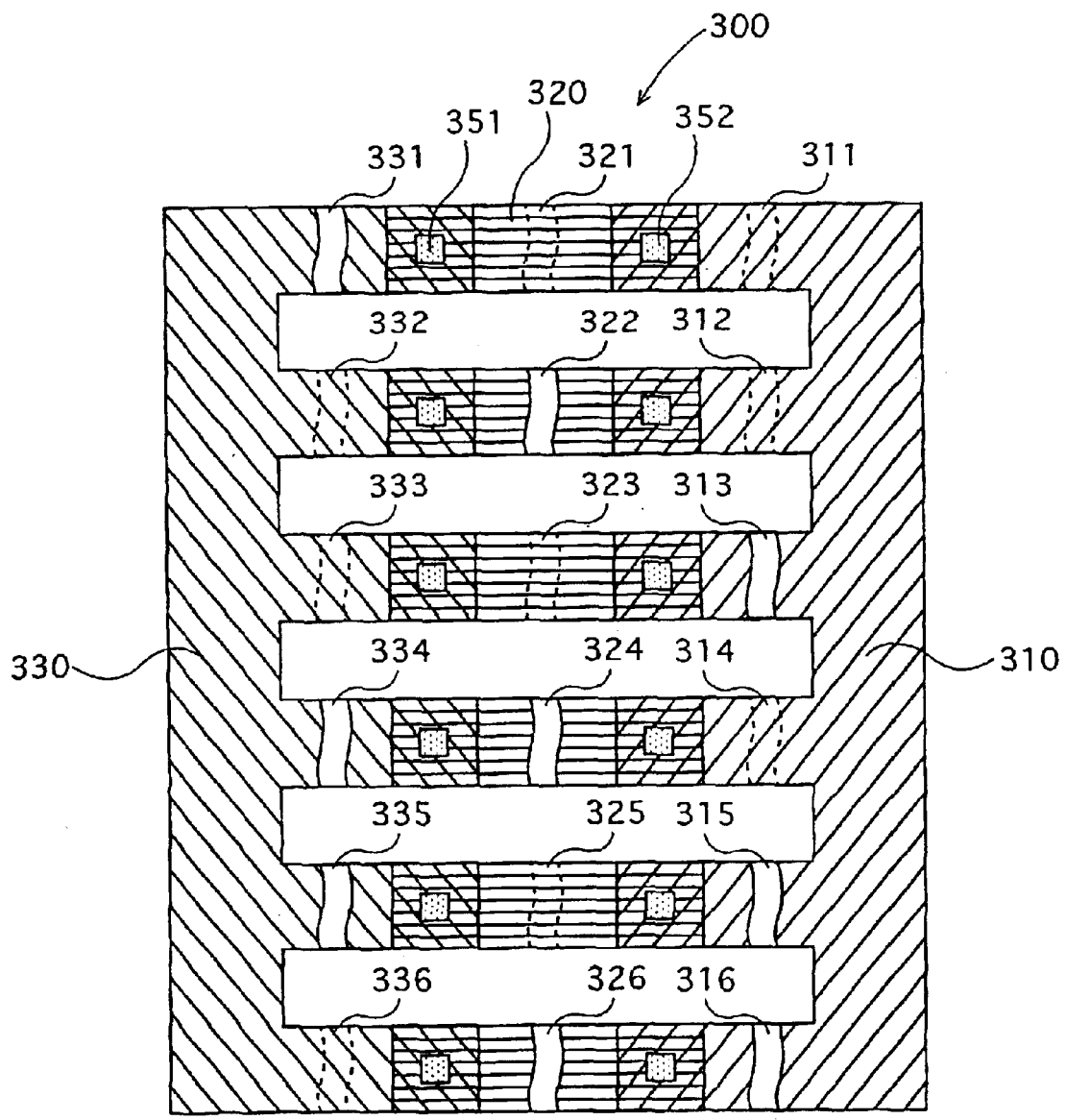
 FIRST LAYER CONDUCTOR
 SECOND LAYER CONDUCTOR
 THIRD LAYER CONDUCTOR
 CONTACT

FIG.10

| | FIRST SIGNAL PATH | SECOND SIGNAL PATH | THIRD SIGNAL PATH | FOURTH SIGNAL PATH | FIFTH SIGNAL PATH | SIXTH SIGNAL PATH |
|---|---|---|---|---|---|---|
| THIRD LAYER | OFF | ON | ON | OFF | OFF | ON |
| SECOND LAYER | ON | OFF | ON | OFF | ON | OFF |
| FIRST LAYER | ON | ON | OFF | ON | OFF | OFF |

FIG.18

| NUMBER | CATEGORY | TARGET LAYER | APPLIED RULE | STATE EXPRESSION | DESIGN INFORMATION | | | | | | |
|---|---|---|---|---|---|---|---|---|---|---|---|
| — | (INITIAL STATE) | | — | S | A1 | A2 | A3 | B12 | B13 | B23 | |
| 1 | CONNECTED | THIRD LAYER | f2 | S+(C-A3) | A1 | A2 | C | B12 | B13 | B23 | |
| 2 | DISCONNECTED | FIRST LAYER | g3 | S+(A1-B13) | A1 | C | A1 | B12 | A3 | B23 | |
| 3 | CONNECTED | SECOND LAYER | f2 | S+(A1-B13)+(C-A2) | A1 | C | A1 | B12 | A3 | B23 | |
| 4 | DISCONNECTED | THIRD LAYER | g1 | S+(C-A2) | B13 | A3 | A1 | B12 | A3 | A2 | |
| | | | g3 | S+(A3-B23) | B13 | A3 | A1 | B12 | A3 | A2 | |
| 5 | CONNECTED | SECOND LAYER | f1 | S | B13 | A23 | A1 | B12 | A3 | A2 | |
| | | | f2 | S+(C-A2) | B13 | B23 | A1 | B12 | A3 | C | |
| 6 | DISCONNECTED | SECOND LAYER | g2 | S | B13 | B23 | A1 | B12 | A3 | A2 | |

FIG.20

|  | FIRST SIGNAL PATH | SECOND SIGNAL PATH | ... |
|---|---|---|---|
| THIRD LAYER | a13 | a23 | ... |
| SECOND LAYER | a12 | a22 | ... |
| FIRST LAYER | a11 | a21 | ... |

| CELL BLOCK NUMBER (821) | PRESENT CELL NUMBER (822) |
|---|---|
| 001001 | 0001 |
| 001002 | 0002 |
| ... | ... |

SEMICONDUCTOR INTEGRATED CIRCUIT DEVICE, DESIGN METHOD FOR SEMICONDUCTOR INTEGRATED CIRCUIT DEVICE, DESIGN AIDING DEVICE FOR SEMICONDUCTOR INTEGRATED CIRCUIT DEVICE, PROGRAM, AND PROGRAM RECORDING MEDIUM

This is a divisional application of U.S. Ser. No. 10/186,760, filed on Jul. 1, 2002 now U.S. Pat. No. 6,573,605.

BACKGROUND OF THE INVENTION

1. Field of the Invention

The present invention relates to a two-terminal circuit that is incorporated in a semiconductor integrated circuit device with a multilayer structure, a semiconductor integrated circuit that includes the two-terminal circuit, a method for changing design information that represents the two-terminal circuit, and a design aiding device that provides an aid in changing design information that represents the two-terminal circuit.

2. Description of the Related Art

In response to recent demands for smaller, faster, and more power-saving semiconductor IC (integrated circuit) devices, semiconductor IC devices with a multilayer structure have been commercialized. A semiconductor IC device with a multilayer structure is constructed by laminating, on a semiconductor substrate, a plurality of layers of circuit elements including insulators, metal wiring lines, wells, contacts, poly silicon, etc.

A semiconductor IC device with a multilayer structure exhibits improved packaging density because a three-dimensional circuit is formed on a semiconductor substrate in the semiconductor IC device. The improved packaging density, together with the finer-line processes, contributes to achieving smaller, faster, and more power-saving features of the semiconductor IC device.

To form the layers of the circuit elements on the semiconductor substrate, a plurality of masks showing layout patterns corresponding to the layers are used. The layers of the circuit elements are formed one after another, by repeatedly processing the semiconductor substrate using a mask showing the corresponding layout pattern.

Some conventional semiconductor IC devices with a multilayer structure have switches for various purposes.

A conventional switch referred to herein intends to mean a part of a predetermined layer that is formed as being in the electrically connected state or in the electrically disconnected state. In accordance with a layout pattern corresponding to the predetermined layer, the part being in the electrically-connected state is formed by filling the part with a conductive material such as a metal wiring line and poly silicon, or the part being in the electrically-disconnected state is formed by leaving the part as an insulating part.

The state of such switches is set different for each prototype version of semiconductor IC devices or for each manufacturing lot of semiconductor IC devices. The following describes use examples of such switches.

(1) Semiconductor IC devices are each provided with a switch, and a circuit that delays a signal for which a timing adjustment is expected, by a time period in accordance with the state of the switch. When a semiconductor IC device of a certain prototype version is found to have a defective relating to a timing of such a signal, the state of a switch in a semiconductor IC device of a new version is changed to adjust the timing of the signal. By doing so, the defective can be eliminated in the semiconductor IC device of the new version.

(2) The state of switches is set different for each design version of semiconductor IC devices. By doing so, each semiconductor IC device is given an ID number for identifying its design version.

(3) An original layout pattern is designed so as to execute all or some of the functions in accordance with the state of switches included therein. By changing the state of the switches of the original layout pattern, a number of layout patterns that are based on the original layout pattern and that each differ in a range of executing the functions can be generated. By doing so, a variety of semiconductor IC devices with different additional features can be manufactured efficiently.

As described above, such conventional switches set different for each prototype version, each manufacturing lot, and the like, are integrated into semiconductor IC devices to achieve various purposes such as defective correction, version identification, and more efficient manufacturing.

Here, the following describes a conventional way to manufacture the above semiconductor IC device of the new version in which the state of the switch has been changed. First, a new layout pattern for the layer including the switch is drafted by a designer. A new mask is prepared according to the drafted layout pattern for the layer. A semiconductor substrate is then newly processed using the newly prepared mask for the layer including the switch and the previously used masks for the other layers.

The problem here is that the time and cost required for preparing masks are substantial because a method for optically correcting proximity effect and the like is employed to deal with the recent trend of finer lines. One solution for reducing the time and cost required for such remake of semiconductor IC devices, accordingly, is to reduce the number of masks to be newly prepared.

To manufacture the semiconductor IC device of the new version in which the state of the switch has been changed with the above conventional technique, however, preparation of the new mask for the layer including the switch cannot be avoided as described above. Here, suppose that another defective is found in a layer other than the layer including the switch. According to the above conventional technique, a new mask for that layer also needs to be prepared for the purpose of correcting the defective. In this case, two new masks in total need to be prepared. This situation may be a failure in reducing the time and cost for manufacturing semiconductor IC devices.

SUMMARY OF THE INVENTION

To solve the above problem, the present invention aims to provide a two-terminal circuit that is formed in a multilayer semiconductor IC device so as to extend over a plurality of layers thereof, and that makes it possible to manufacture a new two-terminal circuit that differs from the two-terminal circuit of the present invention in the state of a circuit part in one freely-chosen layer and accordingly in the signal transmission state being switched between the signal-transmittable state and the signal-untransmittable state. The two-terminal circuit of the present invention can therefore contribute to reducing the manufacturing time and cost. Further, the present invention aims to provide a semiconductor IC device including the above two-terminal circuit, a method for changing design information representing the above two-terminal circuit, and a design aiding device that provides an aid in changing design information representing the above two-terminal circuit.

(1) A two-terminal circuit of the present invention is formed in a multilayer semiconductor integrated circuit device so as to extend over a plurality of layers thereof, and is characterized by including a plurality of signal paths, each of which is laid at one or more of the plurality of layers to connect two terminals of the circuit, and includes a restricted part at each of the one or more layers, the restricted part being formed either in (a) a connected state for permitting transmission of a signal at the restricted part of the signal path or in (b) a disconnected state for preventing transmission of a signal at the restricted part of the signal path, wherein each of the plurality of layers includes at least different one of the plurality of signal paths that is laid thereat.

According to this construction, each of the layers includes at least one different signal path that is laid thereat. Therefore, by forming one restricted part of the one different signal path laid at each layer to be in the disconnected state and all the other restricted parts to be in the connected state, a first two-terminal circuit that is in the state incapable of transmitting a signal can be manufactured. Based on the first two-terminal circuit, a second two-terminal circuit in which restricted parts included in a freely-chosen layer are in the connected state and that is in the state capable of transmitting a signal can be manufactured.

The following is a case where a second semiconductor integrated circuit device including the second two-terminal circuit is to be manufactured based on a first semiconductor integrated circuit device including the first two-terminal circuit. Here, suppose that a mask for a specific layer needs to be newly prepared due to a defective found in the specific layer or the like. In this case, the state of restricted parts included in the specific layer may be changed, so that the second semiconductor integrated circuit device can be manufactured with a smaller number of masks to be newly prepared. As a result, the time and cost required for such remake of the semiconductor integrated circuit devices can be reduced.

Also, according to the above construction, even when such remake of the semiconductor integrated circuit devices is realized with a method that does not involve preparation of new masks, such as a processing method utilizing FIB (Focused Ion Beam), the number of layers to be processed can still be reduced. In this case too, therefore, the time and cost required for such remake of the semiconductor integrated circuit devices can be reduced.

(2) Also, in the two-terminal circuit described in the item (1), each signal path may be laid at and pass through all of the plurality of layers, to connect the two terminals.

According to this construction, each signal path in the two-terminal circuit includes one or more restricted parts included in each of the plurality of layers. Therefore, by providing a signal path whose restricted parts all are in the connected state, the first two-terminal circuit that is in the state capable of transmitting a signal can be manufactured. Based on the first two-terminal circuit, the second two-terminal circuit in which restricted parts included in one freely-chosen layer all are in the disconnected state and that is in the state incapable of transmitting a signal can be manufactured. As a result, the time and cost required for such remake of the circuits can be reduced.

(3) Also, in the two-terminal circuit described in the item (2), in each signal path, restricted parts in the plurality of layers may be formed in one of the following states where (a) restricted parts in all the layers are in the connected state, (b) a restricted part in one layer is in the disconnected state and restricted parts in layers other than the one layer are in the connected state, and (c) restricted parts in two layers are in the connected state and restricted parts in layers other than the two layers are in the connected state.

According to this construction, when a new two-terminal circuit that differs in the signal transmission state is repeatedly manufactured, the new two-terminal circuit is made to include a suitable one of a signal path in the state (b) and a signal path in the state (c). By doing so, a new two-terminal circuit can be manufactured repeatedly an unlimited number of times.

As a result of this, the time and cost required for such remake of a semiconductor integrated circuit device including the two-terminal circuit can be reduced over an unlimited number of times.

(4) Also, in the two-terminal circuit described in the item (2), each signal path may be sequentially laid at and pass through adjacent layers of the plurality of layers, to connect the two terminals.

According to this construction, the two-terminal circuit has the effect of reducing the time and cost required for such remake of semiconductor integrated circuit devices. Further, each contact can be formed to have a thickness corresponding to one layer. In this case, the total length of the contacts can be minimized, and so the signal delay time of the two-terminal circuit can be shortened accordingly.

(5) A signal selection circuit of the present invention includes: a plurality of input terminals; a plurality of two-terminal circuits, each of which is a two-terminal circuit described in the item (1), and is provided in correspondence with different one of the input terminals, a first terminal of each two-terminal circuit being electrically connected to the corresponding input terminal; and an output terminal that is electrically connected to a second terminal of each two-terminal circuit.

According to this construction, one of the two-terminal circuits can be formed in the state capable of transmitting a signal and the other two-terminal circuits can be formed in the state incapable of transmitting a signal. By doing so, based on the signal selection circuit of the present invention that selects a predetermined signal, a signal selection circuit that differs from the signal selection circuit of the present invention in the state in one freely-chosen layer and that selects a signal other than the predetermined signal can be manufactured. As a result, the time and cost required for such remake of the circuit can be reduced.

(6) A standard cell of the present invention is formed in a multilayer semiconductor integrated circuit device, including a two-terminal circuit described in the item (1).

According to this construction, based on the standard cell of the present invention, a standard cell that differs from the standard cell of the present invention in the state in one freely-chosen layer and that includes a two-terminal circuit whose signal transmission state differs from that of a two-terminal circuit included in the standard cell of the present invention can be manufactured. As a result, the time and cost required for such remake of the standard cell can be reduced.

(7) The standard cell described in the item (6) may include: a plurality of input terminals that are electrically connected to an outside of the standard cell; a plurality of two-terminal circuits, each of which is a two-terminal circuit described in the item (1), and is provided in correspondence with different one of the input terminals, a first terminal of each two-terminal circuit being electrically connected to the corresponding input terminal; and an output terminal that is electrically connected to a second terminal of each two-terminal circuit, and that is electrically connected to an outside of the standard cell.

According to this construction, one of the two-terminal circuits can be formed in the state capable of transmitting a signal and the other two-terminal circuits can be formed in the state incapable of transmitting a signal. By doing so, based on the standard cell of the present invention that selects a predetermined signal, a standard cell that differs from the standard cell of the present invention in the state in one freely-chosen layer and that selects a signal other than the predetermined signal can be manufactured. As a result, the time and cost required for such remake of the standard cell can be reduced.

(8) Also, a standard cell group of the present invention includes an input standard cell and an output standard cell, the input standard cell being a standard cell described in the item (6), including: a first input terminal that is electrically connected to an outside of the input standard cell; a first two-terminal circuit that is a two-terminal circuit described in the item (1), a first terminal thereof being electrically connected to the first input terminal; and a first relay output terminal that is electrically connected to a second terminal of the first two-terminal circuit, and the output standard cell being a standard cell described in the item (6), including: a second input terminal that is electrically connected to an outside of the output standard cell; a second two-terminal circuit that is a two-terminal circuit described in the item (1), a first terminal thereof being electrically connected to the second input terminal; a first relay input terminal; and an output terminal that is electrically connected to a second terminal of the second two-terminal circuit and to the first relay input terminal, and that is electrically connected to an outside of the output standard cell, wherein when the input standard cell and the output standard cell are placed at predetermined locations, the first relay output terminal and the first relay input terminal are electrically connected to each other.

According to this construction, the standard cell group of the present invention has the same effect as described in the item (7). Furthermore, a group of standard cells that can select a signal from the same number of input signals as that for the standard cell described in the item (7) can be realized, using standard cells of less variety than the standard cell described the item (7).

(9) The standard cell group described in the item (8) may further include a relay standard cell that is a standard cell described in the item (6), the relay standard cell including: a third input terminal that is electrically connected to an outside of the relay standard cell; a third two-terminal circuit that is a two-terminal circuit described in the item (1), a first terminal thereof being electrically connected to the third input terminal; a second relay input terminal; and a second relay output terminal that is electrically connected to a second terminal of the third two-terminal circuit and to the second relay input terminal, wherein when the input standard cell, the output standard cell, and the relay standard cell are placed at predetermined locations, the first relay output terminal and the second relay input terminal may be electrically connected to each other, and the second relay output terminal and the first relay input terminal may be electrically connected to each other.

According to this construction, the standard cell group of the present invention has the same effect as described in the item (8).

(10) The standard cell described in the item (6) may further include: one or both of a pull-down circuit and a pull-up circuit; and an output terminal that is electrically connected to a first terminal of the two-terminal circuit, and that is electrically connected to an outside of the standard cell, wherein either the first terminal of the two-terminal circuit maybe electrically connected to the pull-down circuit and a second terminal of the two-terminal circuit may be electrically connected to a power supply, or the first terminal of the two-terminal circuit may be electrically connected to the pull-up circuit and the second terminal of the two-terminal circuit may be electrically connected to a ground.

According to this construction, based on the standard cell of the present invention, a standard cell that differs from the standard cell of the present invention in the state in one freely-chosen layer and in an output signal level being switched can be manufactured. As a result, the time and cost required for such remake of the standard cell can be reduced.

(11) Also, the standard cell described in the item (6) may further include: one or both of a pull-down circuit and a pull-up circuit; a first input terminal that is electrically connected to an outside of the standard cell; a second input terminal that is electrically connected to an outside of the standard cell; a gate circuit that passes one of (a) a signal that has been inputted into the first input terminal and (b) a signal that has been inputted into the second input terminal, according to a signal obtained from a first terminal of the two-terminal circuit; and an output terminal that outputs the signal that has been passed from the gate circuit, to an outside of the standard cell, wherein either the first terminal of the two-terminal circuit may be electrically connected to the pull-down circuit and a second terminal of the two-terminal circuit may be electrically connected to a power supply, or the first terminal of the two-terminal circuit may be electrically connected to the pull-up circuit and the second terminal of the two-terminal circuit may be electrically connected to a ground.

According to this construction, the gate circuit can be generally formed in a smaller area than the two-terminal circuit. Therefore, the standard cell can be formed in a smaller area than the standard cell described in the item (7), and has the same effect as the standard cell described in the item (7).

(12) A variable delay circuit of the present invention includes: a signal delay circuit that delays an input signal to generate one or more delay signals each having a different delay time; and a signal selection circuit that is a signal selection circuit described in the item (5), and includes a plurality of input terminals into which a plurality of signals out of the input signal and the generated delay signals are inputted respectively.

According to this construction, based on the signal delay circuit of the present invention, a signal delay circuit that differs from the signal delay circuit of the present invention in the state in one freely-chosen layer and in a time period by which a signal is delayed can be manufactured. As a result, the time and cost required for such remake of the circuit can be reduced.

(13) A semiconductor integrated circuit device of the present invention can execute a plurality of functions, and includes: a two-terminal circuit that is a two-terminal circuit described in the item (1); and a restriction circuit that restricts at least one function identified by a state of the two-terminal circuit, out of the plurality of functions.

According to this construction, based on the semiconductor integrated circuit device of the present invention, a semiconductor integrated circuit device that differs from the semiconductor integrated circuit device of the present invention in the state in one freely-chosen layer and in a range of restricted functions can be manufactured. As a result, the time and cost required for such remake of the semiconductor integrated circuit device can be reduced.

(14) A semiconductor integrated circuit device of the present invention in which first information that needs to be concealed from a user is generated, includes: a two-terminal circuit that is a two-terminal circuit described in the item (1); an encryption circuit that encrypts the first information using key information identified by a state of the two-terminal circuit, to generate second information; and an output circuit that outputs the second information to an outside of the device.

According to this construction, based on the semiconductor integrated circuit device of the present invention, a semiconductor integrated circuit device that differs from the semiconductor integrated circuit device of the present invention in the state in one freely-chosen layer and in key information used for encryption can be manufactured. To be more specific, the semiconductor integrated circuit that has alternative key information for the purpose of maintaining reliability of encryption of the second information can be manufactured by a change in one freely-chosen layer. As a result, the time and cost required for such remake of the semiconductor integrated circuit device can be reduced.

(15) The semiconductor integrated circuit device described in the item (14) may further include a signal selection circuit that is a signal selection circuit described in the item (5) and that includes an input terminal in which the first information has been inputted and an input terminal in which the second information has been inputted, wherein the output circuit may output one of the first information and the second information that is outputted from the signal selection circuit, to an outside of the device.

According to this construction, based on the semiconductor integrated circuit that outputs the first information, a semiconductor integrated circuit that differs from the semiconductor integrated circuit that outputs the first information in the state in one freely-chosen layer and that outputs the second information can be manufactured, and vice versa. To be more specific, a semiconductor integrated circuit that outputs either of the first information or the second information can be manufactured in accordance with its use, by a change in one freely-chosen layer. As a result, the time and cost required for such remake of the semiconductor integrated circuit devices can be reduced.

(16) A design method of the present invention is for changing design information representing a two-terminal circuit described in the item (2) that is in a state incapable of transmitting a signal, so as to represent a two-terminal circuit described in the item (2) that is in a state capable of transmitting a signal, the design information indicating whether each restricted part of each signal path included in the two-terminal circuit is to be formed in the connected state or in the disconnected state, the design method including: an obtaining step of obtaining designation information that designates a target layer in which a change is to be made; and a connecting step of changing the design information indicating that one signal path includes a restricted part in the target layer to be in the disconnected state and restricted parts in layers other than the target layer to be in the connected state, so as to indicate that the signal path includes the restricted part in the target layer to be in the connected state.

According to this construction, the design method can judge whether (a) the design information representing a two-terminal circuit can be changed to represent a two-terminal circuit that differs in the state of restricted parts in one designated layer and in the signal transmission state having been switched between the signal-transmittable state and the signal-untransmittable state, or (b) such a change in the design information is impossible.

Suppose that a correction of a defective found in a specific layer is also to be performed, when the signal transmission state of the two-terminal circuit is to be switched. In such a case, the signal transmission state of the circuit can be switched by designating the specific layer using the above design method, so that the number of layers to be changed can be reduced. This contributes to reducing the time and cost required for such remake of the circuit.

(17) A design method of the present invention is for changing design information representing a two-terminal circuit described in the item (2) that is in a state capable of transmitting a signal, so as to represent a two-terminal circuit described in the item (2) that is in a state incapable of transmitting a signal, the design information indicating whether each restricted part of each signal path included in the two-terminal circuit is to be formed in the connected state or in the disconnected state, the design method including: an obtaining step of obtaining designation information that designates a target layer in which a change is to be made; and a disconnecting step of changing the design information indicating that one signal path includes restricted parts in all the layers to be in the connected state, so as to indicate that the signal path includes the restricted part in the target layer to be in the disconnected state.

According to this construction, the design method of the present invention has the same effect as described in the item (16).

(18) A design method of the present invention is for changing design information representing a two-terminal circuit described in the item (2) that is in a state incapable of transmitting a signal, so as to represent a two-terminal circuit described in the item (2) that is in a state capable of transmitting a signal, the design information indicating whether each restricted part of each signal path included in the two-terminal circuit is to be formed in the connected state or in the disconnected state, the design method including: an obtaining step of obtaining designation information that designates a target layer in which a change is to be made; a connecting step of changing the design information indicating that one signal path includes a restricted part in the target layer to be in a disconnected state and restricted parts in layers other than the target layer to be in the connected state, so as to indicate that the signal path includes the restricted part in the target layer to be in the connected state; and a preparing step of changing the design information indicating that one signal path includes a restricted part in a reference layer that is different from the target layer to be in the disconnected state and restricted parts in layers other than the reference layer to be in the connected state, so as to indicate that the signal path includes the restricted part in the target layer to be in the disconnected state.

According to this construction, the design method of the present invention has the same effect as described in the item (16). Further, the design method of the present invention and the design method described in the item (20) can be alternately applied when the design method representing the two-terminal circuit is changed repeatedly to represent a new two-terminal circuit that differs in the state of restricted parts in one freely-chosen layer. In this case, the preparing step can be executed suitably, so that such repeated change of the design information can be performed an unlimited number of times.

By doing so, the time and cost required for such remake of a semiconductor integrated circuit represented by the design information can be reduced over an unlimited number of times.

(19) The design method described in the item (18) uses a state expression showing a change record of the design information, and may further include: a state expression updating step of updating the state expression by using a transformation rule in which a left part of an arrow matches the state expression, out of a transformation rule [i] "T1+(Ax−Bkx)→T1", and a transformation rule [ii] "T→T+(C−Ak)", where "k" is a layer number identifying the target layer, "x" is a layer number that is different from "k", "T1+(Ax−Bkx)" and "T" each are the state expression, "T1" is a partial expression included in the state expression, and "Ak", "Ax", "Bkx", and "C" each are a constant term included in the state expression, in such a manner that the state expression is changed to be a right part of the arrow in the used transformation rule; and a controlling step of (a) executing the preparing step by setting a layer identified by the layer number "x" as the reference layer when the state expression is updated by using the transformation rule [i], and (b) executing the connecting step when the state expression is updated by using the transformation rule [ii].

According to this construction, the design method of the present invention has the same effect as described in the item (18).

(20) A design method of the present invention is for changing design information representing a two-terminal circuit described in the item (2) that is in a state capable of transmitting a signal, so as to represent a two-terminal circuit described in the item (2) that is in a state incapable of transmitting a signal, the design information indicating whether each restricted part of each signal path included in the two-terminal circuit is to be formed in the connected state or in the disconnected state, the design method including: an obtaining step of obtaining designation information that designates a target layer in which a change is to be made; a disconnecting step of changing the design information indicating that one signal path includes restricted parts in all the layers to be in the connected state, so as to indicate that the signal path includes the restricted part in the target layer to be in the disconnected state; and a first preparing step of changing the design information indicating that one signal path includes a restricted part in the target layer and a restricted part in a first reference layer that is different from the target layer to be in the disconnected state and restricted parts in layers other than the target layer and the first reference layer to be in the connected state, so as to indicate that the signal path includes the restricted part in the target layer to be in the connected state; and a second preparing step of changing the design information indicating that one signal path includes a restricted part in a second reference layer that is different from the target layer to be in the disconnected state and restricted parts in layers other than the second reference layer to be in the connected state, so as to indicate that the signal path includes the restricted part in the target layer to be in the disconnected state.

According to this construction, the design method has the same effect as described in the item (16). Further, the design method of the present invention and the design method described in the item (18) can be alternately applied when the design method representing the two-terminal circuit is changed repeatedly to represent a new two-terminal circuit that differs in the state of restricted parts in one freely-chosen layer. In this case, the first preparing step and the second preparing step can be executed suitably, so that such repeated change of the design information can be performed an unlimited number of times.

By doing so, the time and cost required for such remake of a semiconductor integrated circuit represented by the design information can be reduced over an unlimited number of times.

(21) Also, the design method descried in the item (20) uses a state expression showing a change record of the design information, and may further include: a state expression updating step of updating the state expression by using a transformation rule in which a left part of an arrow matches the state expression, out of a transformation rule [i] "T1+(Ax−Bmx)→T1", a transformation rule [ii] "T2+(C−Am)→T2", and a transformation rule [iii] "T3+(C−Ay)→T3+(Am−Bmy)", where "m" is a layer number identifying the target layer, "x" and "y" each are a layer number that is different from "m", "T1+(Ax−Bmx)". "T2+(C−Am)", and "T3+(C−Ay)" each are the state expression, "T1", "T2", and "T3" each are a partial expression included in the state expression, and "Ax", "Am", "Ay", "Bmx", "Bmy", and "C" each are a constant term included in the state expression, in such a manner that the state expression is changed to be a right part of the arrow in the used transformation rule; and a controlling step of (a) executing the second preparing step by setting a layer identified by the layer number "x" as the second reference layer when the state expression is updated by using the transformation rule [i], (b) executing the disconnecting step when the state expression is updated by using the transformation rule [ii], and (c) executing the disconnecting step and the first preparing step by setting a layer identified by the layer number "y" as the first reference layer when the state expression is updated by using the transformation rule [iii].

According to this construction, the design method of the present invention has the same effect as described in the item (20).

(22) A design aiding device of the present invention provides an aid in changing design information representing a two-terminal circuit described in the item (2) that is in a state incapable of transmitting a signal, so as to represent a two-terminal circuit described in the item (2) that is in a state capable of transmitting a signal, and includes: a design information storing unit for storing design information that indicates whether each restricted part of each signal path included in the two-terminal circuit is to be formed in the connected state or in the disconnected state; a state expression storing unit for storing a state expression showing a change record of the design information; a state expression updating unit for updating the state expression by using one of transformation rules described in the item (19); and a design information changing unit for changing the design information according to the one of the transformation rules that has been used to update the state expression.

According to this construction, the design aiding device of the present invention has the same effect as described in the item (19).

(23) A design aiding device of the present invention provides an aid in changing design information representing a two-terminal circuit described in the item (2) that is in a state capable of transmitting a signal, so as to represent a two-terminal circuit described in the item (2) that is in a state incapable of transmitting a signal, and includes: a design information storing unit for storing design information that indicates whether each restricted part of each signal path included in the two-terminal circuit is to be formed in the connected state or in the disconnected state; a state expression storing unit for storing a state expression showing a change record of the design information; a state expression updating unit for updating the state expression by using one of transformation rules described in the item (21); and a design information changing unit for changing the design information according to the one of the transformation rules that has been used to update the state expression.

According to this construction, the design aiding device of the present invention has the same effect as described in the item (21).

(24) A design method of the present invention is for selecting an initial construction of a two-terminal circuit described in the item (2), the initial construction enabling a two-terminal circuit whose circuit state is switched between a signal-transmittable state and a signal-untransmittable state to be constructed repeatedly at least a predetermined number of times by changing a state of one or more restricted parts on a target layer each time, the design method including: an obtaining step of obtaining information that indicates the predetermined number of times "N"; a first calculating step of calculating a number of signal paths "A" that constitute a first candidate circuit that is represented by first design information to which a change operation according to the design method describe in the item (16) and a change operation according to the design method described in the item (17) can be alternately applied at least the number of times "N"; a second calculating step of calculating a number of signal paths "B" that constitute a second candidate circuit that is represented by second design information to which a change operation according to the design method described in the item (18) and a change operation according to the design method described in the item (20) can be alternately applied an unlimited number of times; and a selecting step of (a) selecting, as the initial construction, a construction of the first candidate circuit in a case where the number of signal paths "A" is smaller than the number of signal paths "B", and (b) selecting, as the initial construction, a construction of the second candidate circuit in a case where the number of signal paths "A" is not smaller than the number of signal paths "B".

According to this construction, the design method of the present invention enables a selection of the construction of a two-terminal circuit, in such a manner that a two-terminal circuit including the minimum number of signal paths can be selected.

(25) A design method of the present invention is for selecting, against a first standard cell including a two-terminal circuit described in the item (2) that is presently being selected, a second standard cell that differs from the first standard cell only in that a signal transmission state of a two-terminal circuit included therein is being switched, the design method using alternative information identifying an alternative standard cell that includes a two-terminal circuit whose signal transmission state differs from the signal transmission state of the two-terminal circuit included in the second standard cell by changing a state of restricted parts in a target layer of the two-terminal circuit, each of the plurality of layers being set as the target layer, the design method including: an obtaining step of obtaining designation information that designates the target layer; and a selecting step of selecting, as the second standard cell, the alternative standard cell identified by the alternative information for the designated target layer.

According to this construction, the design method can identify an alternative standard cell that is to be the second standard cell according to the first standard cell and the obtained target layer, by referring to alternative information that has been calculated in advance.

This can save a designer the operation for considering a state change of each restricted part in the first standard cell, as to the design change involving a selection of the second standard cell. Therefore, the design change can be performed more efficiently.

(26) A design aiding device of the present invention provides an aid in selecting, against a first standard cell including a two-terminal circuit described in the item (2) that is presently being selected, a second standard cell that differs from the first standard cell only in that a signal transmission state of a two-terminal circuit included therein is being switched, the design aiding device including: an alternative information storing unit for storing alternative information that identifies an alternative standard cell that includes a two-terminal circuit whose signal transmission state differs from the signal transmission state of the two-terminal circuit included in the second standard cell by changing a state of restricted parts in a target layer of the two-terminal, each of the plurality of layers being set as the target layer; an obtaining unit for obtaining designation information that designates the target layer; and a selecting unit for selecting, as the second standard cell, the alternative standard cell identified by the alternative information for the designated target layer.

According to this construction, the design aiding device can provide an aid in design that has the same effect as described in the item (25).

(27) A program of the present invention is a computer-executable program that is executed on a computer to provide an aid in design for changing design information representing a two-terminal circuit described in the item (2) that is in a state incapable of transmitting a signal, so as to represent a two-terminal circuit described in the item (2) that is in a state capable of transmitting a signal, the design information indicating whether each restricted part of each signal path included in the two-terminal circuit is to be formed in the connected state or in the disconnected state, the program making the computer execute the steps of: obtaining designation information that designates a target layer in which a change is to be made; and changing the design information indicating that one signal path includes a restricted part in the target layer to be in the disconnected state and restricted parts in layers other than the target layer to be in the connected state, so as to indicate that the signal path includes the restricted part in the target layer to be in the connected state.

According to this construction, the program can provide an aid in design that has the same effect as described in the item (16).

(28) A program of the present invention is a computer-executable program that is executed on a computer to provide an aid in design for changing design information representing a two-terminal circuit described in the item (2) that is in a state capable of transmitting a signal, so as to represent a two-terminal circuit described in the item (2) that is in a state incapable of transmitting a signal, the design information indicating whether each restricted part of each signal path included in the two-terminal circuit is to be formed in the connected state or in the disconnected state, the program making the computer execute the steps of: obtaining designation information that designates a target layer in which a change is to be made; and changing the design information indicating that one signal path includes restricted parts in all the layers to be in the connected state, so as to indicate that the signal path includes the restricted part in the target layer to be in the disconnected state.

According to this construction, the program can provide an aid in design that has the same effect as described in the item (17).

(29) A program of the present invention is a computer-executable program that is executed on a computer to provide an aid in design for changing design information representing a two-terminal circuit described in the item (2) that is in a state incapable of transmitting a signal, so as to represent a two-terminal circuit described in the item (2) that is in a state capable of transmitting a signal, the design information indicating whether each restricted part of each signal path included in the two-terminal circuit is to be formed in the connected state or in the disconnected state, the program making the computer execute the steps of: obtaining designation information that designates a target layer in which a change is to be made; changing the design information indicating that one signal path includes a restricted part in the target layer to be in the disconnected state and restricted parts in layers other than the target layer to be in the connected state, so as to indicate that the signal path includes the restricted part in the target layer to be in the connected state; and changing the design information indicating that one signal path includes a restricted part in a reference layer that is different from the target layer to be in the disconnected state and restricted parts in layers other than the reference layer to be in the connected state, so as to indicate that the signal path includes the restricted part in the target layer to be in the disconnected state.

According to this construction, the program can provide an aid in design that has the same effect as described in the item (18).

(30) In the program described in the item (29), the design may be performed using a state expression showing a change record of the design information, and the program may further make the computer execute the steps of: updating the state expression by using a transformation rule in which a left part of an arrow matches the state expression, out of a transformation rule [i] "T1+(Ax−Bkx)→T1", and a transformation rule [ii] "T→T+(C−Ak)", where "k" is a layer number identifying the target layer, "x" is a layer number that is different from "k", "T1+(Ax−Bkx)" and "T" each are the state expression, "T1" is a partial expression included in the state expression, and "Ak", "Ax", "Bkx", and "C" each are a constant term included in the state expression, in such a manner that the state expression is changed to be a right part of the arrow in the used transformation rule; and (a) executing the preparing step by setting a layer identified by the layer number "x" as the reference layer when the state expression is updated by using the transformation rule [i], and (b) executing the connecting step when the state expression is updated by using the transformation rule [ii].

According to this construction, the program can provide an aid in design that has the same effect as described in the item (19).

(31) A program of the present invention is a computer-executable program that is executed on a computer to provide an aid in design for changing design information representing a two-terminal circuit described in the item (2) that is in a state capable of transmitting a signal, so as to represent a two-terminal circuit described in the item (2) that is in a state incapable of transmitting a signal, the design information indicating whether each restricted part of each signal path included in the two-terminal circuit is to be formed in the connected state or in the disconnected state, the program making the computer execute the steps of: obtaining designation information that designates a target layer in which a change is to be made; changing the design information indicating that one signal path includes restricted parts in all the layers to be in the connected state, so as to indicate that the signal path includes the restricted part in the target layer to be in the disconnected state; and changing the design information indicating that one signal path includes a restricted part in the target layer and a restricted part in a first reference layer that is different from the target layer to be in the disconnected state and restricted parts in layers other than the target layer and the first reference layer to be in the connected state, so as to indicate that the signal path includes the restricted part in the target layer to be in the connected state; and changing the design information indicating that one signal path includes a restricted part in a second reference layer that is different from the target layer to be in the disconnected state and restricted parts in layers other than the second reference layer to be in the connected state, so as to indicate that the signal path includes the restricted part in the target layer to be in the disconnected state.

According to this construction, the program can provide an aid in design that has the same effect as described in the item (20).

(32) In the program described in the item (31), the design may be performed using a state expression showing a change record of the design information, and the program may further make the computer execute the steps of: updating the state expression by using a transformation rule in which a left part of an arrow matches the state expression, out of a transformation rule [i] "T1+(Ax−Bmx)→T1", a transformation rule [ii] "T2+(C−Am)→T2", and a transformation rule [iii] "T3+(C−Ay)→T3+(Am−Bmy)", where "m" is a layer number identifying the target layer, "x" and "y" each are a layer number that is different from "m", "T1+(Ax−Bmx)", "T2+(C−Am)", and "T3+(C−Ay)" each are the state expression, "T1", "T2", and "T3" each are a partial expression included in the state expression, and "Ax", "Am", "Ay", "Bmx", "Bmy", and "C" each are a constant term included in the state expression, in such a manner that the state expression is changed to be a right part of the arrow in the used transformation rule; and (a) executing the second preparing step by setting a layer identified by the layer number "x" as the second reference layer when the state expression is updated by using the transformation rule [i], (b) executing the disconnecting step when the state expression is updated by using the transformation rule [ii], and (c) executing the disconnecting step and the first preparing step by setting a layer identified by the layer number "y" as the first reference layer when the state expression is updated by using the transformation rule [iii].

According to this construction, the program can provide an aid in design that has the same effect as described in the item (21).

(33) A program of the present invention is a computer-executable program that is executed on a computer to provide an aid in design for selecting an initial construction of a two-terminal circuit described in the item (2), the initial construction enabling a two-terminal circuit whose circuit state is switched between a signal-transmittable state and a signal-untransmittable state to be constructed repeatedly at least a predetermined number of times by changing a state of one or more restricted parts in a target layer each time, the program making the computer execute the steps of: obtaining information that indicates the predetermined number of times "N"; calculating a number of signal paths "A" that constitute a first candidate circuit that is represented by first design information to which a change operation according to the design method described in the item (16) and a change operation according to the design method described in the item (17) can be alternately applied at least the number of times "N"; calculating a number of signal paths "B" that constitute a second candidate circuit that is represented by second design information to which a change operation according to the design method described in the item (18) and a change operation according to the design method described in the item (20) can be alternately applied an unlimited number of times; and (a) selecting, as the initial construction, a construction of the first candidate circuit in a case where the number of signal paths "A" is smaller than the number of signal paths "B", and (b) selecting, as the initial construction, a construction of the second candidate circuit in a case where the number of signal paths "A" is not smaller than the number of signal paths "B".

According to this construction, the program can provide an aid in design that has the same effect as described in the item (24).

(34) A program of the present invention is a computer-executable program that is executed on a computer to provide an aid in design for selecting, against a first standard cell including a two-terminal circuit described in the item (2) that is presently being selected, a second standard cell that differs from the first standard cell only in that a signal transmission state of a two-terminal circuit included therein is being switched, the design method using alternative information identifying an alternative standard cell that includes a two-terminal circuit whose signal transmission state differs from the signal transmission state of the two-terminal circuit included in the second standard cell by changing a state of restricted parts in a target layer of the two-terminal circuit, each of the plurality of layers being set as the target layer, the program making the computer execute the steps of: obtaining designation information that designates the target layer; and selecting, as the second standard cell, the alternative standard cell identified by the alternative information for the designated target layer.

According to this construction, the program can provide an aid in design that has the same effect as described in the item (25).

(35) A program recording medium of the present invention is a computer-readable recording medium on which a program described in one of the items (27) to (34) is recorded.

According to this construction, the program recording medium stores a program that has the same effect as described in one of the items (27) to (34).

BRIEF DESCRIPTION OF THE DRAWINGS

These and other objects, advantages and features of the invention will become apparent from the following description thereof taken in conjunction with the accompanying drawings that illustrate a specific embodiment of the invention.

In the drawings:

FIG. 1(A) is a top view showing a two-terminal circuit relating to a first embodiment of the present invention;

FIG. 1(B) is a sectional view of the two-terminal circuit taken along line X in FIG. 1(A);

FIG. 1(C) is a sectional view of the two-terminal circuit taken along line Y in FIG. 1(A);

FIG. 1(D) is a sectional view of the two-terminal circuit taken along line Z in FIG. 1(A);

FIG. 4 shows one example of design information representing the two-terminal circuit;

FIG. 7 is a top view showing the two-terminal circuit relating to a third embodiment of the present invention;

FIG. 10 shows one example of design information representing the two-terminal circuit;

FIG. 18 shows one example of an updated state expression and changed design information resulting from the above process;

FIG. 20 shows one example of restricted area information stored by the design aiding device;

FIG. 31 shows one example of design information stored by the design aiding device;

DESCRIPTION OF THE PREFERRED EMBODIMENTS

Figure 2A:
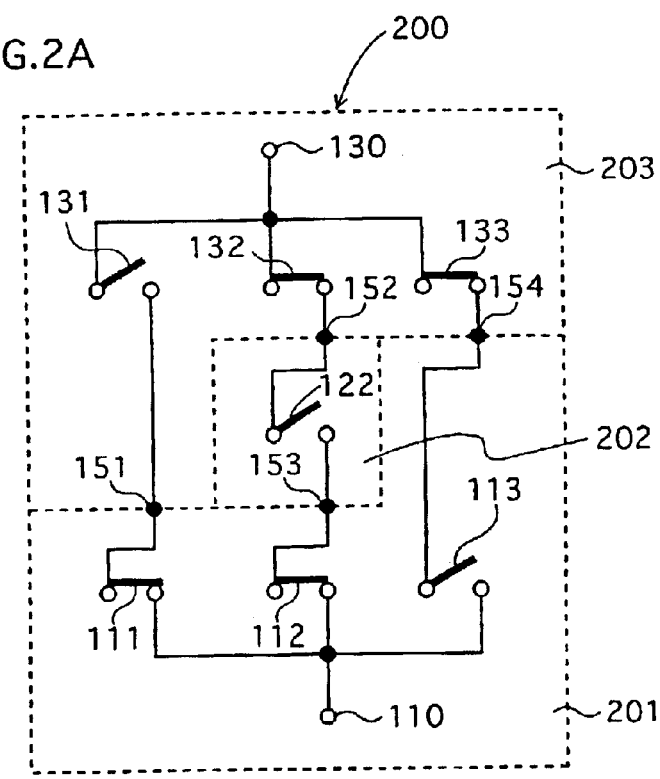
FIGS. 2(A) and 2(B) are equivalent circuit diagrams showing the two-terminal circuit.

The following describes preferred embodiments of the present invention, with reference to the drawings.

1. First Embodiment

A two-terminal circuit relating to a first embodiment of the present invention is incorporated in a semiconductor IC device with a multilayer structure. The two-terminal circuit is constructed by connecting a plurality of signal paths in parallel. Each signal path is laid at one or more of a plurality of layers to connect two terminals of the circuit, and includes a restricted area at each of the one or more layers. Each restricted part is formed either in (a) a connected state for permitting transmission of a signal at the restricted part of the signal path or in (b) a disconnected state for preventing transmission of a signal at the restricted part of the signal path. Here, each of the plurality of layers includes at least different one of the plurality of signal paths that is laid thereat. Each signal path is formed as being either in the state capable of transmitting a signal (signal-transmittable state) or in the state incapable of transmitting a signal (signal-untransmittable state), depending on the state of each restricted area included therein. As a result, the two-terminal circuit is formed as being either in the state capable of transmitting a signal between the two terminals (the connected state) or in the state incapable of transmitting a signal between the two terminals (the disconnected state).

1.1 Construction

FIG. 1(A) is a top view showing, as one example, a layout of elements of a two-terminal circuit 100 that is formed in a semiconductor IC device with a three-layer structure.

In the figure, a first signal path, a second signal path, and a third signal path are shown in the stated order from top to bottom. Parts illustrated with different patterns 110, 120, and 130 are conductors respectively formed in a first layer, a second layer, and a third layer of the semiconductor IC device. Reference numerals 111 to 113 denote restricted areas in the first layer. A reference numeral 122 denotes a restricted area in the second layer. Reference numerals 131 to 133 denote restricted areas in the third layer. Reference numerals 151 to 154 denote contacts.

Each restricted area with a pattern is in the electrically connected state capable of transmitting a signal (hereafter referred to as "in the ON-state"). Each restricted area without any pattern is in the electrically disconnected state incapable of transmitting a signal (hereafter referred to as "in the OFF-state").

The first signal path is roughly composed of the conductor 130 including the restricted area 131, the conductor 110 including the restricted area 111, and the contact 151 that connects the conductor 130 and the conductor 110. Here, the restricted area 131 is in the OFF-state. This means that the conductor 130 is divided by the restricted area in the OFF-state. Accordingly, the first signal path is in the signal-untransmittable state.

FIG. 1(B) is a sectional view showing the first signal path, and corresponds to an X-section of the top view. In the figure, elements that are the same as the elements shown in the top view are given the same reference numerals. A reference numeral 150 denotes a semiconductor substrate. Reference numerals 161 to 163 denote insulators respectively formed in the first layer, the second layer, and the third layer.

The second signal path is roughly composed of the conductor 130 including the restricted area 132, the conductor 120 including the restricted area 122, the conductor 110 including the restricted area 112, the contact 152 that connects the conductor 130 and the conductor 120, and the contact 153 that connects the conductor 120 and the conductor 110. Here, the restricted area 122 is in the OFF-state. This means that the conductor 120 is divided by the restricted area in the OFF-state. Accordingly, the second signal path is in the signal-untransmittable state.

FIG. 1(C) is a sectional view showing the second signal path, and corresponds to a Y-section of the top view. The same explanation as above regarding the reference numerals is applied to this figure.

The third signal path in the above two-terminal circuit is roughly composed of the conductor 130 including the restricted area 133, the conductor 110 including the restricted area 113, and the contact 154 that connects the conductor 130 and the conductor 110. Here, the restricted area 113 is in the OFF-state. This means that the conductor 110 is divided by the restricted area in the OFF-state. Accordingly, the third signal path is in the signal-untransmittable state.

FIG. 1(D) is a sectional view showing the third signal path, and corresponds to a Z-section of the top view. The same explanation as above regarding the reference numerals is applied to this figure.

1.2 Equivalent Circuit

FIG. 2(A) is a circuit diagram showing an equivalent circuit 200 of the two-terminal circuit 100.

In the figure, each restricted area is shown by a switch that indicates the ON or OFF state of the restricted area. Vertical positions of the switches in the figure correspond, from left to right, to the first signal path, the second signal path, and the third signal path. Horizontal positions of the switches in the figure correspond, from bottom to top, the first layer, the second layer, and the third layer. Here, a switch is not present on the first signal path and the third signal path corresponding to the second layer. This is because the first signal path and the third signal path both bypass the second layer.

In the figure, circuit elements corresponding to the elements in FIG. 1(A) are given the same reference numerals. Terminals 110 and 130, switches 111 to 133, and junction points 151 to 154 respectively correspond to the conductor 110 and 130, the restricted areas 111 to 133, and the contacts 151 to 154 in FIG. 1(A). Circuit elements shown within dotted frames 201, 202, and 203 are elements that are included in the first layer, the second layer, and the third layer, respectively.

Figure 2B:
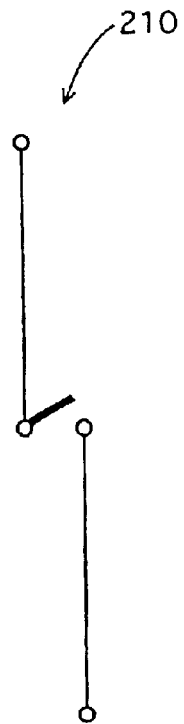

FIG. 2(B) is a circuit diagram showing another equivalent circuit 210 of the two-terminal circuit 100. This figure indicates that the two-terminal circuit 100 as a whole functions as one switch that realizes the disconnected state.

Hereafter, a two-terminal circuit of the above-described type is shown using such an equivalent circuit in FIG. 2(A) that shows the ON state or the OFF state of each restricted area, assuming that a layout of the elements including the restricted areas is separately determined.

1.3 Constructing New Two-Terminal Circuit with Switched Circuit State

Figure 3A:
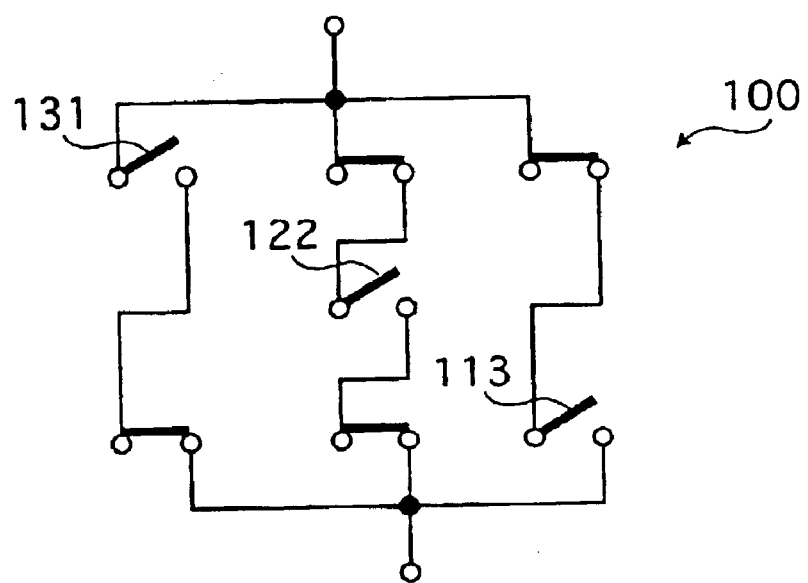
FIGS. 3(A) and 3(B) show one example of the two-terminal circuit whose circuit state is switched between the disconnected state and the connected state.

FIG. 3(A) is an equivalent circuit diagram of the two-terminal circuit 100 illustrated in the same manner as in FIG. 2(A).

In the two-terminal circuit 100, the state of the restricted areas on the signal paths is as follows. On each signal path, one restricted area included in one layer is in the OFF-state, and one or more restricted areas included in the other layers are in the ON-state. Here, the one restricted area being in the OFF-state on each signal path is included in a different layer. The two-terminal circuit 100 as a whole is in the disconnected state.

Based on this two-terminal circuit 100, a new two-terminal circuit that differs from the two-terminal circuit 100 in the state of restricted areas included in one freely-chosen layer and in the circuit state having been switched between the disconnected state and the connected state can be constructed. The new two-terminal circuit as a whole is in the connected state.

To be more specific, assuming that the third layer, the second layer, or the first layer is chosen as a layer in which the state of restricted areas is to be changed (hereafter referred to as a "target layer"), the constructed new two-terminal circuit differs from the two-terminal circuit 100 in that the state of the restricted area 131 on the first signal path in the third layer, the state of the restricted area 122 on the second signal path in the second layer, or the state of the restricted area 113 on the third signal path in the first layer, has been switched to the ON-state.

This means that a set of masks necessary for manufacturing the new two-terminal circuit can be obtained by preparing a new mask corresponding to one freely-chosen layer and using the masks corresponding to the other layers that have been used to manufacture the two-terminal circuit 100.

Figure 3B:
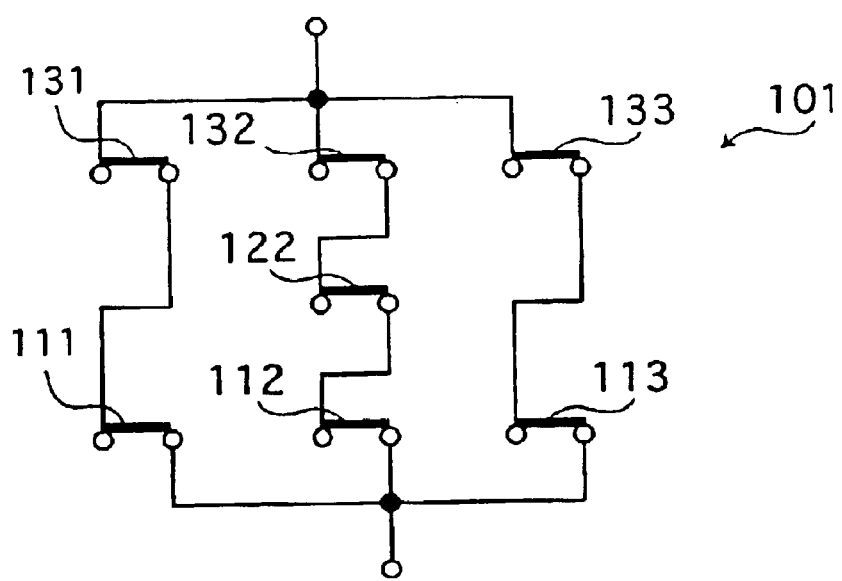

FIG. 3(B) is an equivalent circuit diagram showing a two-terminal circuit 101 that includes restricted areas that are all in the ON-state and that are in the same layout as in the two-terminal circuit 100. The two-terminal circuit 101 as a whole is in the connected state.

Based on the two-terminal circuit 101, a new two-terminal circuit that differs from the two-terminal circuit 101 in the state of restricted areas included in one freely-chosen layer and in the circuit state having been switched between the disconnected state and the connected state can be constructed. The new two-terminal circuit as a whole is in the disconnected-state.

To be more specific, assuming that the third layer, the second layer, or the first layer is chosen as a target layer, the constructed new two-terminal circuit differs from the two-terminal circuit 101 in that the state of the restricted areas 131, 132, and 133 (the third layer), the state of the restricted area 122 (the second layer), or the state of the restricted areas 111, 112, and 113 (the first layer) has been switched to the OFF-state.

1.4 Conclusions

According to the construction described above, based on (1) a two-terminal circuit that is as a whole in the disconnected state, and in which on each signal path, one restricted area included in one layer is in the OFF-state and one or more restricted areas included in the other layers are in the ON-state, with the one restricted area in the OFF-state on each signal path being included in a different layer, a new two-terminal circuit that differs in the state of restricted areas included in one freely-chosen layer and in the circuit state having been switched between the disconnected state and the connected state can be constructed. Also, based on (2) a two-terminal circuit that is as a whole in the connected state, and in which all the restricted areas are in the ON-state, a new two-terminal circuit that differs in the state of restricted areas included in one freely-chosen layer and in the circuit state having been switched between the disconnected state and the connected state can be constructed.

This means the following. When any one layer of a two-terminal circuit on which a new two-terminal circuit is based is set as a target layer, at least one set of masks necessary for manufacturing the new two-terminal circuit whose circuit state has been switched between the disconnected state and the connected state can be obtained, simply by preparing one new mask corresponding to the target layer.

The following is a case where it becomes necessary to manufacture a semiconductor IC device including such a new two-terminal circuit whose circuit state differs from that of the above two-terminal circuit. Here, suppose that a defective is found in a specific layer of the above two-terminal circuit and a new mask for this layer also needs to be prepared for the purpose of correcting the defective. In such a case, this defective layer can also serve as the above target layer. By choosing the defective layer as the target layer, therefore, only one new mask needs to be prepared for manufacturing the semiconductor IC device including the new two-terminal circuit. In this way, the present embodiment can reduce the number of new masks to be prepared, thereby reducing the time and cost required for such remake of semiconductor IC devices.

2. Second Embodiment

A design method relating to a second embodiment of the present invention is for changing design information representing the two-terminal circuit described in the first embodiment, so as to represent a two-terminal circuit that differs from the two-terminal circuit described in the first embodiment in the state of restricted areas in one designated layer and in the circuit state having been switched between the disconnected state and the connected state.

2.1 Design Information

FIG. 4 shows one example of design information representing a two-terminal circuit that is composed of three signal paths formed in a semiconductor IC device with a three-layer structure.

The design information is stored, for example, in a design information table 250. In the design information table 250, columns correspond to signal paths, and rows correspond to layers. A "layer number" field 251 shows a layer number for identifying a layer corresponding to each row. A "signal path identification name" field 252 shows a signal path identification name for identifying a signal path corresponding to each column. A "restricted area state" field 253, where a row and a column intersect with each other, shows one of symbols "OFF", "ON", and "–" for a restricted area included in a layer identified by the corresponding layer number on a signal path identified by the corresponding signal path identification name. The symbol "OFF" indicates that the restricted area is to be in the OFF-state, the symbol "ON" indicates that the restricted area is to be in the ON-state, and the symbol "–" indicates that such a restricted area is not present.

2.2 Change-to-Connection Process

Figure 5:
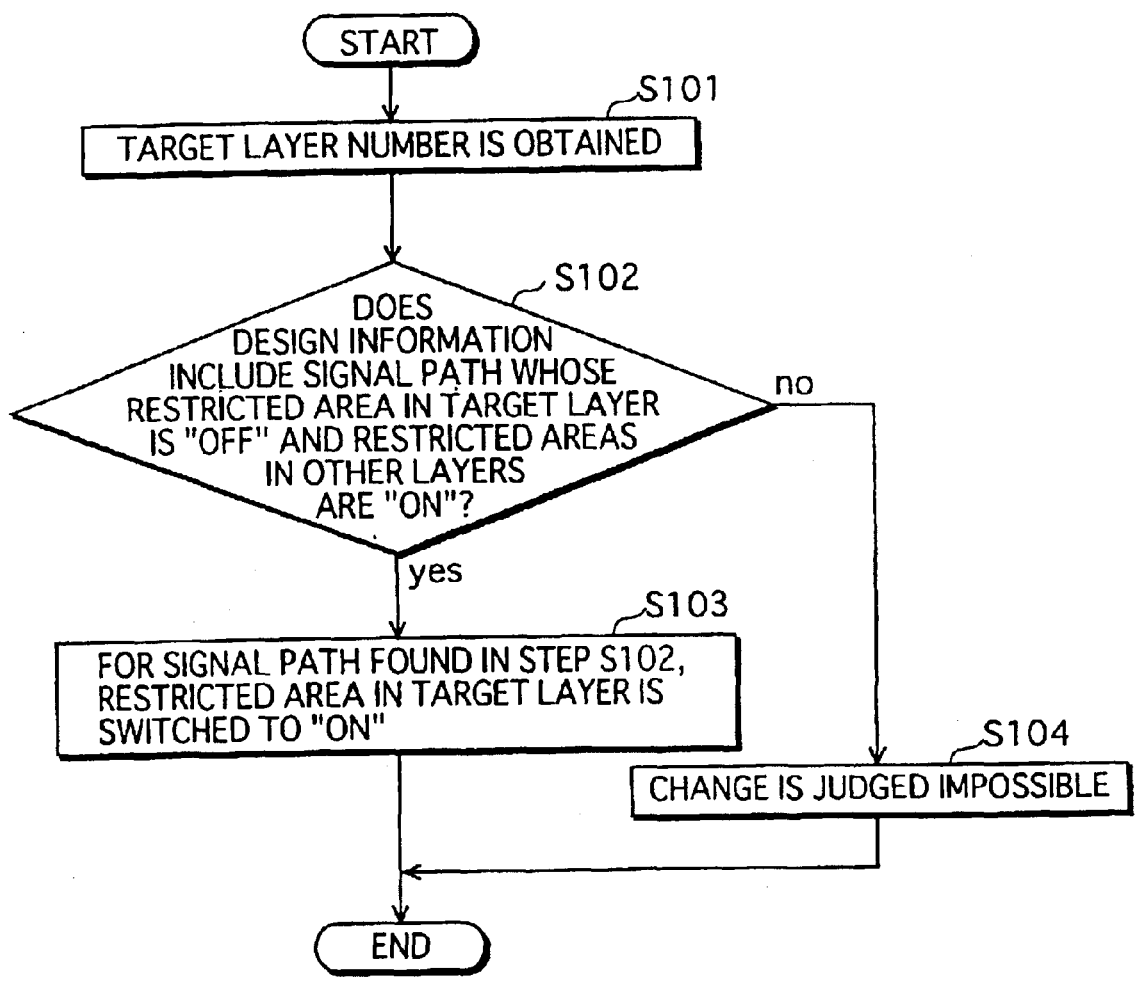
FIG. 5 is a flowchart showing a change-to-connection process of the design information.

FIG. 5 is a flowchart showing a change-to-connection process of the design information. With the change-to-connection process, the design information is changed to represent a two-terminal circuit that is in the connected state by the following procedures, when the design information represents a two-terminal circuit that is in the disconnected state, i.e., when the design information includes no signal path whose restricted areas all show "ON" or "–".

(Step S101) A target layer number is obtained.

(Step S102) A judgment is performed as to whether a signal path on which a restricted area included in the target layer shows "OFF" and restricted areas included in the other layers show "ON" or "–" is present or not, by referring to the design information. When one or more such signal paths are found, the processing advances to step S103. When no such signal path is found, the processing advances to step S104.

(Step S103) For one of the signal paths found in step S102, the "restricted area state" field corresponding to the target layer is updated to "ON".

(Step S104) It is judged that the design information cannot be changed to represent a two-terminal circuit that is in the connected state.

2.3 Change-to-Disconnection Process

Figure 6:
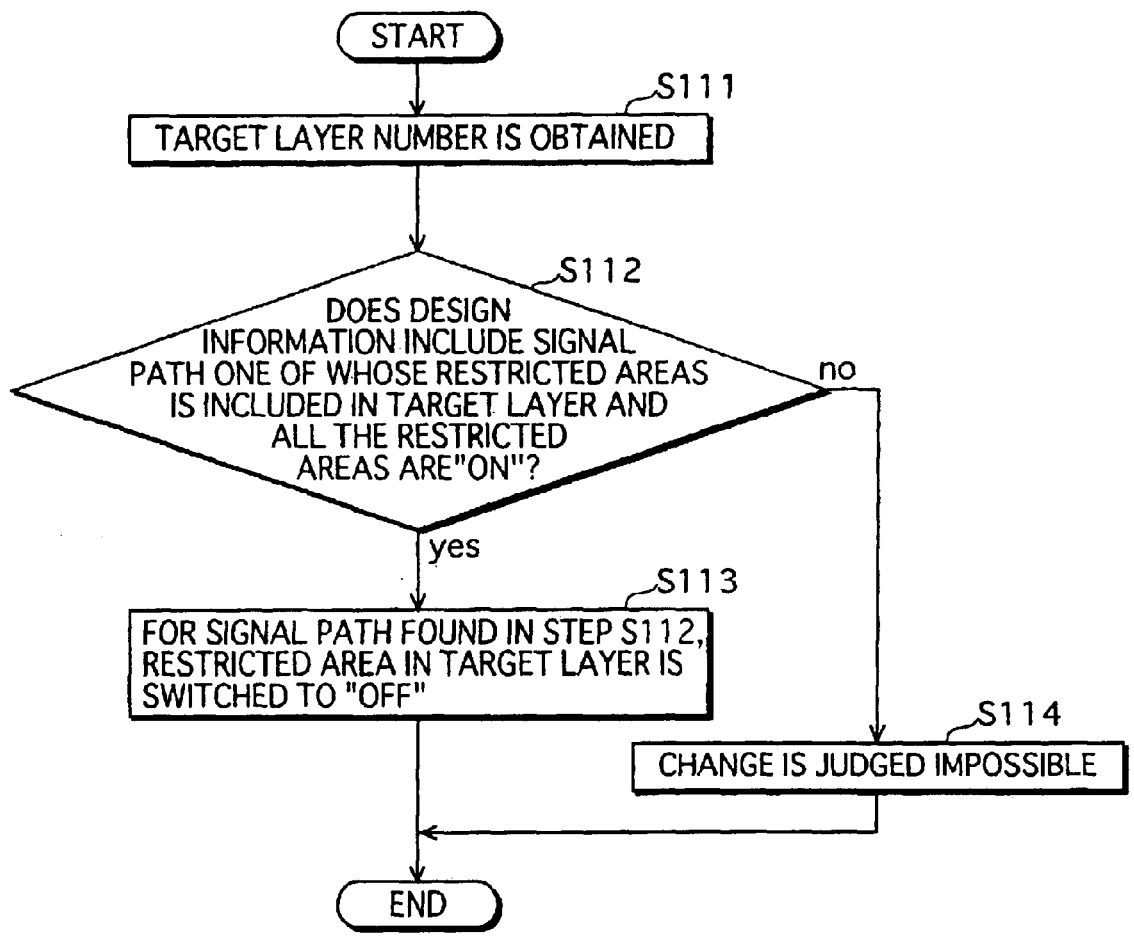
FIG. 6 is a flowchart showing a change-to-disconnection process of the design information.

FIG. 6 is a flowchart showing a change-to-disconnection process of the design information. With the change-to-disconnection process, the design information is changed to represent a two-terminal circuit that is in the disconnected state by the following procedures, when the design information represents a two-terminal circuit that is in the connected state, i.e., when the design information includes a signal path whose restricted areas all show "ON" or "–".

(Step S111) A target layer number is obtained.

(Step S112) A judgment is performed as to whether a signal path on which one of its restricted areas is included in the target layer and the restricted area included in the target layer shows "ON" and the restricted areas included in the other layers show "ON" or "–" is present or not, by referring to the design information. When one or more such signal paths are found, the processing advances to step S113. When no such signal path is found, the processing advances to step S114.

(Step S113) For all the signal paths found in step S112, the "restricted area state" field corresponding to the target layer is updated to "OFF".

(Step S114) It is judged that the design information cannot be changed to represent a two-terminal circuit that is in the disconnected state.

2.4 Conclusions

According to this design method, the judgment can be performed as to whether (i) the design information representing the two-terminal circuit described in the first embodiment can be changed so as to represent a two-terminal circuit that differs from the two-terminal circuit described in the first embodiment in the circuit state having been switched between the disconnected state and the connected state by changing the state of restricted areas in one designated layer, or (ii) such a change in the design information is impossible.

3. Third Embodiment

A two-terminal circuit relating to a third embodiment of the present invention is formed in a semiconductor IC device with a multilayer structure. The two-terminal circuit in the present embodiment has the same structure as the two-terminal circuit described in the first embodiment, except that each of the signal paths constituting the two-terminal circuit in the present embodiment is formed via every layer, i.e., each signal path includes a restricted area in every layer.

3.1 Construction

FIG. 7 is a top view showing, as one example, a layout of elements of a two-terminal circuit 300 that is formed in a semiconductor IC device with a three-layer structure. The two-terminal circuit 300 is constructed by connecting in parallel six signal paths, each of which includes one restricted area in every layer.

In the figure, a first signal path, a second signal path, . . . . a sixth signal path are shown from top to bottom in the stated order. The same explanation regarding the illustration method and reference numerals as given for FIG. 1(A) is applied to the figure. Reference numerals 330 and 310 denote conductors respectively formed in the first layer and the third layer. Reference numerals 311 to 316, 321 to 326, and 331 to 336 denote restricted areas respectively provided in the first layer, the second layer, and the third layer.

The first signal path is roughly composed of the conductor 330 including the restricted area 331, the conductor 320 including the restricted area 321, the conductor 310 including the restricted area 311, a contact that connects the conductor 330 and the conductor 320, and a contact that connects the conductor 320 and the conductor 310. Here, the restricted area 331 is in the OFF-state. This means that the conductor 330 is divided by the restricted area in the OFF state. Accordingly, the first signal path is out of conduction.

The second to sixth signal paths each have conductors, restricted areas, and contacts that have the same positional relations with the corresponding elements of the first signal path. The only difference between the second to sixth signal paths and the first signal path lies in the state of each restricted area included therein. The constructions of the second to sixth signal paths are not described in detail here.

3.2 Equivalent Circuit

Figure 8:
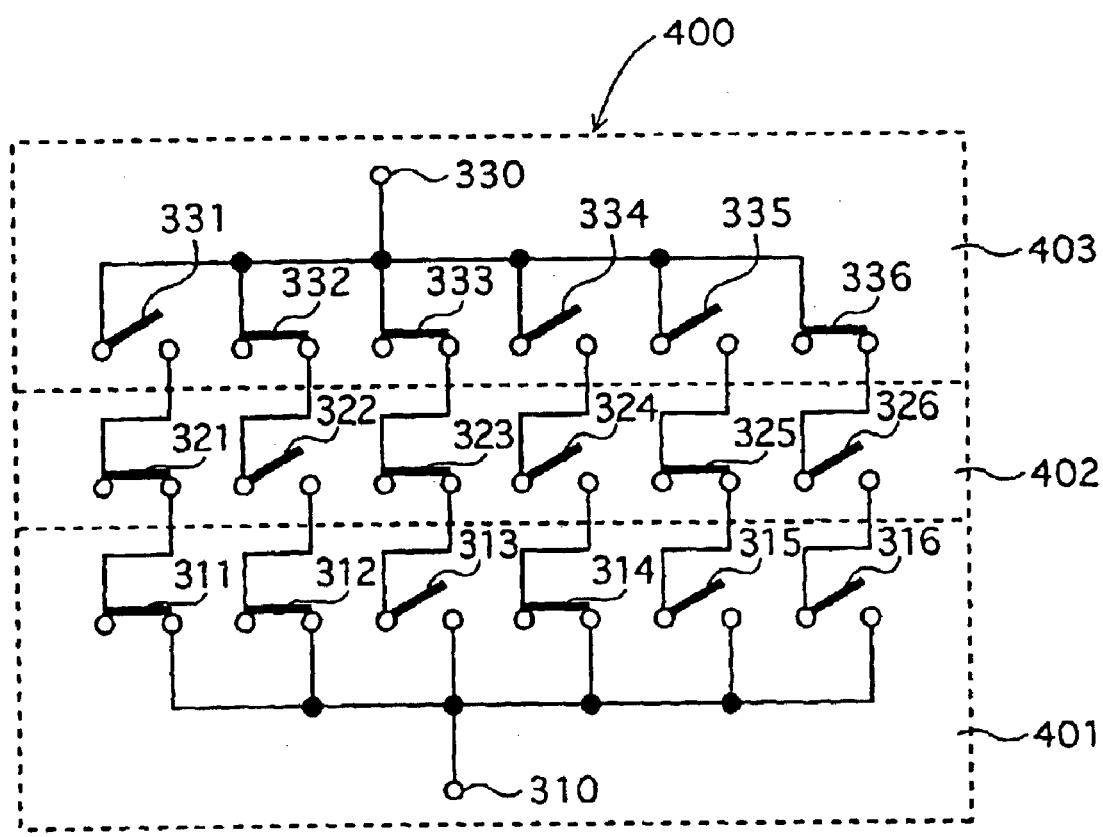
FIG. 8 is an equivalent circuit diagram showing the two-terminal circuit.

FIG. 8 is a circuit diagram showing an equivalent circuit 400 of the two-terminal circuit 300. In the figure, each restricted area is shown by a switch that indicates the ON or OFF state of the restricted area. Vertical positions of the switches in the figure correspond, from left to right, to the first signal path, the second signal path, the third signal path, the fourth signal path, the fifth signal path, and the sixth signal path. Horizontal positions of the switches in the figure correspond, from bottom to top, the first layer, the second layer, and the third layer.

In the figure, circuit elements corresponding to the elements in FIG. 7 are given the same reference numerals. Terminals 310 and 330, and switches 311 to 336 respectively correspond to the conductor 310 and 330, and the restricted areas 311 to 336 in FIG. 7. Circuit elements shown within dotted frames 401, 402, and 403 are elements that are included in the first layer, the second layer, and the third layer, respectively. It should be noted here that the figure does not show junction points corresponding to the contacts in FIG. 7.

Hereafter, a two-terminal circuit of the above-described type is shown using such an equivalent circuit in FIG. 8 that shows the ON state or the OFF state of each restricted area, assuming that a layout of the elements including the restricted areas is separately determined.

3.3 Constructing New Two-Terminal Circuit with Switched Circuit State

Figure 9A:
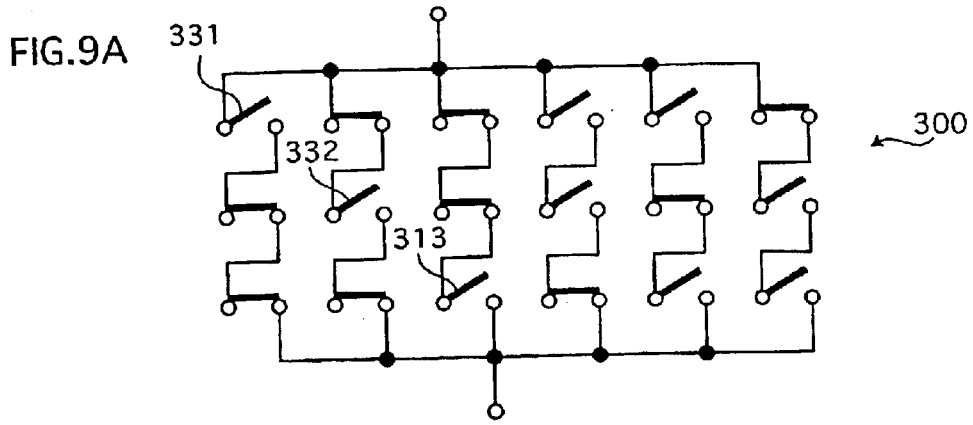
FIGS. 9(A) to 9(D) show one example of the two-terminal circuit whose circuit state is switched between the disconnected state and the connected state.

FIG. 9(A) is an equivalent circuit diagram of the two-terminal circuit 300 illustrated in the same manner as in FIG. 8. In the figure, each of the first signal path, the second signal path, and the third signal path is disconnected in one of the layers. To be specific, the first signal path, the second signal path, and the third signal path are respectively disconnected in the third layer, the second layer, and the first layer. Each of the fourth signal path, the fifth signal path, and the sixth signal path are respectively disconnected in two of the layers. To be specific, the fourth signal path, the fifth signal path, and the sixth signal path are respectively disconnected in the third and second layers, the third and first layers, and the second and first layers. The two-terminal circuit 300 as a whole is in the disconnected state.

Hereafter, a two-terminal circuit that is like the two-terminal circuit 300 is referred to as a "standard two-terminal circuit". To be more specific, a standard two-terminal circuit is composed of (1) signal paths, each of which is provided in correspondence with one layer and is disconnected in the corresponding layer and (2) signal paths, each of which is provided in correspondence with a combination of selected two layers and is disconnected in the corresponding selected two layers. The two-terminal circuit 300 is a standard two-terminal circuit formed in a semiconductor IC device with a three-layer structure.

Setting such a standard two-terminal circuit as an initial state, a new two-terminal circuit that differs from the standard two-terminal circuit (or the resulting two-terminal circuit) in the state of restricted areas included in one freely-chosen layer and in the circuit state having been switched between the disconnected state and the connected state can be constructed repeatedly, based on the standard two-terminal circuit (or the resulting two-terminal circuit thereafter). The following describes this repeated construction of a new two-terminal circuit, taking the case where the two-terminal circuit 300 is the standard two-terminal circuit as example.

First, based on the two-terminal circuit 300, a first new two-terminal circuit that differs from the two-terminal circuit 300 in the state of restricted areas included in one freely-chosen layer and in the circuit state having been switched between the disconnected state and the connected state can be constructed. The first new two-terminal circuit as a whole is in the connected state.

To be more specific, assuming that the third layer, the second layer, or the first layer is chosen as a target layer, the constructed first new two-terminal circuit differs from the two-terminal circuit 300 in that the state of the restricted area 331 (the third layer), the state of the restricted area 322 (the second layer), or the restricted area 313 (the first layer) has been switched to the ON-state.

Figure 9B:
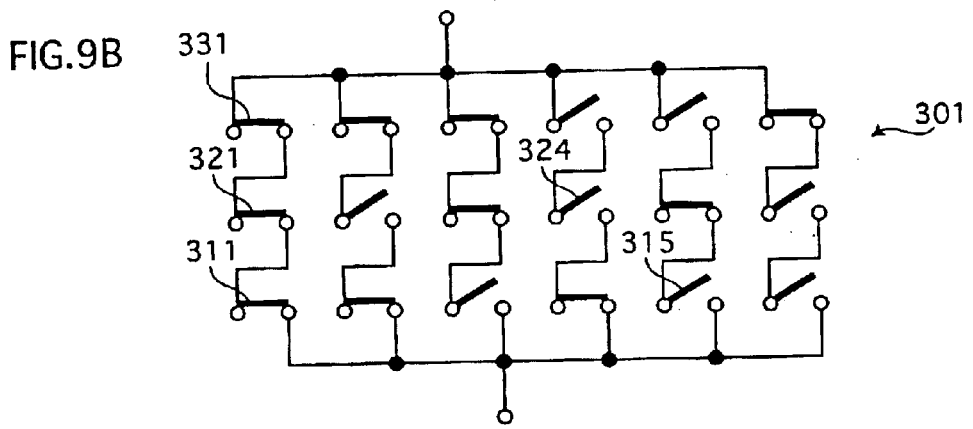

FIG. 9(B) is an equivalent circuit diagram showing the two-terminal circuit 301 that differs from the two-terminal circuit 300 in that the state of the restricted area 331 has been switched to the ON-state. The two-terminal circuit 301 as a whole is in the connected state.

Further, based on the two-terminal circuit 301, a new two-terminal circuit that differs from the two-terminal circuit 301 in the state of restricted areas in one freely-chosen layer and in the circuit state having been switched between the disconnected state and the connected state can be constructed. The constructed new two-terminal circuit as a whole is in the disconnected state.

To be more specific, assuming that the third layer, the second layer, or the first layer is chosen as a target layer, the constructed new two-terminal circuit differs from the two-terminal circuit 301 in that the state of the restricted area 331 has been switched to the OFF-state (the third layer), the state of the restricted area 321 has been switched to the OFF-state and the state of the restricted area 324 has been switched to the ON-state (the second layer), or the restricted area 311 has been switched to the OFF-state and the state of the restricted area 315 has been switched to the ON-state (the first layer).

Figure 9C:
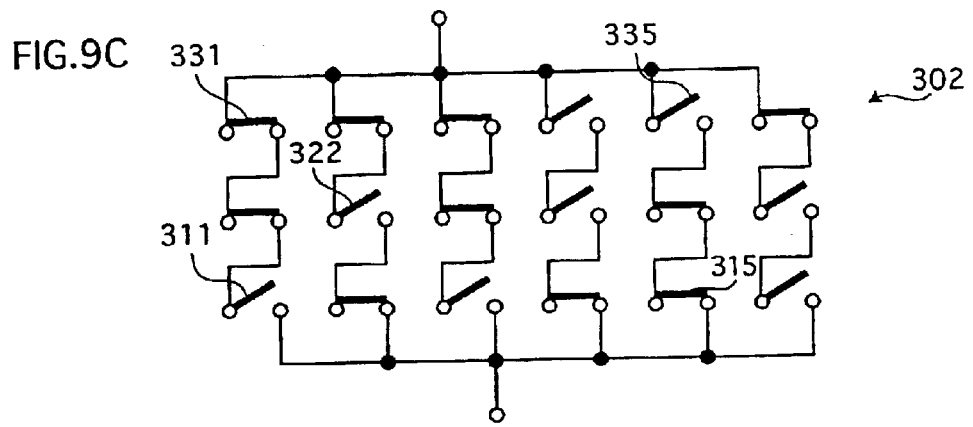

FIG. 9(C) is an equivalent circuit diagram showing the two-terminal circuit 302 that differs from the two-terminal circuit 301 in that the state of the restricted area 311 has been switched to the OFF-state, and the state of the restricted area 315 has been switched to the ON-state. The two-terminal circuit 302 as a whole is in the disconnected state.

In the two-terminal circuit 302, the first signal path has not been restored to the state where it used to be in the standard two-terminal circuit, i.e., the state where the first signal path is disconnected only in the third layer. Such a signal path that is disconnected only in the third layer will be necessary when a new two-terminal circuit that is in the connected state is to be constructed by choosing the third layer as a target layer. To prepare such a signal path, the state of the restricted area 315 on the fifth signal path is switched to the ON-state.

Further, based on the two-terminal circuit 302, a third new two-terminal circuit that differs from the two-terminal circuit 302 in the state of restricted areas in one freely-chosen layer and in the circuit state having been switched between the disconnected state and the connected state can be constructed. The third new two-terminal circuit as a whole is in the connected state.

To be more specific, assuming that the third layer, the second layer, or the first layer is chosen as a target layer, the constructed third new two-terminal circuit differs from the two-terminal circuit 302 in that the state of the restricted area 331 has been switched to the OFF-state and the state of the restricted area 335 has been switched to the ON-state (the third layer), the state of the restricted area 322 has been switched to the ON-state (the second layer), and the state of the restricted area 311 has been switched to the ON-state and the state of the restricted area 315 has been switched to the OFF-state (the first layer).

Figure 9D:
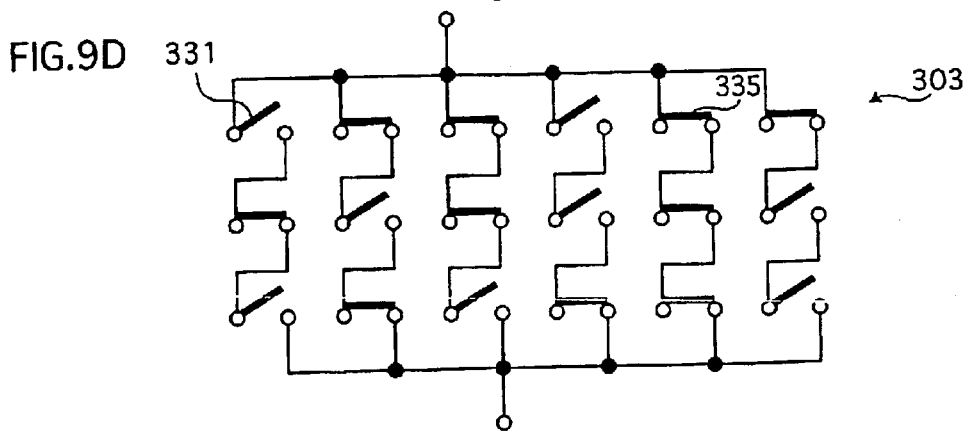

FIG. 9(D) is an equivalent circuit diagram showing the two-terminal circuit 303 that differs from the two-terminal circuit 302 in that the state of the restricted area 331 has been switched to the OFF-state, and the state of the restricted area 335 has been switched to the ON-state. The two-terminal circuit 303 as a whole is in the connected state.

In the two-terminal circuit 303, the fifth signal path has not been restored to the state where it used to be in the standard two-terminal circuit, i.e., the state where the fifth signal path is disconnected in the first layer and the third layer. Such a signal path that is disconnected in the first layer and the third layer will be necessary when a signal path that is disconnected in either one of the first layer and the third layer needs to be prepared. Therefore, to prepare such a signal path that is disconnected in the first layer and the third layer, the state of the restricted area 331 on the first signal path is switched to the OFF-state.

3.4 Conclusions

Each signal path in the two-terminal circuit relating to the third embodiment includes a restricted area in every layer. According to this construction, when a new two-terminal circuit that differs from the two-terminal circuit on which the new-terminal circuit is based, in the state of restricted areas in one freely-chosen layer and in the circuit state having been switched between the disconnected state and the connected state is to be constructed, a signal path that is disconnected in one layer or a signal path that is disconnected in two layers is purposely prepared using a suitable signal path. A signal path that is disconnected in one layer and a signal path that is disconnected in two layers are to be prepared alternately one at every time when such a new-terminal circuit is to be constructed. By doing so, such a new two-terminal circuit can be constructed repeatedly.

4. Fourth Embodiment

A design method relating to a fourth embodiment of the present invention is for changing design information representing the two-terminal circuit described in the third embodiment so as to represent a two-terminal circuit that differs from the two-terminal circuit described in the third embodiment in the state of restricted areas in one designated layer and in the circuit state having been switched between the disconnected state and the connected state.

4.1 Design Information

FIG. 10 shows one example of design information representing a two-terminal circuit that is composed of six signal paths and that is formed in a semiconductor IC device with a three-layer structure.

The design information is stored, for example, in a design information table 450. In the design information table 450, columns correspond to signal paths, and rows correspond to layers. A "layer number" field 451 shows a layer number for identifying a layer corresponding to each row. A "signal path identification name" field 452 shows a signal path identification name for identifying a signal path corresponding to each column. A "restricted area state" field 453, where a row and a column intersect with each other, shows one of symbols "OFF" and "ON" for a restricted area included in a layer identified by the corresponding layer number on a signal path identified by the corresponding signal path identification name. The symbol "OFF" indicates that the restricted area is to be in the OFF-state, and the symbol "ON" indicates that the restricted area is to be in the ON-state.

4.2 Change-to-Connection Process

Figure 11:
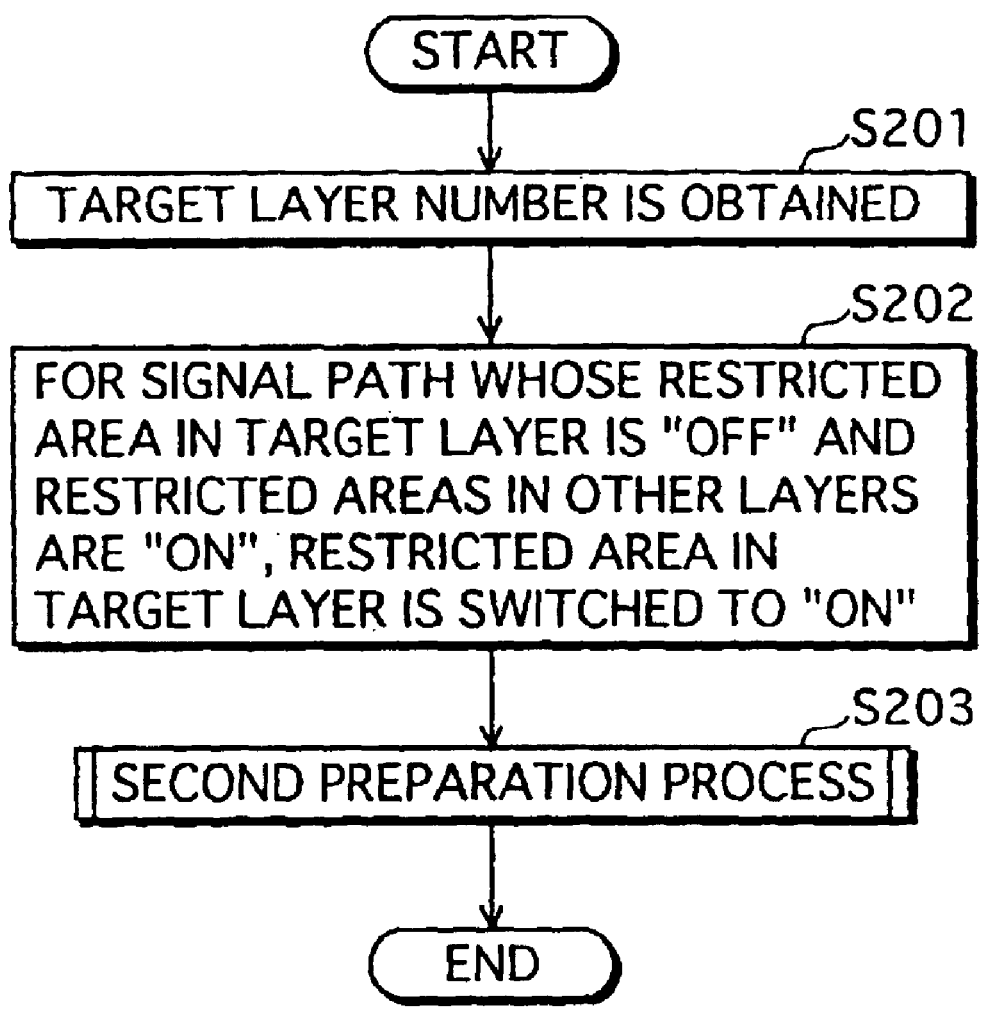
FIG. 11 is a flowchart showing a change-to-connection process of the design information.

FIG. 11 is a flowchart showing a change-to-connection process of the design information. With the change-to-connection process, the design information is changed to represent a two-terminal circuit that is in the connected state by the following procedures, when the design information represents a two-terminal circuit that is in the disconnected state, i.e., when the design information includes no signal path whose restricted areas all show "ON".

(Step S201) A target layer number is obtained.

(Step S202) For one of signal paths on which a restricted area included in the target layer shows "OFF" and restricted areas in the other layers show "ON", the "restricted area state" field corresponding to the target layer is updated to "ON".

(Step S203) A second preparation process is executed.

4.3 Second Preparation Process

Figure 12:
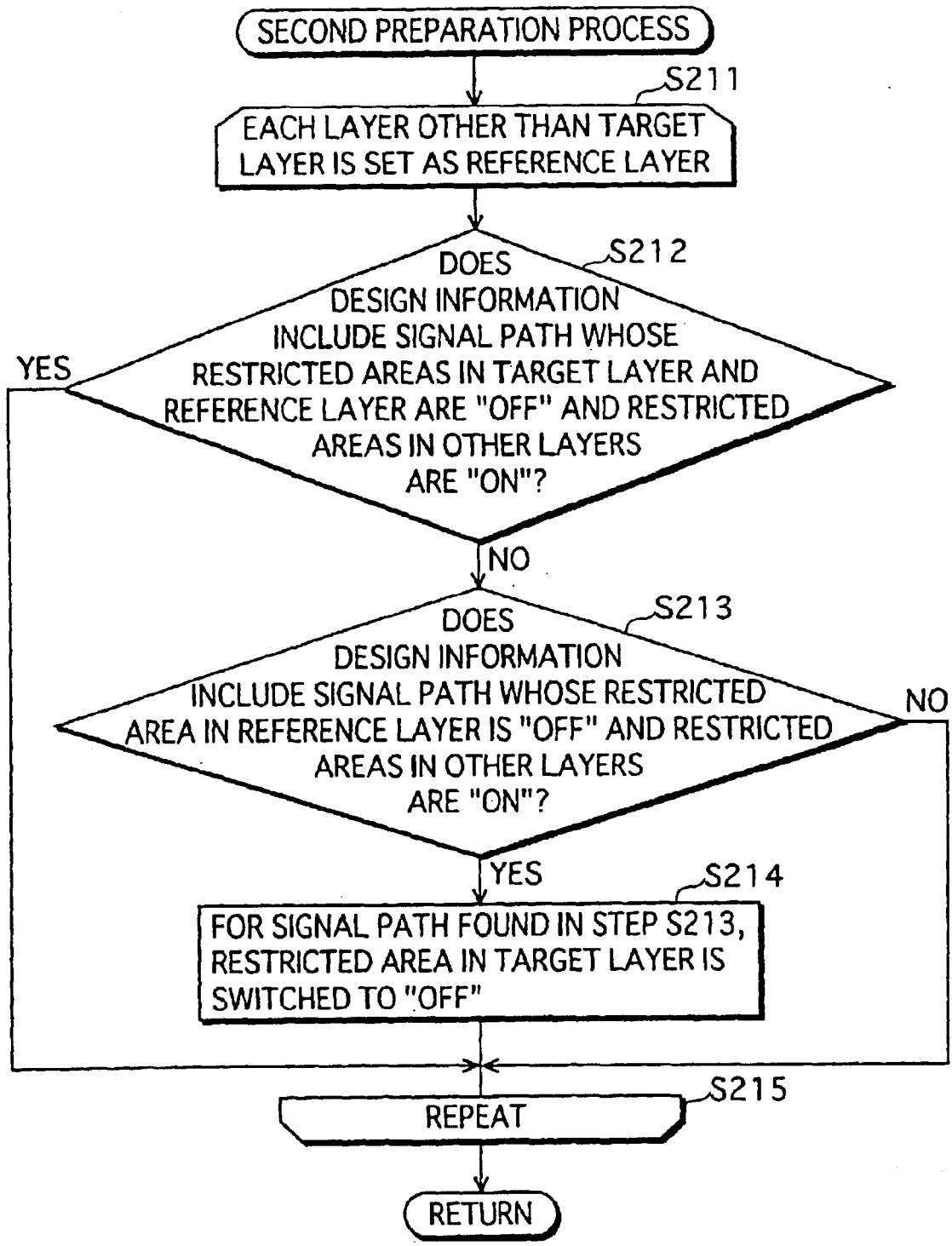
FIG. 12 is a flowchart showing in detail a second preparation process included in the change-to-connection process.

FIG. 12 is a flowchart showing the second preparation process of the design information.

The second preparation process is invoked by the change-to-connection process, or by a change-to-disconnection process that is described later. With the second preparation process, the design information is changed by the following procedures, so that a signal path that is disconnected in two layers can be prepared.

(Step S211) One of layers other than the target layer is set as a reference layer, and the processing advances to step S212.

(Step S212) A judgment is performed as to whether a signal path on which restricted areas included in the target layer and the reference layer show "OFF" and restricted areas included in the other layers show "ON" is present or not, by referring to the design information. When no such signal path is found, the processing advances to step S213.

(Step S213) A judgment is performed as to whether a signal path on which a restricted area included in the reference layer shows "OFF" and restricted areas included in the other layers show "ON" is present or not, by referring to the design information. When one or more such signal paths are found, the processing advances to step S214.

(Step S214) For one of the signal paths found in step S213, the "restricted area state" field corresponding to the target layer is updated to "OFF".

(Step S215) Each of the other layers is set as a reference layer and the processing from step S211 is repeated.

4.4 Change-to-Disconnection Process

Figure 13:
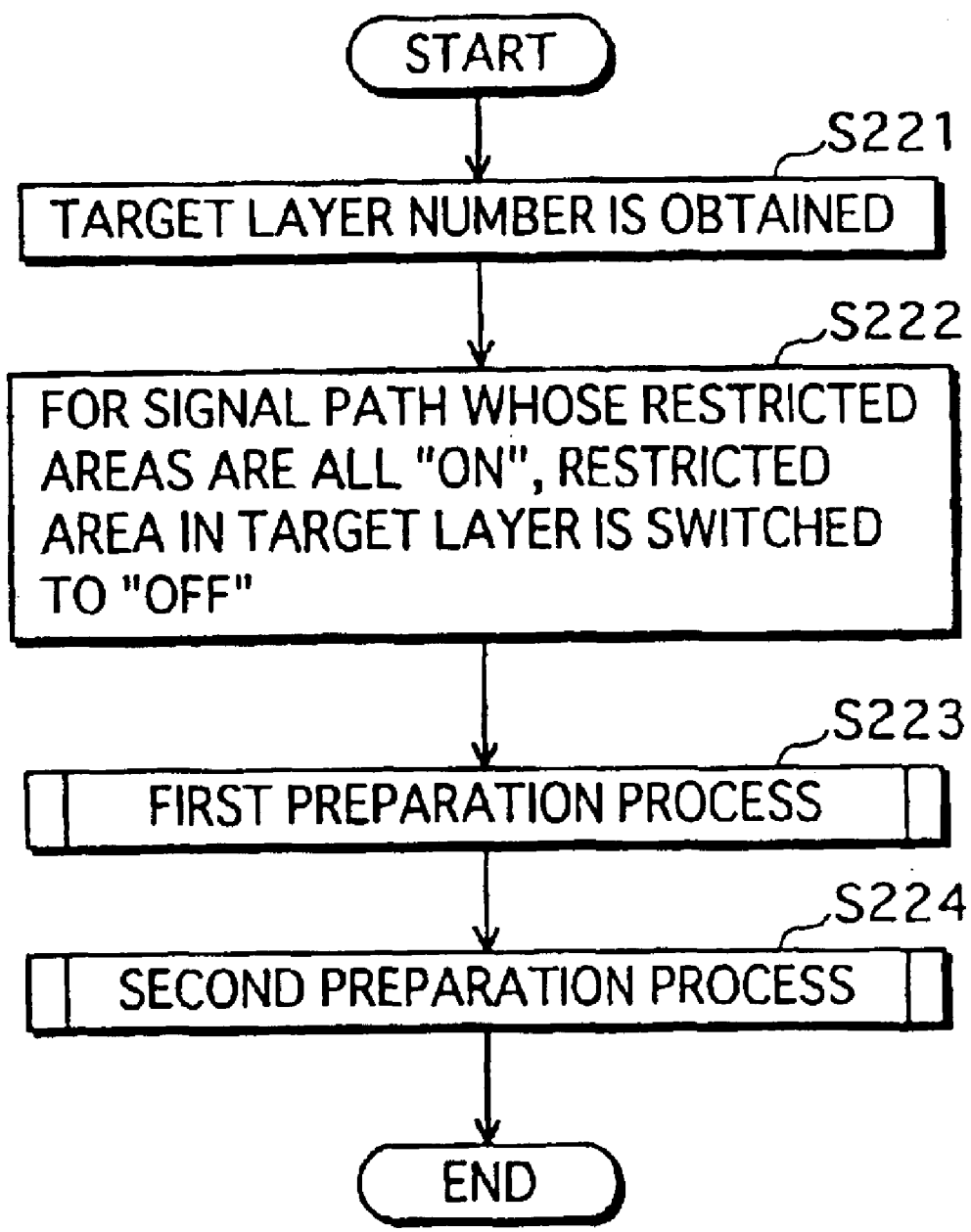
FIG. 13 is a flowchart showing a change-to-disconnection process of the design information.

FIG. 13 is a flowchart showing a change-to-disconnection process of the design information. With the change-to-disconnection process, the design information is changed to represent a two-terminal circuit that is in the disconnected state by the following procedures, when the design information represents a two-terminal circuit that is in the connected state, i.e., when the design information includes a signal path whose restricted areas all show "ON".

(Step S221) A target layer number is obtained.

(Step S222) For all signal paths on which a restricted area included in the target layer shows "ON" and restricted areas included in the other layers show "ON", the "restricted area state" field corresponding to the target layer is updated to "OFF".

(Step S223) A first preparation process is executed.

(Step S224) The second preparation process is executed.

4.5 First Preparation Process

Figure 14:
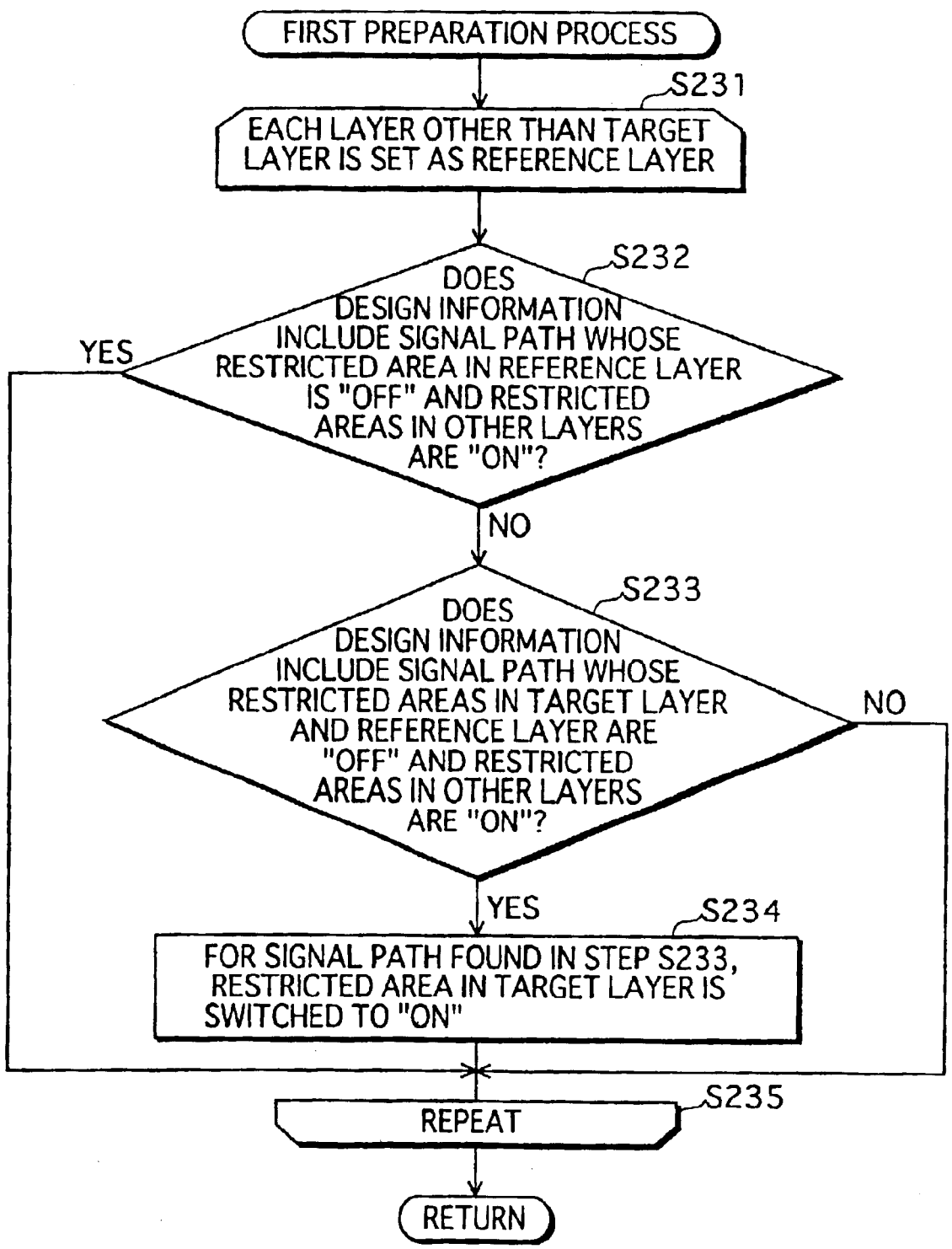
FIG. 14 is a flowchart showing in detail a first preparation process included in the change-to-disconnection process.

FIG. 14 is a flowchart showing the first preparation process of the design information.

The first preparation process is invoked by the change-to-disconnection process. With the first preparation process, the design information is changed by the following procedures, so that a signal path that is disconnected in one layer can be prepared.

(Step S231) One of layers other than the target layer is set as a reference layer, and the processing advances to step S232.

(Step S232) A judgment is performed as to whether a signal path on which a restricted area included in the reference layer shows "OFF" and restricted areas included in the other layers show "ON" is present or not, by referring to the design information. When no such signal path is found, the processing advances to step S233.

(Step S233) A judgment is performed as to whether a signal path on which restricted areas included in the target layer and the reference layer show "OFF" and restricted areas included in the other layers show "ON" is present or not, by referring to the design information. When one or more such signal paths are found, the processing advances to step S234.

(Step S234) For all the signal paths found in step S233, the "restricted area state" field corresponding to the target layer is updated to "ON".

(Step S235) Each of the other layers is set as a reference layer and the processing from step S231 is repeated.

4.6 Conclusions

According to this design method, the design information representing the two-terminal circuit described in the third embodiment can be changed so as to represent a two-terminal circuit that differs from the two-terminal circuit described in the third embodiment in the state of restricted areas in one designated layer and in the circuit state having been switched between the disconnected state and the connected state.

The above design method includes the first preparation process for preparing a signal path that is disconnected in one layer using a signal path that is disconnected in two layers, and the second preparation process for preparing a signal path that is connected in two layers using a signal path that is disconnected in one layer. Therefore, the design information can be changed repeatedly so as to represent a new two-terminal circuit that differs in the state of restricted areas in one layer and in the circuit state having been switched between the disconnected state and the connected state.

5. Fifth Embodiment

A design method relating to a fifth embodiment of the present invention is for suitably executing one or both of the first preparation process and the second preparation process described in the fourth embodiment, when the design information representing a standard two-terminal circuit is repeatedly changed so as to represent a new two-terminal circuit that differs in the state of restricted areas in one freely-chosen layer and in the circuit state having been switched between the disconnected state and the connected state. By doing so, such a change in the design information can be executed repeatedly an unlimited number of times.

The design method in the present embodiment uses a state expression showing the change record of the design information. According to this design method, the design information is subject to one or both of the first preparation process and the second preparation process that are judged as suitable in accordance with a designated target layer and the state expression, and at the same time, the state expression is updated.

5.1 Design Information

Figure 15:
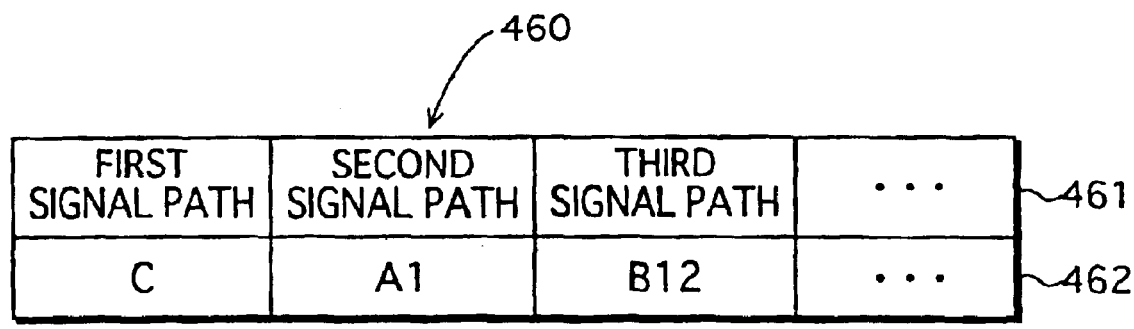
FIG. 15 shows one example of different design information representing the two-terminal circuit.

FIG. 15 shows design information representing a typical two-terminal circuit that is composed of a plurality of signal paths and that is formed in a semiconductor IC device with a multilayer structure.

The design information is stored, for example, in a design information table 460. In the design information table 460, columns correspond to signal paths. A "signal path identification name" field 461 shows a signal path identification name for identifying a signal path corresponding to each column. A "signal path state" field 462 shows one of symbols "C", "Ai", and "Bij" showing a signal path state of a signal path identified by the corresponding signal path identification name. The "signal path state" field 462 indicates the state in which each restricted area on the signal path is to be formed. To be more specific, (1) the symbol "C" indicates that all restricted areas are to be formed in the ON-state, (2) the symbol "Ai" indicates that a restricted area in the i-th layer is to be formed in the OFF-state and restricted areas in the other layers are to be formed in the ON-state, and (3) the symbol "Bij" indicates that a restricted area in the i-th layer and a restricted area in the j-th layer that is different from the i-th layer are to be formed in the OFF-state, and restricted areas in the other layers are to be formed in the ON-state. Here, "i" and "j" are specific numbers. From the definition, "Bij" and "Bji" are identical to each other.

The design information table 406 stores, as one example, design information that represents a standard two-terminal circuit with a three-layer structure.

5.2 State Expression

The state expression is composed of a constant term "S" that indicates the initial state of the two-terminal circuit and constant terms "C", "A1", ..., "B12", ... that indicate the above mentioned signal path states, connected using connectors "+", "31", "(", and ")". The state expression shows the number of signal paths that are included in the design information and that are in each of the above signal path states, and also shows the change record of the design information. The state expression is updated when the design information is changed.

The following describes in detail the state expression showing the number of signal paths in each of the above signal path states, and the change record. The constant term "S" indicates that the standard two-terminal circuit includes one signal path that is in each of the signal path states A1, ..., and B12, .... Each of the other constant terms connected using the connector "+" indicates an increase in the number of signal paths that are in the state indicated by the constant term, from the number of such signal paths in the standard two-terminal circuit. Each of the other constant terms connected using the symbol "−" indicates a decrease in the number of signal paths that are in the state indicated by the constant term, from the number of such signal paths in the standard two-terminal circuit. A range defined by the symbols "(" and ")" indicates an increase and a decrease in the number of signal paths in each signal path state resulting from each change of the design information (i.e., the change record of each signal path state).

As one specific example, the state expression is expressed as "S+(C−A1)". This state expression indicates the following change record of the design information. Assuming the number of signal paths included in the design information representing the standard two-terminal circuit as the initial state, the number of signal paths that are in the "C" state has increased by one, and the number of signal paths that are in the "A1" state has decreased by one. Along with this, a signal path in the "A1" state included in the design information representing the standard two-terminal circuit has been changed to a signal path that is in the "C" state.

5.3 Transformation Rules

Figure 16:
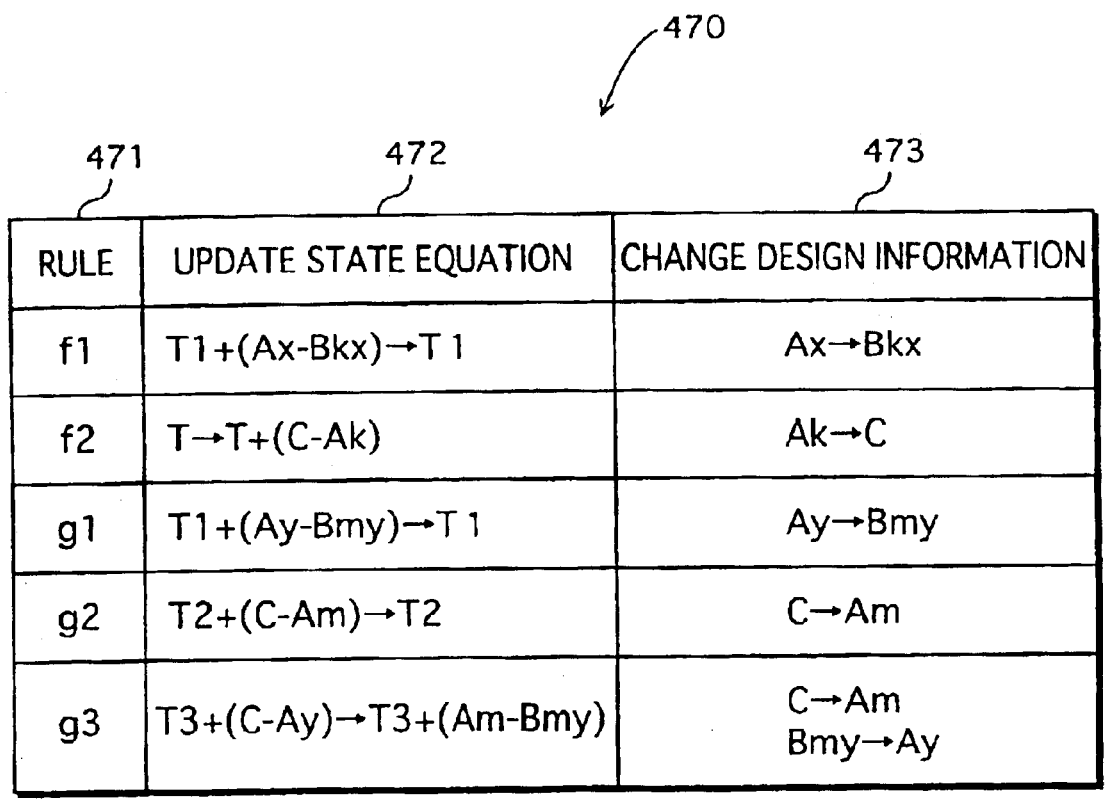
FIG. 16 is a table showing the correspondence between an update of a state expression and a change in design information.

FIG. 16 is a table showing the correspondence between (a) a transformation rule that is applied to the state expression in accordance with a designated target layer and the state expression, and (b) a change in design information to be made when the transformation rule is applied. A "rule" field 471 shows a rule name that identifies a transformation rule. A "state expression update" field 472 shows a transformation rule. A "design information change" field 473 shows a change in the design information.

Transformation rules "f1" and "f2" are applied when design information representing a two-terminal circuit that is in the disconnected state is changed so as to represent a two-terminal circuit that is in the connected state. Transformation rules "g1", "g2", and "g3" are applied when design information representing a two-terminal circuit that is in the connected state is changed so as to represent a two-terminal circuit that is in the disconnected state.

The following first describes each transformation rule in detail, and describes the overall processing, and then, proves that the corresponding change in the design information can be repeated an unlimited number of times.

5.3.1 Transformation Rule "f1"

The transformation rule "f1" is expressed as

T1+(Ax−Bkx)→T1 where "k" is a layer number identifying the target layer, "x" is a freely-chosen layer number that is different from "k", "T1+(Ax−Bkx)" is the state expression, "T1" is a partial expression included in the state expression, and "Ax" and "Bkx" are constant terms included in the state expression.

The transformation rule "f1" is applied to a case where the state expression includes a constant term "+(Ax−Bkx)" for the freely-chosen layer number "x" that is different from "k". Note that the constant term "+(Ax−Bkx)" has been generated when the transformation rule "g3" was applied, and the constant term "+(Ax−Bkx)" indicates the change record that the first preparation process previously performed on the design information has resulted in a signal path in the "Bkx" state being changed to a signal path in the "Ax" state.

When the transformation rule "f1" is applied, the state expression is updated to the partial expression "T1" as the constant term "+(Ax−Bkx)" is removed from the state expression. At the same time, the second preparation process in the change-to-connection process is performed on the design information. This results in the signal path in the "Ax" state being changed to the signal path in the "Bkx" state.

5.3.2 Transformation Rule "f2"

The transformation rule "f2" is expressed as

T→T+(C−Ak)

where "k" is a layer number identifying the target layer, "T" is the state expression, and "Ak" and "C" are constant terms included in the state expression.

The transformation rule "f2" is applied to any case, regardless of a constant term included in the state expression.

When the transformation rule "f2" is applied, the state expression is updated to the expression "T+(C−Ak)" as the constant term "+(C−Ak)" is added to the state expression. At the same time, the change-to-connection process is performed on the design information. This results in the signal path in the "Ak" state being changed to the signal path in the "C" state.

5.3.3 Transformation Rule "g1"

The transformation rule "g1" is expressed as

T1+(Ay−Bmy)→T1 where "m" is a layer number identifying the target layer, "y" is a freely-chosen layer number that is different from "m", "T1+(Ay−Bmy)" is the state expression, "T1" is a partial expression included in the state expression, and "Ay" and "Bmy" are constant terms included in the state expression.

The transformation rule "g1" is applied to a case where the state expression includes a constant term "+(Ay−Bmy)" for the freely-chosen layer number "y" that is different from "m". Note that the constant term "+(Ay−Bmy)" has been generated when the transformation rule "g3" was applied, and the constant term "+(Ay−Bmy)" indicates the change record that the first preparation process previously performed on the design information has resulted in a signal path in the "Bmy" state being changed to a signal path in the "Ay" state.

When the transformation rule "g1" is applied, the state expression is updated to the partial expression "T1" as the constant term "+(Ay−Bmy)" is removed from the state expression. At the same time, the second preparation process in the change-to-disconnection process is performed on the design information. This results in the signal path in the "Ay" state being changed to the signal path in the "Bmy" state.

5.3.4 Transformation Rule "g2"

The transformation rule "g2" is expressed as

T2+(C−Am)→T2 where "m" is a layer number identifying the target layer, "T2+(C−Am)" is the state expression, "T2" is a partial expression included in the state expression, and "Am" and "C" are constant terms included in the state expression.

The transformation rule "g2" is applied to a case where the state expression includes a constant term "+(C−Am)". Note that the constant term "+(C−Am)" has been generated when the transformation rule "f2" was applied, and the constant term "+(C−Am)" indicates the change record that the change-to-connection process previously performed on the design information results in the signal path in the "Am" state being changed to the signal path in the "C" state.

When the transformation rule "g2" is applied, the state expression is updated to the partial expression "T2" as the constant term "+(C−Am)" is removed from the state expression. At the same time, the change-to-disconnection process is performed on the design information. This results in the signal path in the "C" state being changed to the signal path in the "Am" state.

5.3.5 Transformation Rule "g3"

The transformation rule "g3" is expressed as

T3+(C−Ay)→T3+(Am−Bmy)

where "m" is a layer number identifying the target layer, "y" is a freely-chosen layer number that is different from "m", "T3+(C−Ay)" is the state expression, "T3" is a partial expression included in the state expression, and "Am", "Ay", "Bmy", and "C" are constant terms included in the state expression.

The transformation rule "g3" is applied to a case where the state expression includes a constant term "+(C−Ay)" for the freely-chosen layer number "y" that is different from "m". Note that the constant term "+(C−Ay)" has been generated when the transformation rule "f2" was applied, and the constant term "+(C−Ay)" indicates the change record that the change-to-connection process previously performed on the design information results in the signal path in the "Ay" state being changed to the signal path in the "C" state.

When the transformation rule "g2" is applied, the state expression is updated to the expression "T3+(Am−Bmy)" as the constant term "+(Am−Bmy)" is added to the partial expression "T3" that has been obtained by removing the constant term "+(C−Ay)" from the state expression. At the same time, the change-to-disconnection process is performed on the design information. This results in the signal path in the "C" state being changed to the signal path in the "Am" state, and the signal path in the "Bmy" state being changed to the signal path in the "Ay" state.

When the design information representing the standard two-terminal circuit and the state expression "S" are set as the initial state and the transformation rules are applied one after another to repeatedly change the design information and the state expression, the state expression corresponding to each change of the design information indicates, according to the definition of each transformation rule, the number of signal paths that are included in the design information and that are in each signal path state, and the change record of the design information.

5.4 Overall Operations

Figure 17:
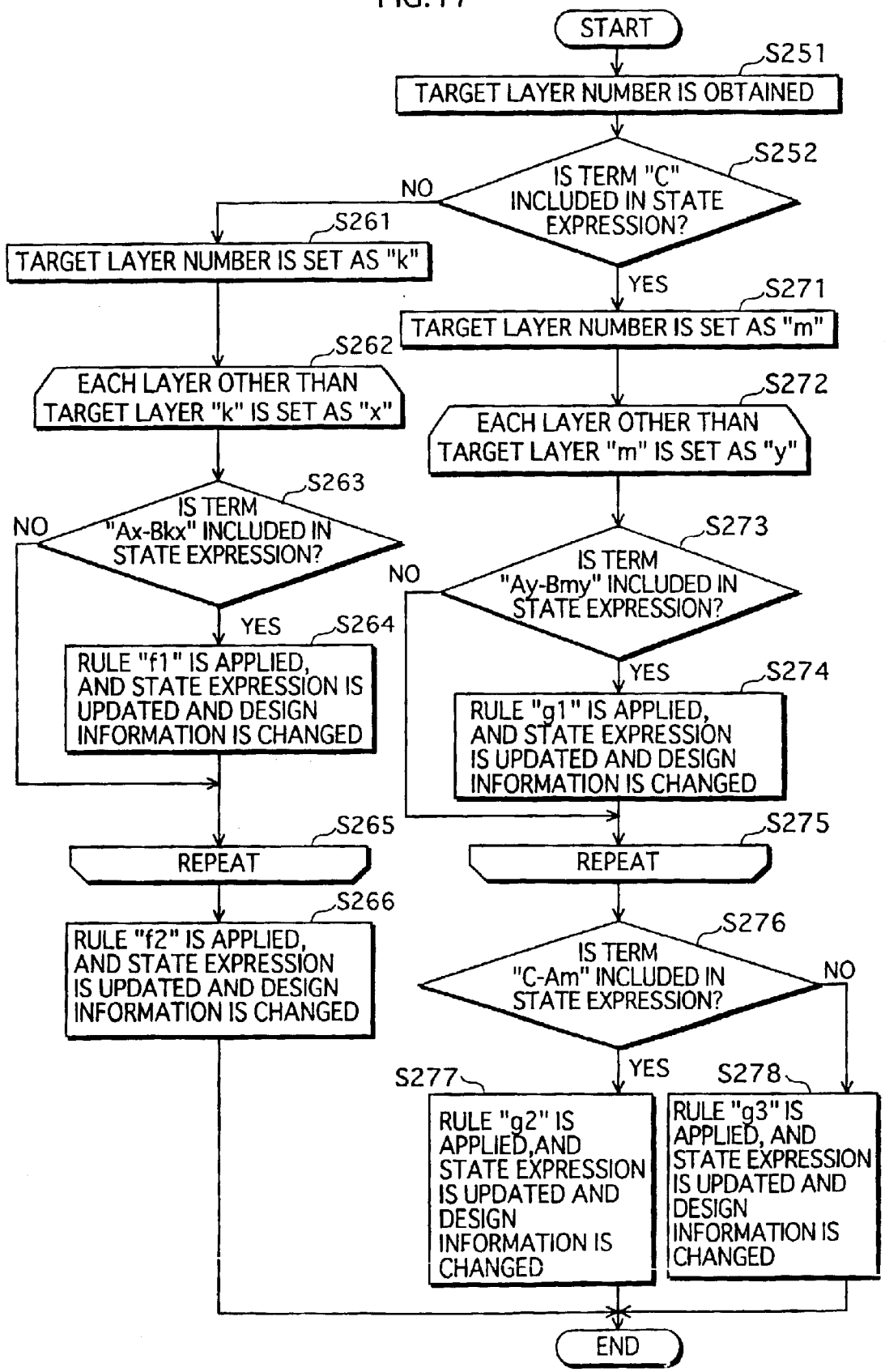
FIG. 17 is a flowchart showing a process for switching the circuit state shown by the design information between the disconnected state and the connected state.

FIG. 17 is a flowchart showing the overall operations of a design information change process in the present embodiment. This flowchart shows one example of the order in which the transformation rules are applied.

(Step S251) A target layer number is obtained.

(Step S252) When the state expression includes a constant term "C", the processing advances to step S271. When the state expression does not include a constant term "C", the processing advances to step S261.

(Step S261) The obtained target layer number is set as "k".

(Step S262) A layer number of one of the layers other than the target layer is set as "x", and the processing advances to step S263.

(Step S263) When the state expression includes a constant term "+(Ax−Bkx)", the processing advances to step S264.

(Step S264) The transformation rule "f1" is applied, and the state expression is updated and the design information is changed.

(Step S265) A layer number of each of the other layers is set as "x", and the processing from step S262 is repeated.

(Step S266) The transformation rule "f2" is applied, and the state expression is updated and the design information is changed.

(Step S271) The obtained target layer number is set as (Step S272) A layer number of one of the layers other than the target layer is set as "y", and the processing advances to step S273.

(Step S273) When the state expression includes a constant term "+(Ay−Bmy)", the processing advances to step S274.

(Step S274) The transformation rule "g1" is applied, and the state expression is updated and the design information is changed.

(Step S275) A layer number of each of the other layers is set as "y", and the processing from step S272 is repeated.

(Step S276) When the state expression includes a constant term "+(C−Am)", the processing advances to step S277. When the state expression does not include a constant term "+(C−Am)", the processing advances to step S278.

(Step S277) The transformation rule "g2" is applied, and the state expression is updated and the design information is changed.

(Step S278) The transformation rule "g3" is applied, and the state expression is updated and the design information is changed.

FIG. 18 shows a specific example of a case where the state expression "S" and the design information representing a standard two-terminal circuit formed to extend over three layers are set as the initial state, and the processing shown in the flowchart in FIG. 17 is repeatedly executed. A "number" field 481 shows the number of changes made since the initial state. A "category" field 482 shows a category of a change process, namely, either the change-to-connection process or the change-to-disconnection process. A "target layer" field 483 shows a target layer. An "applied rule" field 484 shows a rule name that identifies a transformation rule applied in the change process. A "state expression" field 485 shows the state expression after the transformation rule has been applied. A "design information" field 486 shows a signal path state of each signal path included in the design information after the transformation rule has been applied.

It should be noted here that, in the "design information" field 486, a signal path that has been changed due to an applied transformation rule is underlined.

5.5 Proof that Change is Possible Unlimited Number of Times

The following describes that a change in the design information corresponding to an applied transformation rule is always possible, when the design information representing the standard two-terminal circuit and the state expression "S" are set as the initial state and the processing shown in the flowchart in FIG. 17 is repeatedly executed. As described above, the state expression corresponding to each change of the design information indicates the number of signal paths that are included in the design information and that are in each signal path state, by an increase or a decrease from those of the standard two-terminal circuit.

Referring now back to FIG. 16, to enable the corresponding change in design information to be made when the transformation rules "f1", "f2", "g1", "g2", and "g3" are applied, the design information needs to include, respectively, a signal path in the "Ax" state, a signal path in the "Ak" state, a signal path in the "Ay" state, a signal path in the "C" state, and signal paths in the "C" state and the "Bmy" state.

The transformation rules "f1", and "f2" are applied to a case where the design information and the state expression are in the initial state, or to a case where the design information shows the disconnected state immediately after the transformation rule "g2" or the transformation rule "g3" has been applied. At this point, the state expression does not include a constant term "+(C−Ax)" for any layer number "x", as the state expression is "S" in the initial state or the constant term "+(C−Ax)" has been removed from the state expression corresponding to the transformation rule "g2" or "g3". Because the state expression does not include a constant term "−Ax" that indicates a decrease in the number of signal paths in the "Ax" state, the state expression to which the transformation rule "f1" is applied indicates that the design information includes at least two signal paths in the "Ax" state. Also, because the state expression does not include a constant term "−Ax" that indicates a decrease in the number of signal paths in the "Ax" state, the state expression to which the transformation-rule "f2" is applied indicates that the design information includes at least one signal path in the "Ak" state. Accordingly, a change in the design information corresponding to the applied transformation rule is possible.

The transformation rules "g1", "g2", and "g3" are applied to a case where the design information shows the connected state immediately after the transformation rule "f2" has been applied. At this point, the state expression includes one constant term "+(C−Ax)" for a certain layer number "x" as the constant term "+(C−Ax)" has been added to the state expression, corresponding to the transformation rule "f2". Because the state expression includes one constant term "−Ax" for the certain layer number "x", the state expression to which the transformation expression "g1" is applied indicates that the design information includes at least one signal path in the "Ax" state. Accordingly, a change "Ax→Bmx" in the design information is possible.

The state expression in a case where the transformation rule "g2" and the transformation rule "g3" are applied indicates that the design information includes a signal path in the "C" state. Accordingly, a change "C→Am" in the design information is possible.

A change "Bmy→Ay" in the design information corresponding to the transformation rule "g3" is apparently possible when this change is made for the first time and so a signal path in the "Bmy" state is included in the design information. However, when this change is made for the second time or later and so the signal path in the "Bmy" state has been lost in the design information, a signal path in the "Bmy" state becomes necessary. In view of this, a signal path in the "Bmy" state is prepared without fail in the following way, before the signal path in the "Bmy" state becomes necessary as a change target.

A signal path in the "Bmy" state becomes necessary as a change target in the case where the change-to-connection process using the y-th layer as the target layer and the change-to-disconnection process using the m-th layer as the target layer are continuously executed after a signal path in the "Bmy" state is lost. A signal path in the "Bmy" state also becomes necessary as a change target in the case where the change-to-connection process using the m-th layer as the target layer and the change-to-disconnection process using the y-th layer as the target layer are continuously executed. To be specific, the signal path in the "Bmy" becomes necessary as a change target at the point when the transformation rule "g3" is applied in the change-to-disconnection process in either of the above cases.

The state expression corresponding to the design information from which the signal path in the Bmy state is removed is expressed as "T+(Am−Bmy)" or "T+(Ay−Bmy)". Here, "T" no longer includes "−Bmy".

The following describes various cases where a signal path in the Bmy state is prepared before such a signal path becomes necessary in correspondence with the transformation rule "g3".

(1) In a case where the state expression is "T+(Am−Bmy)", a connection process is performed in the y-th layer and a disconnection process is performed in the m-th layer.

Connection in the y-th layer:

$$f2(f1(T+(Am-Bmy)))=f2(T)=T+(C-Ay)$$

Disconnection in the m-th layer:

$$g3(T+(C-Ay))=T+(Am-Bmy)$$

These transformations mean the following. A signal path in the "Bmy" state is prepared using a signal path in the "Am" state in correspondence with the transformation rule "f1". After that, the prepared signal path in the "Bmy" state is changed back to a signal path in the "Am" state in correspondence with the transformation rule "g3".

(2) In a case where the state expression is "T+(Am−Bmy)", a connection process is performed in the m-th layer and a disconnection process is performed in the y-th layer.

Connection in the m-th layer:

$$f2(T+(Am-Bmy))=T+(Am-Bmy)+(C-Am)$$

Disconnection in the y-th layer:

$$g3(g1(T+(Am-Bmy)+(C-Am)))=g3(T+(C-Am))=T+(Ay-Bmy)$$

These transformations mean the following. A signal path in the "Bmy" state is prepared using a signal path in the "Am" state in correspondence with the transformation rule "g1". Immediately after that, the signal path in the "Bmy" state is changed back to a signal path in the "Am" state in correspondence with the transformation rule "g3".

(3) In a case where the state expression is "T+(Ay−Bmy)" a connection process is performed in the y-th layer and a disconnection process is performed in the m-th layer.

Connection in the y-th layer:

$$f2(T+(Ay-Bmy))=T+(Ay-Bmy)+(C-Ay)$$

Disconnection in the m-th layer:

$$g3(g1(T+(Ay-Bmy)+(C-Ay)))=g3(T+(C-Ay))=T+(Am-Bmy)$$

These transformations mean the following. A signal path in the "Bmy" state is prepared using a signal path in the "Ay" state in correspondence with the transformation rule "g1". Immediately after that, the signal path in the "Bmy" state is changed back to a signal path in the "Ay" state in correspondence with the transformation rule "g3".

(4) In a case where the state expression is "T+(Ay−Bmy)", a connection process is performed in the m-th layer and a disconnection process is performed in the y-th layer.

Connection in the m-th layer:

$$f2(f1(T+(Ay-Bmy)))=f2(T)=T+(C-Am)$$

Disconnection in the y-th layer:

$$g3(T+(C-Am))=T+(Ay-Bmy)$$

These transformations mean the following. A signal path in the "Bmy" state is prepared using a signal path in the "Ay" state in correspondence with the transformation rule "f1". After that, the signal path in the "Bmy" state is changed back to a signal path in the "Ay" state in correspondence with the transformation rule. "g3".

As described above, when the design information representing the standard two-terminal circuit and the state expression "S" are set as the initial state and the processing shown in the flowchart in FIG. 17 is repeatedly executed, a change in the design information corresponding to an applied transformation rule is always possible. Accordingly, the processing shown in the flowchart in FIG. 17 can be executed repeatedly an unlimited number of times.

5.6 Conclusions

According to this design method, a transformation rule judged as suitable in accordance with a designated target layer and the state expression can be applied, and accordingly, the state expression is updated and at the same time a change in the design information corresponding to the applied transformation rule is made. By doing so, the design information representing the standard two-terminal circuit can be changed so as to represent a new two-terminal circuit whose circuit state has been switched between the disconnected state and the connected state repeatedly an unlimited number of times, by changing the state of restricted areas in one layer in the design information.

6. Sixth Embodiment

A design method relating to a sixth embodiment of the present invention is for selecting an initial construction of the two-terminal circuit described in the third embodiment, so as to enable a repeated construction of a new two-terminal circuit whose circuit state is switched between the signal-transmittable state and the signal-untransmittable state at least a predetermined number of times, by changing the state of at least one restricted area included in a target layer in the design information each time. This design method selects, as the initial construction, the construction with a smaller number of signal paths.

This design method includes an obtaining step of obtaining the above predetermined number of times. The predetermined number of times obtained in this step is referred to as "2a", and the number of layers of the two-terminal circuit is referred to as "n".

A circuit complying with a first candidate construction that enables a repeated construction of the above-described two-terminal circuit at least "2a" times is one type of the two-terminal circuit described in the third embodiment. To be more specific, the circuit is constructed by connecting in parallel "a" signal paths being provided corresponding to the layers. Each signal path includes a restricted area in the corresponding layer being in the OFF-state and restricted areas in the other layers being in the ON-state. On each signal path, restricted areas formed in all the layers including the corresponding layer are connected in series. The number of signal paths included in the two-terminal circuit is "a×n".

According to the design method described in the second embodiment, a two-terminal circuit whose circuit state is switched between the disconnected state and the connected state can be repeatedly constructed at least "2a" times, with the first candidate construction being the initial construction.

Also, a circuit complying with a second candidate construction is the above-described standard two-terminal circuit. The number of signal paths included in the standard two-terminal circuit is "1Cn+2Cn=n+n×(n−1)÷2".

According to the design method described in the fifth embodiment, a two-terminal circuit whose circuit state is switched between the disconnected state and the connected state can be repeatedly constructed an unlimited number of times, with the second candidate construction being the initial construction.

The present design method includes a selection step of selecting, out of the first candidate construction and the second candidate construction, the construction including a smaller number of signal paths. In this selection step, values for "a" and "n" are referred to, and when "a×n<n+n×(n−1)÷2", the first candidate construction is selected. In the other cases, the second candidate construction is selected.

7. Seventh Embodiment

A design aiding device relating to a seventh embodiment of the present invention provides an aid in changing the design information representing the two-terminal circuit described in the third embodiment, based on the design method described in the fifth embodiment.

7.1 Construction

Figure 19:
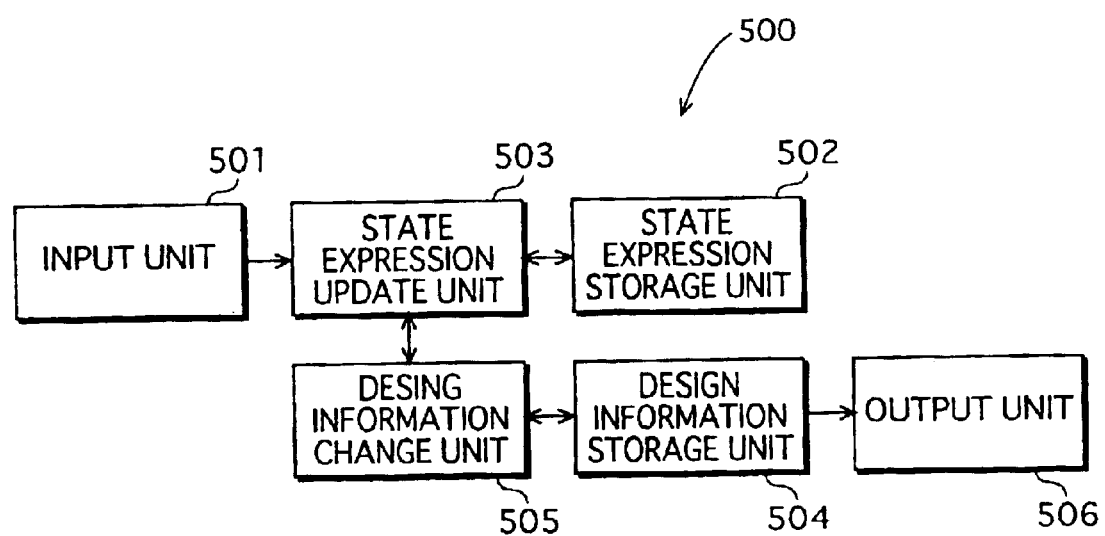
FIG. 19 is a functional block diagram showing a design aiding device relating to a seventh embodiment of the present invention.

FIG. 19 is a functional block diagram showing the overall construction of a design aiding device 500. The design aiding device 500 includes an input unit 501, a state expression storage unit 502, a state expression update unit 503, a design information storage unit 504, a design information change unit 505, and an output unit 506.

The design aiding device 500 is specifically realized by hardware such as a processor, a ROM (Read Only Memory) on which a program is recorded, a RAM (Random Access Memory) that is a work area, and a hard disk device. The functions of the design aiding device 500 are realized by the processor executing the program recorded on the ROM. Information is passed among the elements of the design aiding device 500 via the RAM and the hard disk device.

The input unit 501 obtains a target layer number that identifies a target layer from outside of the device, and passes the obtained target layer number to the state expression update unit 503.

The state expression storage unit 502 stores the state expression described in the fifth embodiment.

The state expression update unit 503 stores the table in FIG. 16 that shows the correspondence between a transformation rule and an instruction to change the design information described in the fifth embodiment. The state expression update unit 503 selects a transformation rule according to the state expression stored in the state expression storage unit 502 and the target layer number. The state expression update unit 503 then applies the selected transformation rule to update the state expression stored in the state expression storage unit 502, and at the same time, to instruct the design information change unit 505 to make a change in the design information corresponding to the applied transformation rule.

The design information storage unit 504 includes restricted area information and layout information representing the two-terminal circuit described in the third embodiment.

When given the change instruction from the state expression update unit 503, the design information change unit 505 changes the layout information stored in the design information storage unit 504 according to the change instruction.

The output unit 506 displays the changed layout information.

7.2 Design Information

Figure 20:
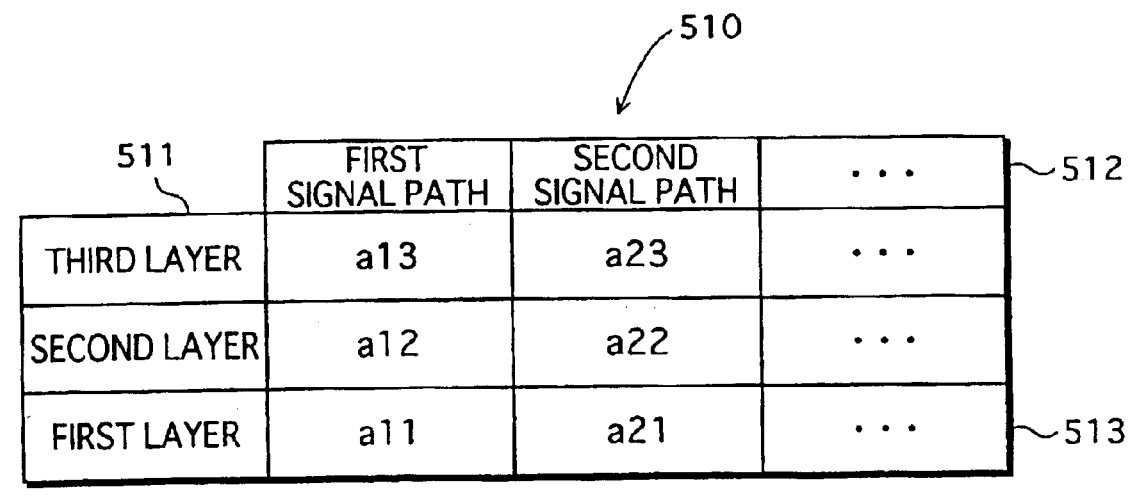

FIG. 20 shows one example of restricted area information stored in a restricted area table 510 in the design information storage unit 504. This restricted area information represents a two-terminal circuit formed to extend over three layers.

In the restricted area table 510, columns correspond to signal paths, and rows correspond to layers. A "layer number" field 511 shows a layer number for identifying a layer corresponding to each row. A "signal path identification name" field 512 shows a signal path identification name for identifying a signal path corresponding to each column. A "restricted area location" field 513, where a row and a column intersect with each other, shows a location of an area on the layout that is occupied by a restricted area included in a layer identified by the corresponding layer number on a signal path identified by the corresponding signal path identification name. It should be noted here that the restricted area information is set in advance.

Figure 21:
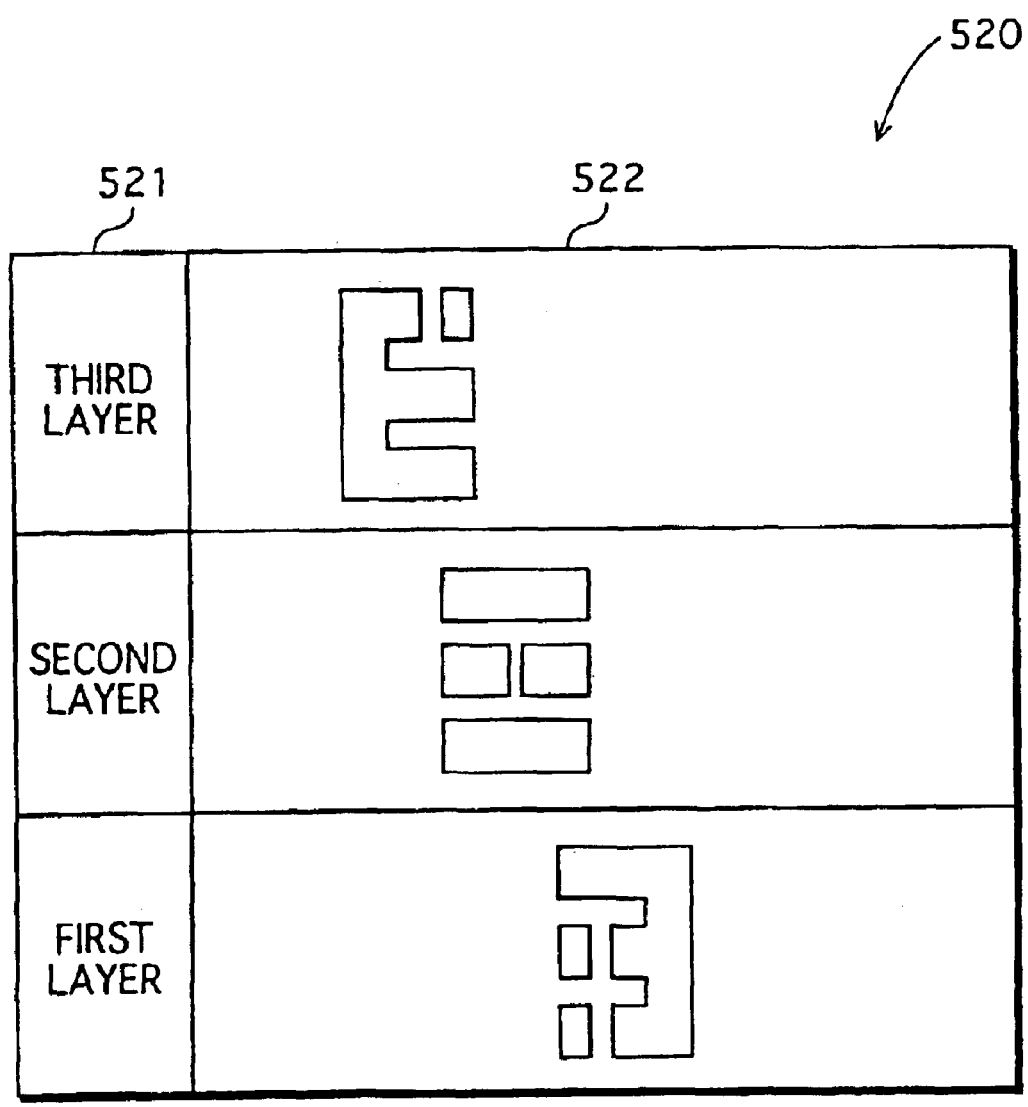
FIG. 21 shows one example of layout information stored by the design aiding device.

FIG. 21 shows one example of layout information stored in a layout table 520 in the design information storage unit 504. This layout information represents a two-terminal circuit formed to extend over three layers.

In the layout table 520, rows correspond to layers. A "layer number" field 521 shows a layer number for identifying a layer corresponding to each row. A "conductor layout information" field 522 shows conductor layout information that shows an area where a conductor is to be formed in a layer identified by the corresponding layer number.

The layout information is referred to and changed by the design information change unit 505.

The design information change unit 505 is given an instruction to change the state of a signal path from the state expression update unit 503. In response to this instruction to change the state of the signal path, the design information change unit 505 changes the layout information in the following way.

First, the design information change unit 505 refers to the restricted area information and identifies a location of an area occupied by a restricted area in each layer on each signal path. Following this, the design information change unit 505 obtains the state of each signal path. To obtain the state of each signal path, the design information change unit 505 obtains the ON or OFF state of each restricted area in the conductor layout information in each layer, by judging whether each restricted area is shown as an area in which a conductor is to be formed or not. Further, according to the obtained state of each signal path, the design information change unit 505 changes an area occupied by a restricted area in the target layer in the conductor layout information.

7.3 Operations

The design aiding device 500 obtains a change target number, judges which one of the transformation rules is to be applied, updates the state expression, and updates the design information by following, except some details in a process for changing design information, the same procedures as the design method in the fifth embodiment shown in the flowchart in FIG. 17.

8. Eighth Embodiment

A signal selection circuit in an eighth embodiment is constructed by using such two-terminal circuits that are described in the first or third embodiment.

Figure 22A:
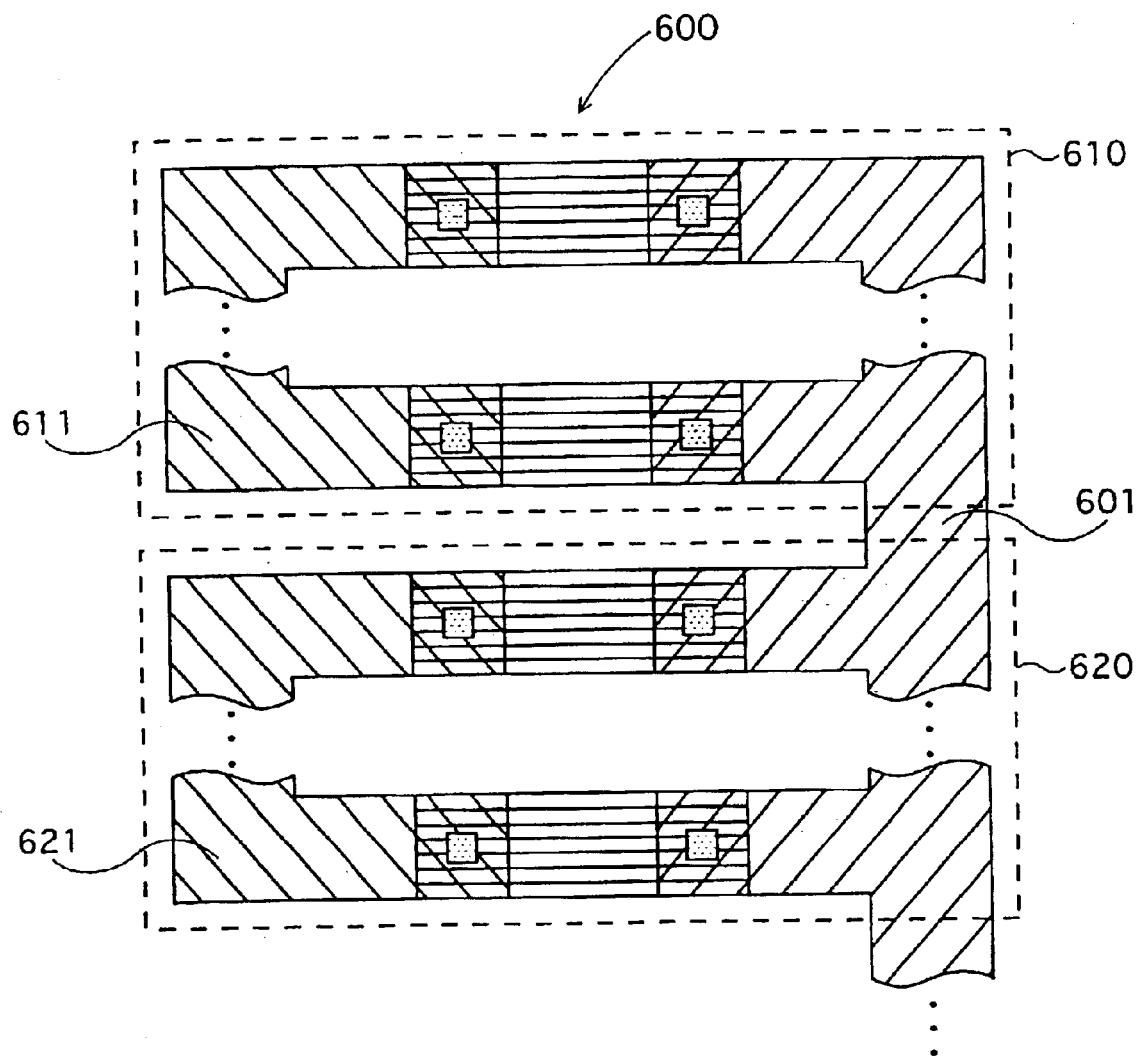
FIG. 22(A) is a top view of a signal selection circuit in an eighth embodiment of the present invention.

FIG. 22(A) is a top view showing a layout of elements of a signal selection circuit 600. The signal selection circuit 600 includes two-terminal circuits 610 and 620 that are provided in correspondence with selection target signals. Each selection target signal is applied to one terminal 611 or 621 of the corresponding two-terminal circuit. The other terminals of the two-terminal circuits are connected to form an output terminal 601. A detailed layout within each two-terminal circuit is the same as the layout described in the first or third embodiment, and so is not described here.

Figure 22B:
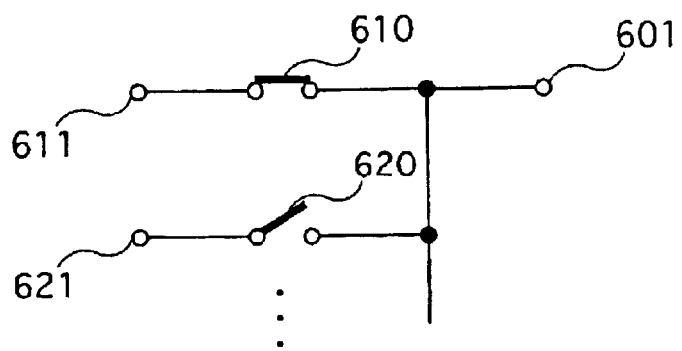
FIG. 22(B) is an equivalent circuit diagram showing the signal selection circuit.

FIG. 22(B) is an equivalent circuit diagram showing the signal selection circuit 600. In the figure, the circuit elements corresponding to the elements in FIG. 22(A) are given the same reference numerals.

One of the two-terminal circuits included in the signal selection circuit 600 is in the connected state. The other one of the two-terminal circuits is in the disconnected state. Therefore, a signal corresponding to the two-terminal circuit in the connected state is selected and outputted from the output terminal 601.

According to this construction, based on the signal selection circuit 600, a new signal selection circuit that differs from the signal selection circuit 600, in a signal to be selected by changing the state of restricted areas in one freely-chosen layer, can be constructed.

9. Ninth Embodiment

A standard cell in a ninth embodiment of the present invention is a signal selection standard cell that constitutes a semiconductor IC device including a standard cell base layout area. The standard cell includes a plurality of such two-terminal circuits that are described in the first or third embodiment.

Figure 23:
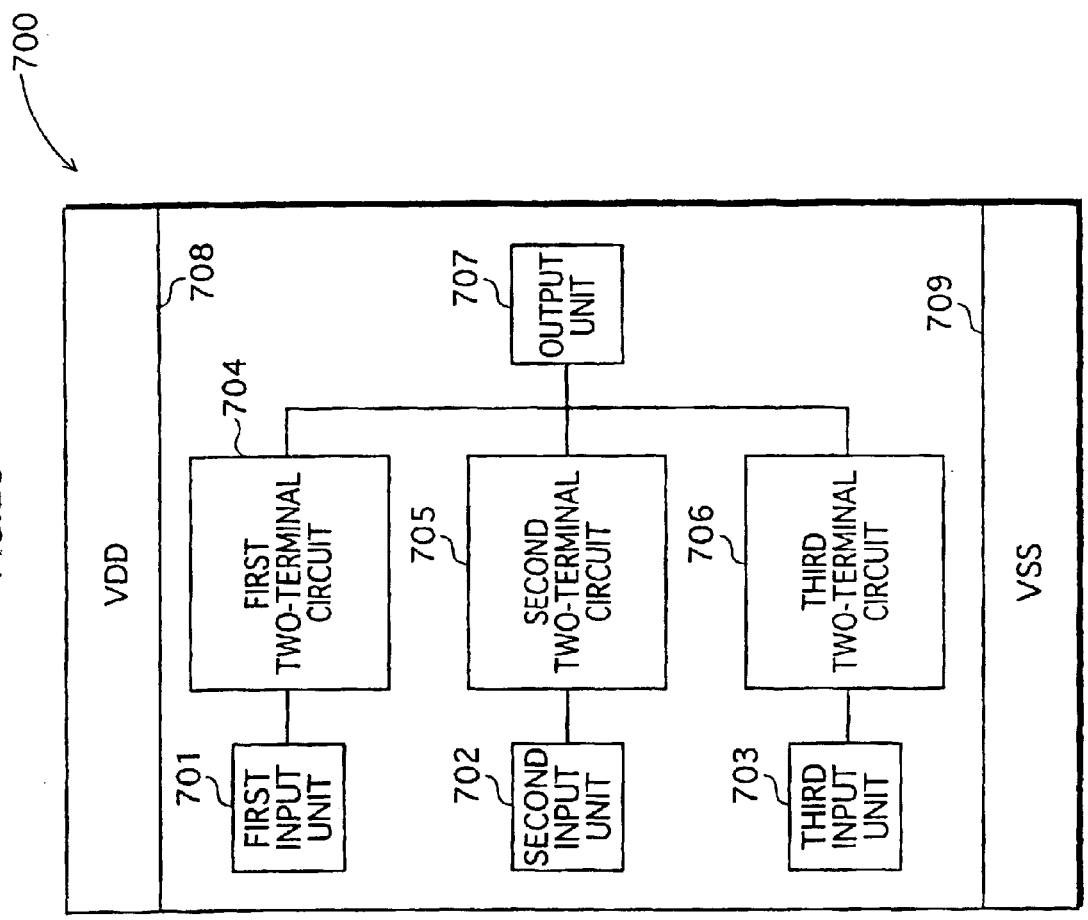
FIG. 23 is a pattern view showing a signal selection standard cell in a ninth embodiment of the present invention.

FIG. 23 is a pattern view showing one example of a layout of a signal selection standard cell 700. The signal selection standard cell 700 includes a first input unit 701, a second input unit 702, and a third input unit 703 that each are connected to outside, includes a first two-terminal circuit 704, a second two-terminal circuit 705, a third two-terminal circuit 706 each one terminal of which is connected to the corresponding one of the first, second, and third input units, and includes an output unit 707 that is connected to the other terminals of the first, second, and third two-terminal circuits, a power supply unit 708, and a ground unit 709.

In the signal selection standard cell 700, one of the two-terminal circuits is in the connected state, and the other two-terminal circuits are in the disconnected state, so that a signal that has been applied to the input unit corresponding to the two-terminal circuit in the connected state is selected and outputted from the output unit 707.

According to this construction, instead of the signal selection standard cell 700, a new signal selection standard cell that differs from the signal selection standard cell 700, in a signal to be selected by changing the state of restricted areas in one freely-chosen layer of any one of the two-terminal circuits to switch its circuit state between the disconnected state and the connected state, can be selected.

10. Tenth Embodiment

A standard cell group relating to a tenth embodiment of the present invention is a signal selection standard cell group that constitutes a semiconductor IC device including a standard cell base layout area. The standard cell group is roughly composed of an input assign cell and an output assign cell. Each cell includes such a two-terminal circuit that is described in the first or third embodiment.

Figure 24B:
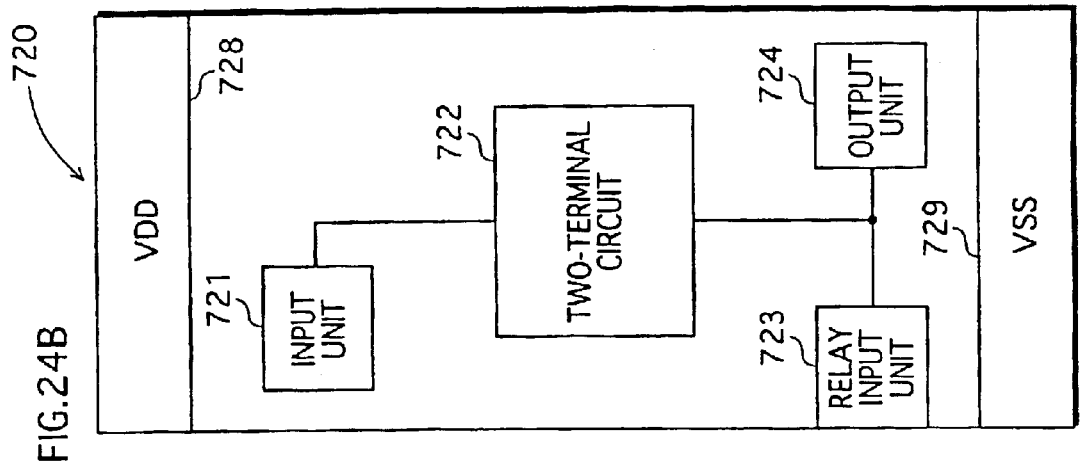
FIG. 24 is pattern view showing an input cell and an output cell included in a signal selection standard cell group in a tenth embodiment of the present invention.
Figure 24A:
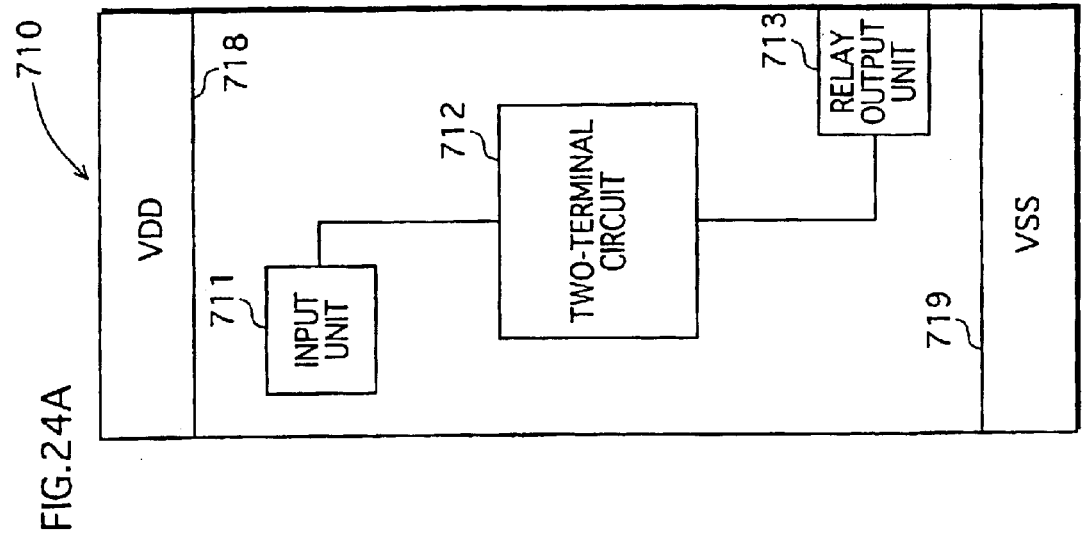

FIG. 24(A) is a pattern view showing one example of a layout of the input assign cell 710. The input assign cell 710 includes an input unit 711 that is connected to outside, a two-terminal circuit 712 whose one terminal is connected to the input unit 711, a relay output unit 713 that is connected to the other terminal of the two-terminal circuit 712, a power supply unit 718, and a ground unit 719.

FIG. 24(B) is a pattern view showing one example of a layout of the output assign cell 720. The output assign cell 720 includes an input unit 721 that is connected to outside, a two-terminal circuit 722 whose one terminal is connected to the input unit 721, a relay input unit 723, an output unit 724 that is connected to the other terminal of the two-terminal circuit 722 and the relay input unit 723, a power supply unit 728, and a ground unit 729.

When the input assign cell 710 and the output assign cell 720 are placed in cell blocks that are adjacent to each other, the relay output unit 713 and the relay input unit 723 are placed so as to be connected to each other.

According to this construction, instead of the input assign cell 710, a new input assign cell that differs from the input assign cell 710, in the signal selection state switched between the signal-selected state and the signal-unselected state by changing the state of restricted areas in one freely-chosen layer of the two-terminal circuit 712 to switch the state of the two-terminal circuit 712 between the disconnected state and the connected state, can be selected. Also, instead of the output assign cell 720, a new output assign cell that differs from the output assign cell 720, in the signal selection state switched between the signal-selected state and the signal-unselected state by changing the state of restricted areas in one freely-chosen layer of the two-terminal circuit 722 to switch the state of the two-terminal circuit 722 between the disconnected state and the connected state, can be selected.

In the signal selection standard cell group, the input assign cell 710 and the output assign cell 720 are placed in adjacent cell blocks, and one of the input assign cell 710 and the output assign cell 720 is in the signal-selected state and the other one of the input assign cell 710 and the output assign cell 720 is in the signal-unselected state. By doing so, a signal that has been applied to the input unit of the cell in the signal-selected state can be outputted from the output unit 724.

The signal selection standard cell group may further include an assign cell for a relay purpose. In this case, this relay assign cell includes such a two-terminal circuit that is described in the first or third embodiment.

Figure 25:
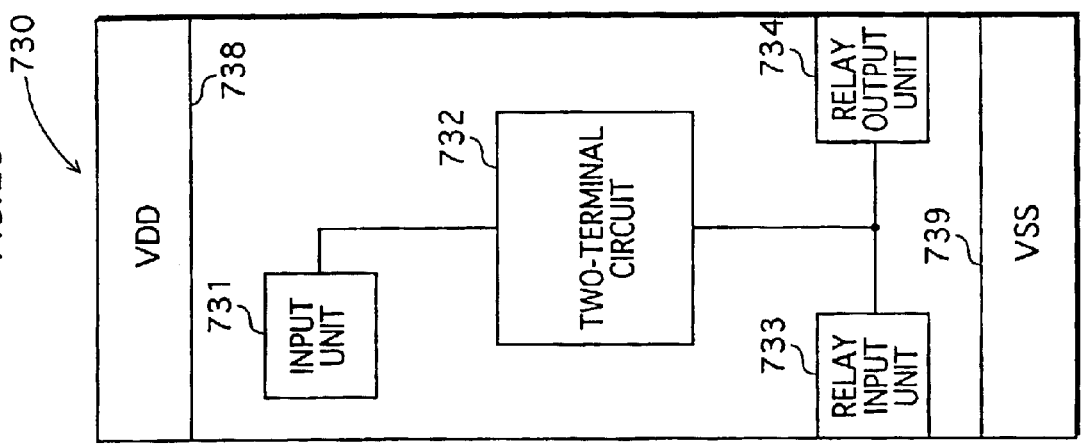
FIG. 25 is a pattern view showing a relay cell included in the signal selection standard cell group in the tenth embodiment.

FIG. 25 is a pattern view showing one example of a layout of a relay assign cell 730. The relay assign cell 730 includes an input unit 731 that is connected to outside, a two-terminal circuit 732 whose one terminal is connected to the input unit 731, a relay input unit 733, a relay output unit 734 that is connected to the other terminal of the two-terminal circuit 732 and to the relay input unit 733, a power supply unit 738, and a ground unit 739.

When the input assign cell 710 and the relay assign cell 730 are placed in adjacent cell blocks, the relay output unit 734 and the relay input unit 733 are placed so as to be connected to each other.

When the relay assign cell 730 and the output assign cell 720 are placed in adjacent cell blocks, the relay output unit 734 and the relay input unit 723 are placed so as to be connected to each other.

When the two relay assign cells 730 are placed in adjacent cell blocks, the relay output unit 734 and the relay input unit 733 are placed so as to be connected to each other.

According to this construction, instead of the relay assign cell 730, a new relay assign cell that differs from the relay assign cell 730, in the signal selection state switched between the signal-selected state and the signal-unselected state by changing the state of restricted areas in one freely-chosen layer of the two-terminal circuit 732 to switch the state of the two-terminal circuit 732 between the disconnected state and the connected state, can be selected.

In the signal selection standard cell group, the input assign cell 710, the one or more relay assign cells 730, and the output assign cell 720 are sequentially placed in adjacent cells, and one of the input assign cell 710, the one or more relay assign cells 730, and the output assign cell 720 is in the signal-selected state, and the other cells are in the signal-unselected state. By doing so, a signal that has been applied to the input unit of the cell in the signal-selected state can be outputted from the output unit 724.

The signal selection standard cell group can provide a function to select an appropriate signal out of the same number of input signals as that for the signal selection standard cell described in the ninth embodiment, with a combination of cells of less variety than the signal selection standard cell described in the ninth embodiment. To be more specific, assuming that there are n-types of combinations of the state of restricted areas included in each two-terminal circuit and that the number of input signals is "P", $n^P$ types of cells are necessary for enabling a selection of a new cell that differs in a signal to be selected and the state in one freely-chosen layer, according to the construction of the signal selection standard cell. On the other hand, only "n×3" types of cells are necessary for enabling such a selection, according to the construction of the signal selection standard cell group.

11. Eleventh Embodiment

A standard cell relating to an eleventh embodiment of the present invention is a binary logical signal output standard cell that constitutes a semiconductor IC device including a standard cell base layout area. The standard cell includes such a two-terminal circuit that is described in the first or third embodiment.

Figure 26:
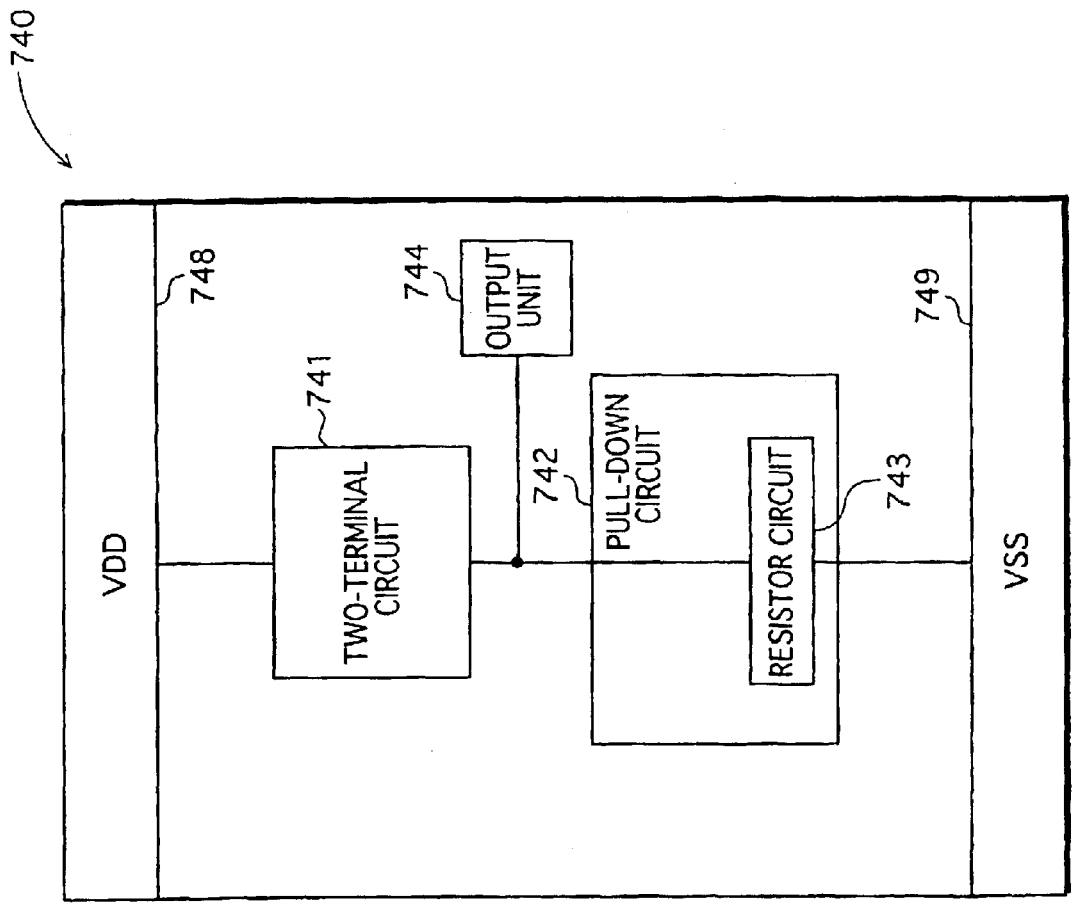
FIG. 26 is a pattern view showing a binary logical signal output standard cell in an eleven embodiment of the present invention.

FIG. 26 is a pattern view showing one example of a layout of a binary logical signal output standard cell 740. The binary logical signal output standard cell 740 includes a power supply unit 748, a pull-down circuit 742, a two-terminal circuit 741 whose one terminal is connected to the pull-down circuit 742 and the other terminal is connected to the power supply unit 748, an output unit 744 that is connected to the one terminal of the two-terminal circuit 741, and a ground unit 749.

The pull-down circuit 742 is connected to the one terminal of the two-terminal circuit 741 and to the ground unit 749 via an internal resistor circuit 743.

According to this construction, the binary logical signal output standard cell 740 outputs a binary logical signal of a high level or a low level, depending on the circuit state of the two-terminal circuit 741 being either the connected state or the disconnected state. Instead of the binary logical signal output standard cell 740, a new binary logical signal output standard cell that differs from the binary logical signal output standard cell 740, in the level of an output signal being switched by changing the state of restricted areas in one freely-chosen layer of the two-terminal circuit 741, can be selected.

It should be noted here that the construction of the binary logical signal output standard cell is not limited to the above-described example.

For example, a pull-up circuit, and a two-terminal circuit whose one terminal is connected to the pull-up circuit and the other terminal is connected to the ground unit may be used to construct the binary logical signal output standard cell with the same functions as above.

12. Twelfth Embodiment

A standard cell relating to a twelve embodiment of the present invention is a signal selection standard cell for selecting one of two input signals. The standard cell constitutes a semiconductor IC device including a standard cell base layout area. The standard cell includes such a two-terminal circuit that is described in the first or third embodiment.

Figure 27:
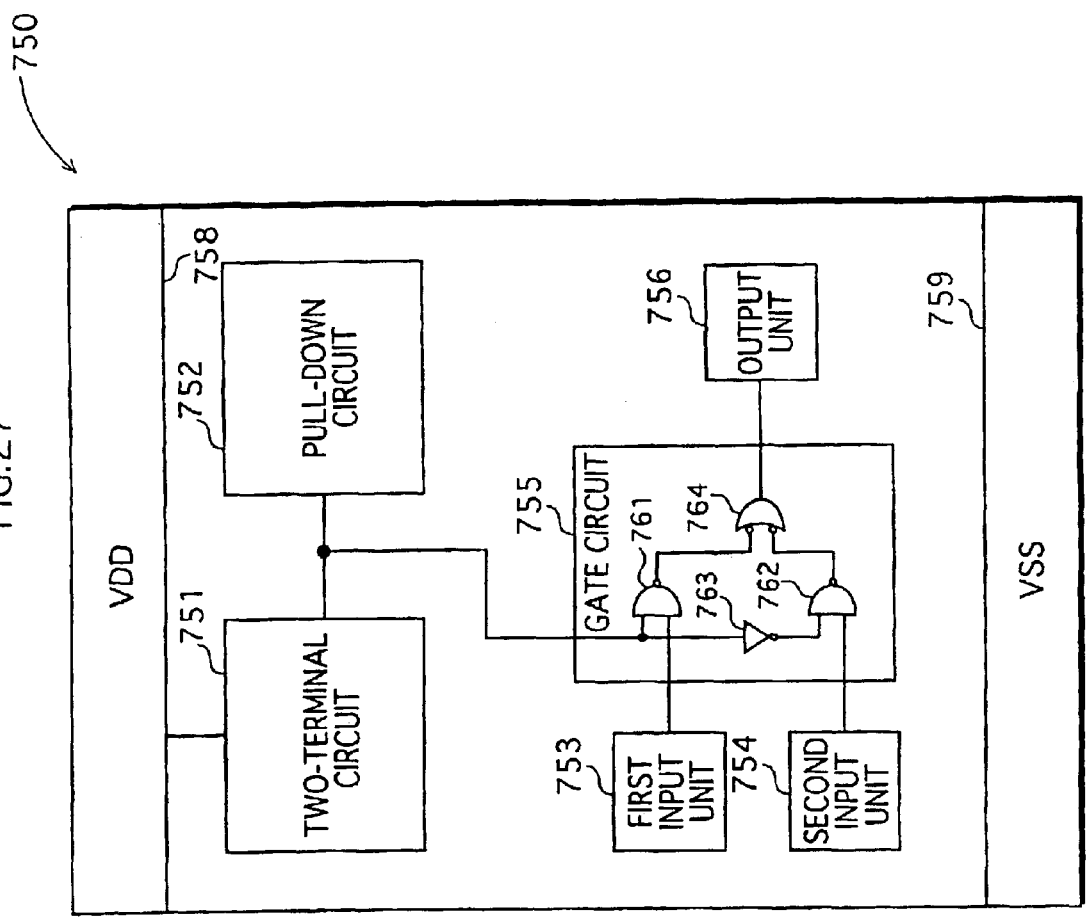
FIG. 27 is a pattern view showing a signal selection standard cell in a twelve embodiment of the present invention.

FIG. 27 is a pattern view showing one example of a layout of a signal selection standard cell 750. The signal selection standard cell 750 includes a power supply unit 758, a pull-down circuit 752, a two-terminal circuit 751 whose one terminal is connected to the pull-down circuit 752 and the other terminal is connected to the power supply unit 758, a first input unit 753, a second input unit 754, and a gate circuit 755 that outputs to its output terminal, a signal that has been applied to the first input unit 753 or the second input unit 754 depending on a signal level obtained from the one terminal of the two-terminal circuit 741, an output unit 756 that is connected to the output terminal of the gate circuit 755, and a ground unit 759.

The gate circuit 755 is constructed, as one example, by three NAND gates 761, 762, and 764, and a NOT gate 763.

The gate circuit 755 occupies a smaller area than the two-terminal circuit 751. According to this construction, therefore, the signal/selection standard cell 750 occupies a smaller area than the signal selection standard cell constructed by two two-terminal circuits as the signal selection standard cell described in the eighth embodiment. Also, a signal to be selected can be switched by changing the one two-terminal circuit.

13. Thirteenth Embodiment

A design method relating to a thirteenth embodiment of the present invention realizes a selection out of standard cells that each include one or more two-terminal circuits. To be specific, the design method is for selecting a standard cell that differs from a standard cell that is presently used in a semiconductor IC device, in that the standard cell includes a two-terminal circuit whose circuit state differs from a two-terminal circuit of the presently used standard cell.

13.1 Alternative Cell Information

Figure 28:
FIG. 28 shows one example of alternative cell information.

FIG. 28 shows one example of alternative cell information used for the present design method.

The alternative cell information is, for example, stored in an alternative cell information table 800. In the alternative cell information table 800, a "present cell number" field 801 shows a present cell number that identifies a standard cell, "switch instruction information" fields 802, 803, and 804 show switch instruction information that instructs each two-terminal circuit included in the standard cell identified by the present cell number to switch or maintain the disconnected state or the connected state, a "target layer" field 805 shows a layer number that identifies a layer, and an "alternative cell number" field 806 shows an alternative cell number that identifies another standard cell that differs from the standard cell identified by the present cell number and that can be obtained by changing the state of restricted areas in a layer identified by the corresponding layer number to switch the state of the two-terminal circuit for which the switch instruction information has been given.

The alternative cell information is calculated in advance, and is stored in the alternative cell information table 800.

13.2 Procedures

Figure 29:
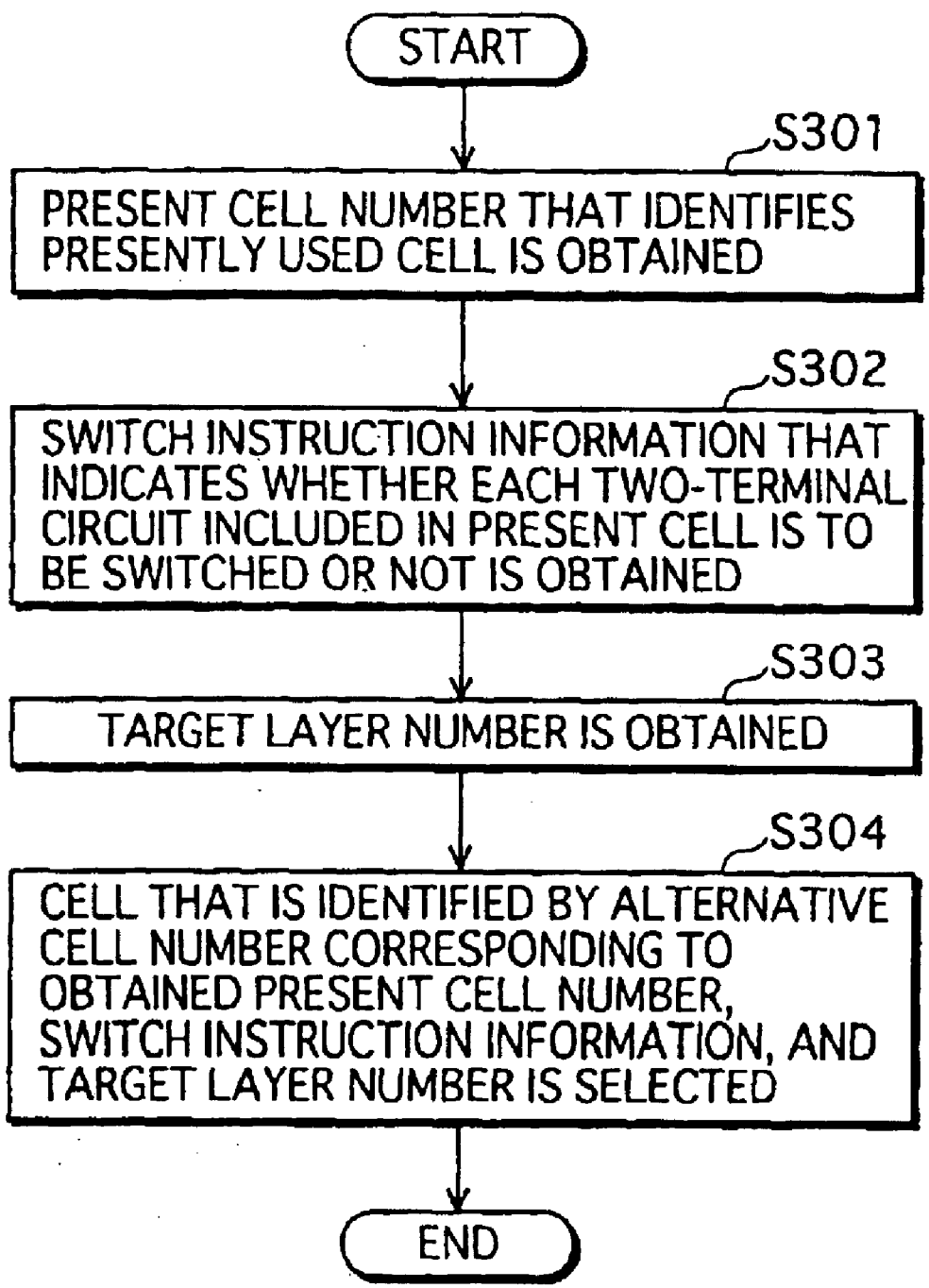
FIG. 29 is a flowchart showing a process for selecting a cell using the alternative cell information.

FIG. 29 is a flowchart showing the procedures executed when the present design method is used.

(Step S301) A present cell number that identifies a standard cell that is presently used in the semiconductor IC device is obtained.

(Step S302) Switch instruction information that instructs either to switch or maintain the circuit state of each two-terminal circuit included in the standard cell is obtained.

(Step S303) A layer number that identifies a target layer is obtained.

(Step S304) In the alternative cell information table, a standard cell that is identified by an alternative cell number stored in correspondence with the obtained present cell number, the switch instruction information, and the layer number is selected.

13.3 Conclusions

According to this design method, when the standard cell is to be replaced by a new standard cell that differs from the standard cell in the circuit state of its two-terminal circuit, alternative cell information that is calculated in advance for a combination of each standard cell and a two-terminal circuit whose circuit state is to be switched, and each target layer is referred to, so that the new standard cell can be obtained easily.

14. Fourteenth Embodiment

A design aiding device relating to a fourteen embodiment of the present invention provides an aid in changing design information representing a standard cell presently used in the semiconductor IC device, based on the design method described in the thirteenth embodiment.

14.1 Construction

Figure 30:
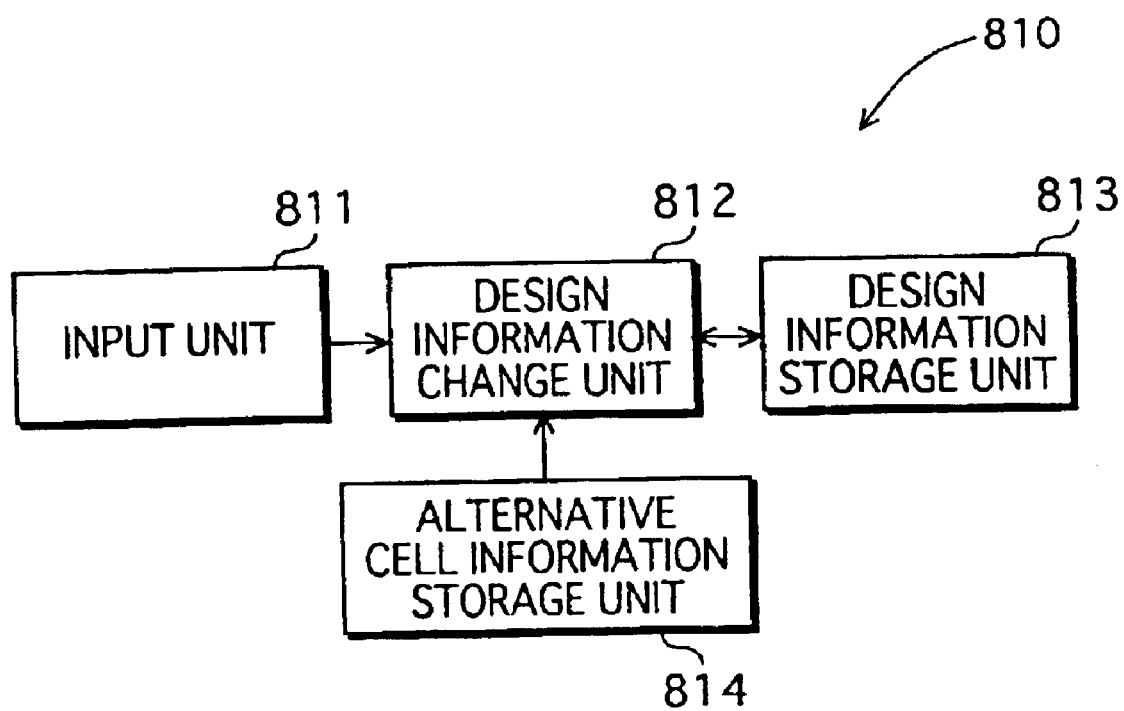
FIG. 30 is a functional block diagram of a design aiding device relating to a fourteenth embodiment of the present invention.

FIG. 30 is a functional block diagram showing the overall construction of a design aiding device 810. The design aiding device 810 includes an input unit 811, a design information change unit 812, a design information storage unit 810, and an alternative cell information storage unit 814.

The design aiding device 810 is specifically realized by hardware such as a processor, a ROM on which a program is recorded, a RAM that is a work area, and a hard disk device. The functions of the design aiding device 810 are realized by the processor executing the program recorded on the ROM. Information is passed among the elements of the design aiding device 810 via the RAM and the hard disk device.

The input unit 811 obtains, from outside of the device, a cell block number that identifies a cell block including a cell in which a change is to be made (hereafter referred to as a "target cell"), switch instruction information representing a two-terminal circuit whose circuit state is to be switched (hereafter referred to as a "target two-terminal circuit" in the target cell, and a target layer number that identifies a target layer. The input unit 811 then passes the obtained cell block number, the switch instruction information, and the target layer number, to the design information change update unit 812.

The design information storage unit 813 stores present cell information that identifies a standard cell that is presently placed in each cell block.

The design information change unit 812 changes the present cell information stored in the design information storage unit 813, based on the cell block number, the switch instruction information, and the target layer number that have been passed from the input unit 811.

The alternative cell information storage unit 814 stores the alternative cell information described in the thirteenth embodiment in the alternative cell information table 800 shown in FIG. 28.

14.2 Design Information

FIG. 31 shows one example of present cell information stored in a present cell information table 820 in the design information storage unit 813.

In the present cell information table 820, a "cell block number" field 821 shows a cell block number that identifies a cell block in which a standard cell is to be placed in the semiconductor IC device, and a "present cell number" field 822 shows a present cell number that identifies a standard cell that is presently placed in the cell block identified by the cell block number.

14.3 Operations

The design aiding device 810 operates with the same procedures as the design method in the thirteenth embodiment shown in the flowchart in FIG. 29.

(Step S301) The input unit 811 obtains a cell block number from outside, and the design information change unit 812 obtains a present cell number stored in the line including the obtained cell block number in the present cell information table 820 stored in the design information storage unit 813.

(Step S302) The input unit 811 obtains switch instruction information from outside.

(Step S303) The input unit 811 obtains a target layer number from outside.

(Step S304) The design information change unit 812 obtains an alternative cell number stored in the line including the present cell number, the switch instruction information, and the target layer number, in the alternative cell information table 800 stored in the alternative cell information storage unit 814, and updates the present cell number stored in the present cell information table 820 to the obtained alternative cell number.

15. Fifteenth Embodiment

A delay time selection circuit relating to a fifteenth embodiment of the present invention is constructed by using such signal selection circuits that are described in the eighth embodiment of the present invention.

Figure 32:
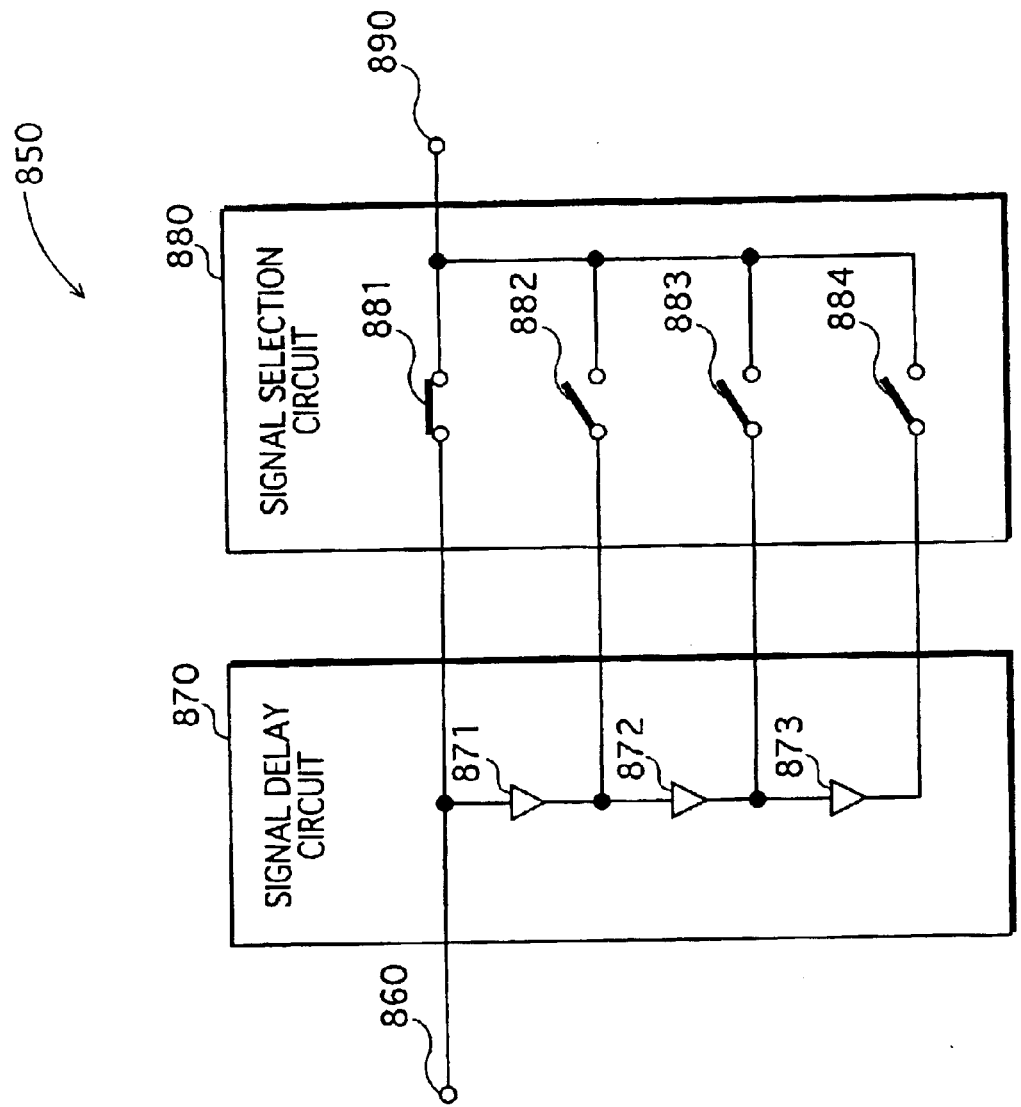
FIG. 32 is a functional block diagram of a delay time selection device in a fifteen embodiment of the present invention.

FIG. 32 is a functional block diagram showing a delay time selection circuit 850. The delay time selection circuit 850 includes an input terminal 860, a signal delay circuit 870 that delays an input signal that has been inputted into the input terminal 860 to generate one or more delay signals each with a different delay time, a signal selection circuit 880 into which the input signal and each delay signal generated by the signal delay circuit 870 are inputted and that selectively outputs one of the inputted signals, and an output terminal 890 that is connected to an output of the signal selection circuit 880.

The signal delay circuit 870 is constructed, as one example, by a plurality of gates 871 to 873 that are connected in series. The signal delay circuit 870 outputs a gate output of each phase as a delay signal.

The signal selection circuit 880 is the signal selection circuit described in the eighth embodiment.

The delay time selection circuit 850 is provided for a signal for which a timing adjustment is expected. When such a timing adjustment becomes necessary, a new delay time selection circuit that differs in a delay time of the signal and the state in one freely-chosen layer can be constructed.

A change in one freely-chosen layer being possible is advantageous, particularly when, for example, a correction of another defective is to be performed in one specific layer in addition to the timing adjustment. In such a case, the timing adjustment can be performed together with the correction of the other defective in the specific layer, by changing the one specific layer, without increasing the number of masks to be newly prepared.

The signal delay circuit 870 may generate delays of a signal using a wiring capacity, or a difference in a wiring length, instead of using the gates. For example, the present invention covers a signal selection circuit with the construction in which a wiring length for transmitting each signal is different.

The delay time selection circuit of the present invention may be realized as a standard cell. The present invention covers the standard cell that realizes the delay time selection circuit.

16. Sixteenth Embodiment

A semiconductor IC device relating to a sixteenth embodiment of the present invention realizes a plurality of functions. The semiconductor IC device includes such two-terminal circuits that are described in the first or third embodiment, and controls execution of a function that is identified by the state of each two-terminal circuit.

Figure 33:
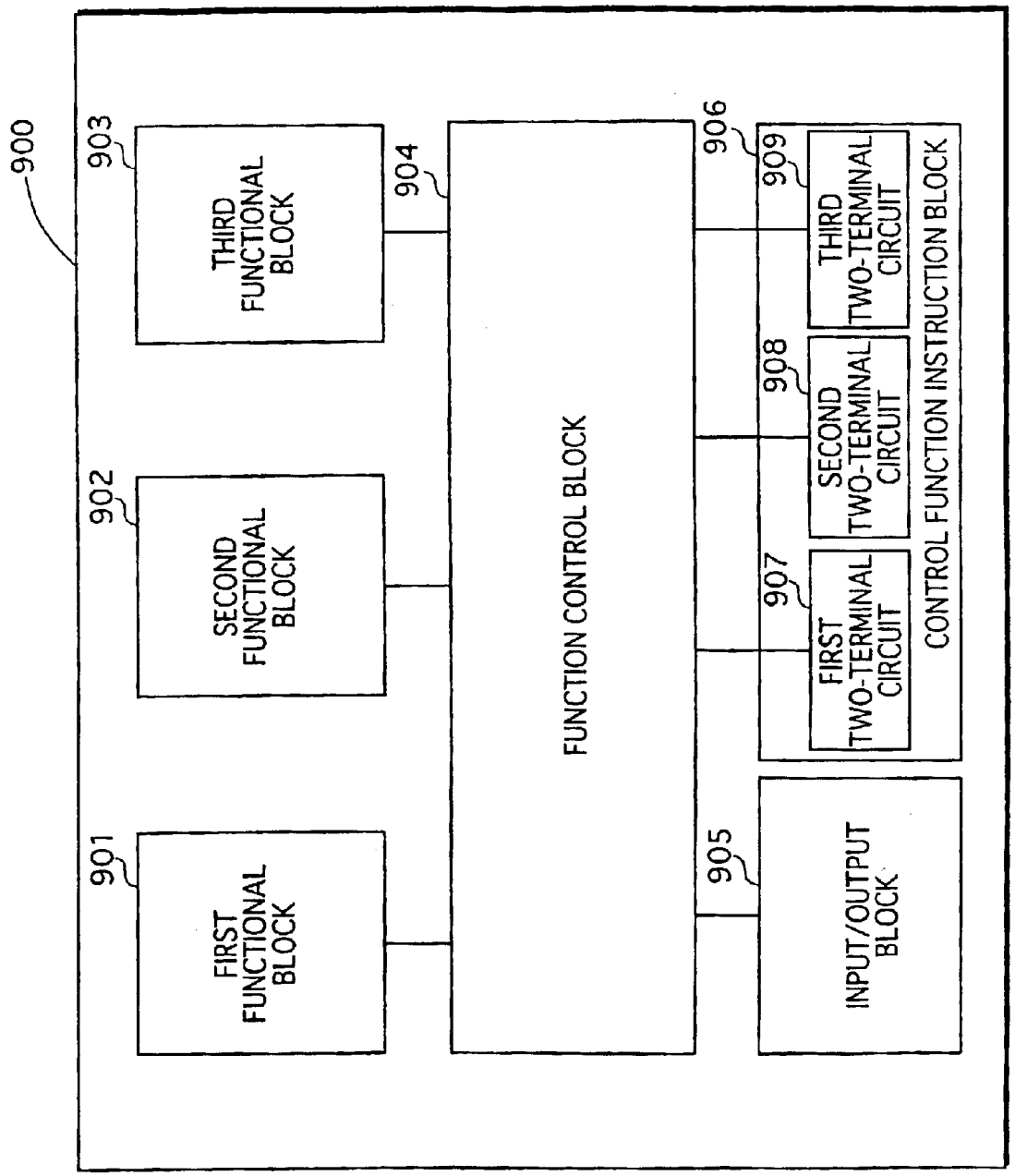
FIG. 33 is a functional block diagram of a mode selection device in a sixteenth embodiment of the present invention.

FIG. 33 is a functional block diagram showing one example of the semiconductor IC device. A semiconductor IC device 900 includes a first functional block 901, a second functional block 902, a third functional block 903, a function control block 904, an input/output block 905, and a control function instruction block 906.

The control function instruction block 906 includes two-terminal circuits 907 to 909 for giving an instruction for permitting or prohibiting execution of its function, to each functional block. The function control block 904 permits the functional blocks 901 to 903 to execute their functions, when the two-terminal circuits 907 to 909 are in the connected state, but prohibits the functional blocks 901 to 903 from executing their functions, when the two-terminal circuits 907 to 909 are in the disconnected state.

As one example, the semiconductor IC device 900 is a control device that is incorporated into an apparatus such as a portable information terminal, and realizes a plurality of service functions. The functional blocks 901 to 903 are provided in correspondence with the service functions, and are given permission or prohibition for executing the functions according to the circuit states of the corresponding two-terminal circuits 907 to 909.

According to this construction, a control device that is suitable for use in a variety of apparatuses that provide a user with different ranges of service functions can be easily realized by the above-described remake with a change in the state of two-terminal circuits included in one semiconductor IC device 900.

In particular, such a change of each two-terminal circuit to enable the control device to be suitable for use in a variety of apparatuses can be performed only in one freely-chosen layer of the two-terminal circuit. For example, when a correction of a defective is to be performed in one specific layer of the semiconductor IC device 900, the above remake can also be made with a change in the specific layer, so that the control device can be made suitable for a variety of apparatuses without increasing the number of masks to be newly prepared.

17. Seventeenth Embodiment

A semiconductor IC device relating to a seventeenth embodiment of the present invention includes secret information that needs to be concealed from a user. The semiconductor IC device has the construction that allows a developer of the semiconductor IC device to obtain the secret information from outside, for the purpose of verifying operations of the semiconductor IC device.

Figure 34:
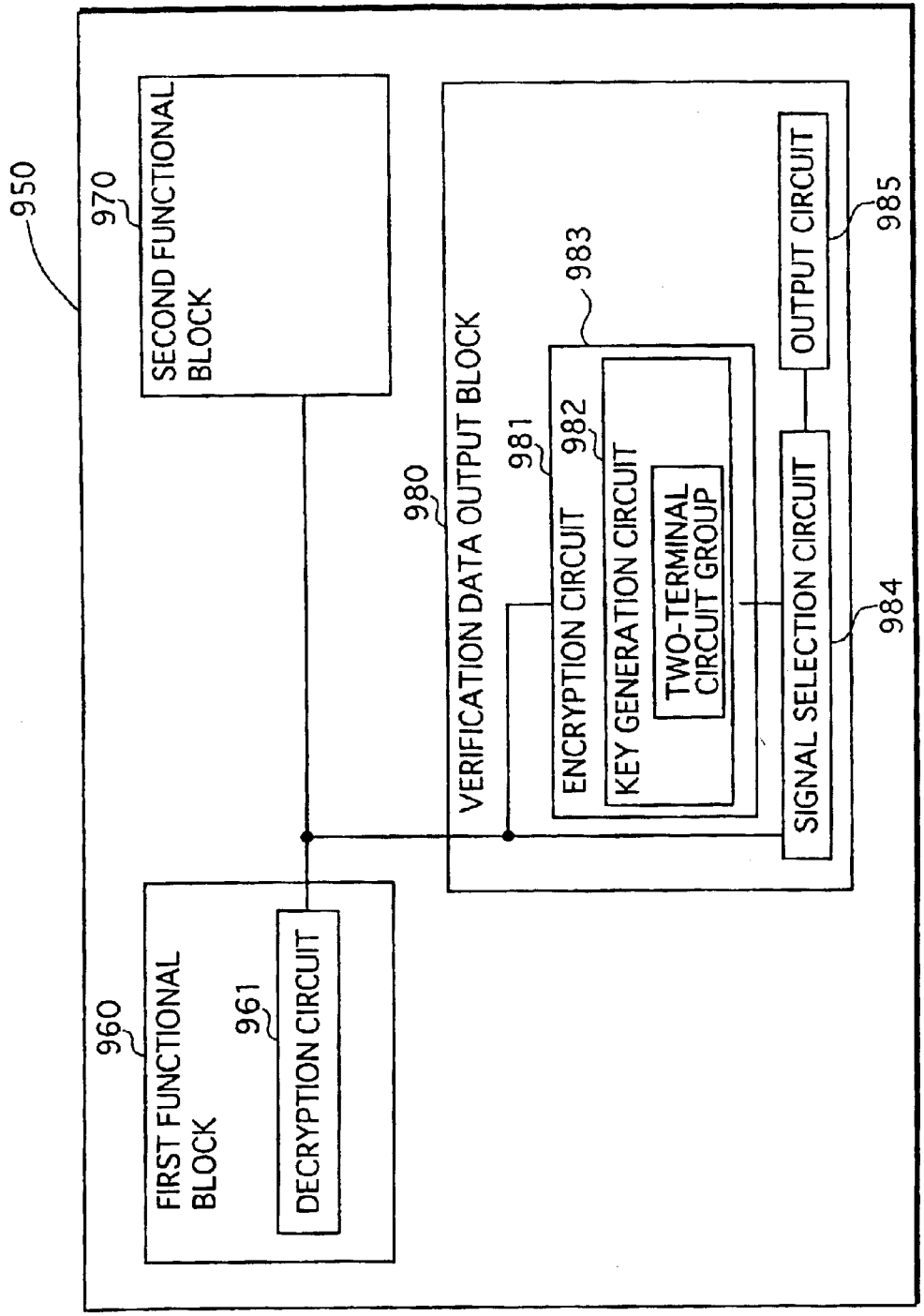
FIG. 34 is a functional block diagram of a secret information control device in a seventeenth embodiment of the present invention.

FIG. 34 is a functional block diagram showing one example of the semiconductor IC device. The semiconductor IC device 950 includes a first functional block 960, a second functional block 970, and a verification data output block 980.

As one example, the semiconductor IC device 950 may be a digital broadcast reception apparatus. In this case, the first functional block 960 receives encrypted digital content information and decrypts the encrypted digital content information using a decryption circuit 961, and outputs the decrypted digital content information to the second functional block 970. The second functional block 970 converts the decrypted digital content information into analogue video and audio signals, and outputs the analogue video and audio signals to outside.

Here, the decrypted digital content information needs to be concealed from the user in view of copyright protection. If the user obtains such information, he or she who is not authorized to duplicate the information may be able to unlimitedly duplicate the information without deterioration of the information.

It is extremely difficult for the user to obtain such information when the semiconductor IC device 950 does not have the construction to output the information to outside. The semiconductor IC device without such construction is accordingly preferable in view of copyright protection. However, there may be a case where the developer of the semiconductor IC device 950 wishes to obtain the information for the purpose of verifying the operations of the device. Taking such a case into consideration, the semiconductor IC device 950 includes the verification data output block 980.

The verification data output block 980 encrypts the decrypted digital content information using an encryption circuit 981 based on key information that has been generated by a key generation circuit 982 according to the state of a two-terminal circuit group 983, to generate verification information. Further, a signal selection circuit 984 outputs one of the decrypted digital content information and the verification information to an output circuit 985. The output circuit 985 outputs the information that has been inputted by the signal selection circuit 984, to outside of the device.

Here, the two-terminal circuit group 983 is constructed by using such two-terminal circuits that are described in the first or third embodiment. The signal selection circuit 984 is the signal selection circuit described in the eighth embodiment.

According to this construction, the decrypted digital content information can be outputted as being converted into the verification information, the contents of which can be concealed from the user. Alternatively, the decrypted digital content information can be outputted as it is at the prototyping stage.

In particular, a switch between the verification information and the decrypted digital content information to be outputted can be performed by the remake with a change in one freely-chosen layer of a two-terminal circuit. Therefore, at the transfer from the prototyping stage to the manufacturing state, a layer in which a final correction of a defective has been performed can be used to realize the above switch between the decrypted digital content information and the verification information, without increasing the number of masks to be newly prepared.

Also, the key information used to generate the verification information can be changed using one freely-chosen layer of a two-terminal circuit. Therefore, encryption reliability of the verification information can be maintained by, for example, changing the key information using the layer in which a correction of another defective has been performed, without increasing the number of masks to be newly prepared.

(Modifications)

Although the present invention is described based on the above embodiments, it should be clear that the present invention is not limited to the above specific embodiments. For example, the following modifications are possible.

(1) The present invention may be realized by a method including the steps described in the above embodiments. Also, the method may be realized by a computer program that can be executed using a computer system, or may be realized by a digital signal representing the program.

Also, the present invention may be realized by a computer-readable recording medium on which the program or the digital signal is recorded. Examples of the computer-readable recording medium include a flexible disk, a hard disk, a CD-ROM, an MO, a DVD, a DVD-ROM, a DVD-RAM, and a semiconductor memory.

Also, the computer program or the digital signal may be transmitted via a telephone communication line, a radio or cable communication line, or a network such as the Internet.

Also, the present invention may be a computer system including a microprocessor, and a memory that stores the program. The above method may be realized by the microprocessor operating in accordance with the program stored in the memory.

Also, the program and the digital signal may be transferred as being recorded on the recording medium, or via the network and the like, and may be executed in another independent computer system.

(2) For each signal path in the two-terminal circuit described in the third embodiment, restricted areas formed in adjacent layers may be sequentially connected in series.

According to this construction, each contact can be formed to have a thickness corresponding to one layer. In this case, the total length of the contacts can be minimized, and so the signal delay time of the two-terminal circuit can be shortened accordingly.

Although the present invention has been fully described byway of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A design method for changing design information representing a two-terminal circuit to enable a state capable of transmitting a signal, in a multilayer semiconductor integrated circuit device that includes a plurality of signal paths at one or more of the plurality of layers for connecting the two terminals with a restricted part at one or more layers, the restricted part being formed either in a connected or a disconnected state, the design information indicating whether each restricted part of each signal path included in the two-terminal circuit is to be formed in the connected state or in the disconnected state, the design method comprising:
an obtaining step of obtaining designation information that designates a target layer in which a change is to be made; and
a connecting step of changing the design information indicating that one signal path includes a restricted part in the target layer to be in the disconnected state and restricted parts in layers other than the target layer to be in the connected state, so as to indicate that the signal path includes the restricted part in the target layer to be in the connected state.

2. A design method for changing design information representing a two-terminal circuit to enable a state incapable of transmitting a signal, in a multilayer semiconductor integrated circuit device that includes a plurality of signal paths at one or more of the plurality of layers for connecting the two terminals with a restricted part at one or more layers, the restricted part being formed either in a connected or a disconnected state, the design information indicating whether each restricted part of each signal path included in the two-terminal circuit is to be formed in the connected state or in the disconnected state, the design method comprising:
an obtaining step of obtaining designation information that designates a target layer in which a change is to be made; and
a disconnecting step of changing the design information indicating that one signal path includes restricted parts in all the layers to be in the connected state, so as to indicate that the signal path includes the restricted part in the target layer to be in the disconnected state.

3. A design method for changing design information representing a two-terminal circuit to enable a state capable of transmitting a signal, in a multilayer semiconductor integrated circuit device that includes a plurality of signal paths at one or more of the plurality of layers for connecting the two terminals with a restricted part at one or more layers, the restricted part being formed either in a connected or a disconnected state, the design information indicating whether each restricted part of each signal path included in the two-terminal circuit is to be formed in the connected state or in the disconnected state, the design method comprising:
an obtaining step of obtaining designation information that designates a target layer in which a change is to be made; and
a connecting step of changing the design information indicating that one signal path includes a restricted part in the target layer to be in the disconnected state and restricted parts in layers other than the target layer to be in the connected state, so as to indicate that the signal path includes the restricted part in the target layer to be in the connected state; and
a preparing step of changing the design information indicating that one signal path includes a restricted part in a reference layer that is different from the target layer to be in the disconnected state and restricted parts in layers other than the reference layer to be in the connected state, so as to indicate that the signal path includes the restricted part in the target layer to be in the disconnected state.

4. A design method according to claim 3 that uses a state expression showing a change record of the design information, further comprising:

a state expression updating step of updating the state expression by using a transformation rule in which a left part of an arrow matches the state expression, out of a transformation rule [i] "T1+(Ax−Bkx)→T1", and a transformation rule [ii] "T→T+(C−Ak)", where "k" is a layer number identifying the target layer, "x" is a layer number that is different from "k", "T1+(Ax−Bkx)" and "T" each are the state expression, "T1" is a partial expression included in the state expression, and "Ak", "Ax", "Bkx", and "C" each are a constant term included in the state expression, in such a manner that the state expression is changed to be a right part of the arrow in the used transformation rule; and a controlling step of
(a) executing the preparing step by setting a layer identified by the layer number "x" as the reference layer when the state expression is updated by using the transformation rule [i], and (b) executing the connecting step when the state expression is updated by using the transformation rule [ii].

5. A design method for changing design information representing a two-terminal circuit to enable a state capable of transmitting a signal, in a multilayer semiconductor integrated circuit device that includes a plurality of signal paths at one or more of the plurality of layers for connecting the two terminals with a restricted part at one or more layers, the restricted part being formed either in a connected or a disconnected state, the design information indicating whether each restricted part of each signal path included in the two-terminal circuit is to be formed in the connected state or in the disconnected state, the design method comprising:

an obtaining step of obtaining designation information that designates a target layer in which a change is to be made;

a disconnecting step of changing the design information indicating that one signal path includes restricted parts in all the layers to be in the connected state, so as to indicate that the signal path includes the restricted part in the target layer to be in the disconnected state; and a first preparing step of changing the design information indicating that one signal path includes a restricted part in the target layer and a restricted part in a first reference layer that is different from the target layer to be in the disconnected state and restricted parts in layers other than the target layer and the first reference layer to be in the connected state, so as to indicate that the signal path includes the restricted part in the target layer to be in the connected state; and a second preparing step of changing the design information indicating that one signal path includes a restricted part in a second reference layer that is different from the target layer to be in the disconnected state and restricted parts in layers other than the second reference layer to be in the connected state, so as to indicate that the signal path includes the restricted part in the target layer to be in the disconnected state.

6. A design method according to claim 5 that uses a state expression showing a change record of the design information, further comprising:

a state expression updating step of updating the state expression by using a transformation rule in which a left part of an arrow matches the state expression, out of a transformation rule [i] "T1+(Ax−Bmx)→T1", a transformation rule [ii] "T2+(C−Am)→T2", and a transformation rule [iii] "T3+(C−Ay)→T3+(Am−Bmy)", where "m" is a layer number identifying the target layer, "x" and "y" each are a layer number that is different from "m", "T1+(Ax−Bmx)", "T2+(C−Am)", and "T3+(C−Ay)" each are the state expression, "T1", "T2", and "T3" each are a partial expression included in the state expression, and "Ax", "Am", "Ay", "Bmx", "Bmy", and "C" each are a constant term included in the state expression, in such a manner that the state expression is changed to be a right part of the arrow in the used transformation rule; and a controlling step of (a) executing the second preparing step by setting a layer identified by the layer number "x" as the second reference layer when the state expression is updated by using the transformation rule [i], (b) executing the disconnecting step when the state expression is updated by using the transformation rule [ii], and (c) executing the disconnecting step and the first preparing step by setting a layer identified by the layer number "y" as the first reference layer when the state expression is updated by using the transformation rule [iii].

7. A design aiding device for changing design information representing a two-terminal circuit to enable a state capable of transmitting a signal, in a multilayer semiconductor integrated circuit device that includes a plurality of signal paths at one or more of the plurality of layers for connecting the two terminals with a restricted part at one or more layers, the restricted part being formed either in a connected or a disconnected state, comprising:

design information storing means for storing design information that indicates whether each restricted part of each signal path included in the two-terminal circuit is to be formed in the connected state or in the disconnected state;

state expression storing means for storing a state expression showing a change record of the design information;

state expression updating means for updating the state expression by using one of transformation rules defined as a transformation rule [i] "T1+(Ax−Bkx)→T1", and a transformation rule [ii] "T→T+(C−Ak)", where a left part of an arrow matches the state expression, and where "k" is a layer number identifying the target layer, "x" is a layer number that is different from "k", "T1+(Ax−Bkx)" and "T" each are the state expression, "T1" is a partial expression included in the state expression, and "Ak", "Ax", "Bkx", and "C" each are a constant term included in the state expression, in such a manner that the state expression is changed to be a right part of the arrow in the used transformation rule; and design information changing means for changing the design information according to the one of the transformation rules that has been used to update the state expression.

8. A design aiding device that provides an aid in changing design information representing a two-terminal circuit to enable a state incapable of transmitting a signal, in a multilayer semiconductor integrated circuit device that includes a plurality of signal paths at one or more of the plurality of layers for connecting the two terminals with a restricted part at one or more layers, the restricted part being formed either in a connected or a disconnected state, comprising:

design information storing means for storing design information that indicates whether each restricted part of each signal path included in the two-terminal circuit is to be formed in the connected state or in the disconnected state;

state expression storing means for storing a state expression showing a change record of the design information;

state expression updating means for updating the state expression by using a transformation rule in which a left part of an arrow matches the state expression, out of a transformation rule [i] "T1+(Ax−Bmx)→T1", a transformation rule [ii] "T2+(C−Am)→T2", and a transformation rule [iii] "T3+(C−Ay)→T3+(Am−Bmy)", where "m" is a layer number identifying the target layer, "x" and "y" each are a layer number that is different from "m", "T1+(Ax−Bmx)", "T2+(C−Am)", and "T3+(C−Ay)" each are the state expression, "T1", "T2", and "T3" each are a partial expression included in the state expression, and "Ax", "Am", "Ay", "Bmx", "Bmy", and "C" each are a constant term included in the state expression, in such a manner that the state expression is changed to be a right part of the arrow in the used transformation rule; and design information changing means for changing the design information according to the one of the transformation rules that has been used to update the state expression.

9. A design method for selecting an initial construction of a two-terminal circuit in a multilayer semiconductor integrated circuit device that includes a plurality of signal paths at one or more of the plurality of layers for connecting the two terminals with a restricted part at one or more layers, the restricted part being formed either in a connected or a disconnected state, the initial construction enabling a two-terminal circuit whose circuit state is switched between a signal-transmittable state and a signal-untransmittable state to be constructed repeatedly at least a predetermined number of times by changing a state of one or more restricted parts in a target layer each time, the design method comprising:

an obtaining step of obtaining information that indicates the predetermined number of times "N";

a first calculating step of calculating a number of signal paths "A" that constitute a first candidate circuit that is represented by first design information to which a change operation according to obtaining designation information that designates a target layer and one of a connecting step for changing the design information to place a restricted part in a connecting state and a disconnect step for changing the design information to place a restricted part in a disconnect state can be alternately applied at least the number of times "N";

a second calculating step of calculating a number of signal paths "B" that constitute a second candidate circuit that is represented by second design information to which a change operation according to alternative procedures (1) changing the design information indicating that one signal path includes a restricted part in the target layer to be in a disconnected state and restricted parts in layers other than the target layer to be in the connected state, so as to indicate that the signal path includes the restricted part in the target layer to be in the connected state; and a preparing step of changing the design information indicating that one signal path includes a restricted part in a reference layer that is different from the target layer to be in the disconnected state and restricted parts in layers other than the reference layer to be in the connected state, so as to indicate that the signal path includes the restricted part in the target layer to be in the disconnected state, and (2) a disconnecting step of changing the design information indicating that one signal path includes restricted parts in all the layers to be in the connected state, so as to indicate that the signal path includes the restricted part in the target layer to be in the disconnected state; and a first preparing step of changing the design information indicating that one signal path includes a restricted part in the target layer and a restricted part in a first reference layer that is different from the target layer to be in the disconnected state and restricted parts in layers other than the target layer and the first reference layer to be in the connected state, so as to indicate that the signal path includes the restricted part in the target layer to be in the connected state; and a second preparing step of changing the design information indicating that one signal path includes a restricted part in a second reference layer that is different from the target layer to be in the disconnected state and restricted parts in layers other than the second reference layer to be in the connected state, so as to indicate that the signal path includes the restricted part in the target layer to be in the disconnected state;

procedures (1) and (2) can be alternately applied an unlimited number of times; and a selecting step of (a) selecting, as the initial construction, a construction of the first candidate circuit in a case where the number of signal paths "A" is smaller than the number of signal paths "B", and (b) selecting, as the initial construction, a construction of the second candidate circuit in a case where the number of signal paths "A" is not smaller than the number of signal paths "B".

10. A design method for selecting, against a first standard cell including a two-terminal circuit in a multilayer semiconductor integrated circuit device that includes a plurality of signal paths at one or more of the plurality of layers for connecting the two terminals with a restricted part at one or more layers, the restricted part being formed either in a connected or a disconnected state, is presently being selected, a second standard cell that differs from the first standard cell only in that a signal transmission state of a two-terminal circuit included therein is being switched, the design method using alternative information identifying an alternative standard cell that includes a two-terminal circuit whose signal transmission state differs from the signal transmission state of the two-terminal circuit included in the second standard cell by changing a state of restricted parts in a target layer of the two-terminal circuit, each of the plurality of layers being set as the target layer, the design method comprising:

an obtaining step of obtaining designation information that designates the target layer; and a selecting step of selecting, as the second standard cell, the alternative standard cell identified by the alternative information for the designated target layer.

11. A design aiding device that provides an aid in selecting, against a first standard cell including a two-terminal circuit in a multilayer semiconductor integrated circuit device that includes a plurality of signal paths at one or more of the plurality of layers for connecting the two terminals with a restricted part at one or more layers, the restricted part being formed either in a connected or a disconnected state, that is presently being selected, a second standard cell that differs from the first standard cell only in that a signal transmission state of a two-terminal circuit included therein is being switched, the design aiding device comprising:
  alternative information storing means for storing alternative information that identifies an alternative standard cell that includes a two-terminal circuit whose signal transmission state differs from the signal transmission state of the two-terminal circuit included in the second standard cell by changing a state of restricted parts in a target layer of the two-terminal, each of the plurality of layers being set as the target layer;
  obtaining means for obtaining designation information that designates the target layer; and
  selecting means for selecting, as the second standard cell, the alternative standard cell identified by the alternative information for the designated target layer.

12. A computer-executable program that is executed on a computer to provide an aid in design for changing design information representing a two-terminal circuit in a state incapable of transmitting a signal, in a multilayer semiconductor integrated circuit device that includes a plurality of signal paths at one or more of the plurality of layers for connecting the two terminals with a restricted part at one or more layers, the restricted part being formed either in a connected or a disconnected state, to a state capable of transmitting a signal, the design information indicating whether each restricted part of each signal path included in the two-terminal circuit is to be formed in the connected state or in the disconnected state,
the program making the computer execute the steps of:
  obtaining designation information that designates a target layer in which a change is to be made; and
  changing the design information indicating that one signal path includes a restricted part in the target layer to be in the disconnected state and restricted parts in layers other than the target layer to be in the connected state, so as to indicate that the signal path includes the restricted part in the target layer to be in the connected state.

13. A computer-executable program that is executed on a computer to provide an aid in design for changing design information representing a two-terminal circuit in a state capable of transmitting a signal, in a multilayer semiconductor integrated circuit device that includes a plurality of signal paths at one or more of the plurality of layers for connecting the two terminals with a restricted part at one or more layers, the restricted part being formed either in a connected or a disconnected state, to a state incapable of transmitting a signal,
the design information indicating whether each restricted part of each signal path included in the two-terminal circuit is to be formed in the connected state or in the disconnected state,
the program making the computer execute the steps of:
  obtaining designation information that designates a target layer in which a change is to be made; and
  changing the design information indicating that one signal path includes restricted parts in all the layers to be in the connected state, so as to indicate that the signal path includes the restricted part in the target layer to be in the disconnected state.

14. A computer-executable program that is executed on a computer to provide an aid in design for changing design information representing a two-terminal circuit in a multilayer semiconductor integrated circuit device that includes a plurality of signal paths at one or more of the plurality of layers for connecting the two terminals with a restricted part at one or more layers, the restricted part being formed either in a connected or a disconnected state, in a state incapable of transmitting a signal, so as to represent a two-terminal circuit that is in a state capable of transmitting a signal, the design information indicating whether each restricted part of each signal path included in the two-terminal circuit is to be formed in the connected state or in the disconnected state,
the program making the computer execute the steps of:
  obtaining designation information that designates a target layer in which a change is to be made;
  changing the design information indicating that one signal path includes a restricted part in the target layer to be in the disconnected state and restricted parts in layers other than the target layer to be in the connected state, so as to indicate that the signal path includes the restricted part in the target layer to be in the connected state; and
  changing the design information indicating that one signal path includes a restricted part in a reference layer that is different from the target layer to be in the disconnected state and restricted parts in layers other than the reference layer to be in the connected state, so as to indicate that the signal path includes the restricted part in the target layer to be in the disconnected state.

15. A computer-executable program according to claim 14,
wherein the design is performed using a state expression showing a change record of the design information, and
the program further makes the computer execute the steps of:
  updating the state expression by using a transformation rule in which a left part of an arrow matches the state expression, out of
  a transformation rule [i] "T1+(Ax−Bkx)→T1", and
  a transformation rule [ii] "T→T+(C−Ak)",
  where "k" is a layer number identifying the target layer, "x" is a layer number that is different from "k", "T1+(Ax−Bkx)" and "T" each are the state expression, "T1" is a partial expression included in the state expression, and "Ak", "Ax", "Bkx", and "C" each are a constant term included in the state expression,
  in such a manner that the state expression is changed to be a right part of the arrow in the used transformation rule; and
  (a) executing the preparing step by setting a layer identified by the layer number "x" as the reference layer when the state expression is updated by using the transformation rule [i] and
  (b) executing the connecting step when the state expression is updated by using the transformation rule [ii].

16. A computer-executable program that is executed on a computer to provide an aid in design for changing design information representing a two-terminal circuit in a multilayer semiconductor integrated circuit device that includes a plurality of signal paths at one or more of the plurality of layers for connecting the two terminals with a restricted part at one or more layers, the restricted part being formed either in a connected or a disconnected state, the two-terminal circuit is in a state capable of transmitting a signal, to a state incapable of transmitting a signal, the design information indicating whether each restricted part of each signal path included in the two-terminal circuit is to be formed in the connected state or in the disconnected state, the program making the computer execute the steps of:
  obtaining designation information that designates a target layer in which a change is to be made;
  changing the design information indicating that one signal path includes restricted parts in all the layers to be in the connected state, so as to indicate that the signal path includes the restricted part in the target layer to be in the disconnected state; and
  changing the design information indicating that one signal path includes a restricted part in the target layer and a restricted part in a first reference layer that is different from the target layer to be in the disconnected state and restricted parts in layers other than the target layer and the first reference layer to be in the connected state, so as to indicate that the signal path includes the restricted part in the target layer to be in the connected state; and
  changing the design information indicating that one signal path includes a restricted part in a second reference layer that is different from the target layer to be in the disconnected state and restricted parts in layers other than the second reference layer to be in the connected state, so as to indicate that the signal path includes the restricted part in the target layer to be in the disconnected state.

17. A computer-executable program according to claim 16,
  wherein the design is performed using a state expression showing a change record of the design information, and
  the program further makes the computer execute the steps of:
    updating the state expression by using a transformation rule in which a left part of an arrow matches the state expression, out of
      a transformation rule [i] "T1+(Ax−Bmx)→T1",
      a transformation rule [ii] "T2+(C−Am)→T2", and
      a transformation rule [iii] "T3+(C−Ay)→T3+(Am−Bmy)",
    where "m" is a layer number identifying the target layer, "x" and "y" each are a layer number that is different from "m", "T1+(Ax−Bmx)", "T2+(C−Am)", and "T3+(C−Ay)" each are the state expression, "T1", "T2", and "T3" each are a partial expression included in the state expression, and "Ax", "Am", "Ay", "Bmx", "Bmy", and "C" each are a constant term included in the state expression,
    in such a manner that the state expression is changed to be a right part of the arrow in the used transformation rule; and
    (a) executing the second preparing step by setting a layer identified by the layer number "x" as the second reference layer when the state expression is updated by using the transformation rule [i],
    (b) executing the disconnecting step when the state expression is updated by using the transformation rule [ii], and
    (c) executing the disconnecting step and the first preparing step by setting a layer identified by the layer number "y" as the first reference layer when the state expression is updated by using the transformation rule [iii] showing a change record of the design information, and
  the program further makes the computer execute the steps of:
    updating the state expression by using a transformation rule in which a left part of an arrow matches the state expression, out of
      a transformation rule [i] "T1+(Ax−Bmx)→T1",
      a transformation rule [ii] "T2+(C−Am)→T2", and
      a transformation rule [iii] "T3+(C−Ay)→T3+(Am−Bmy)",
    where "m" is a layer number identifying the target layer, "x" and "y" each are a layer number that is different from "m", "T1+(Ax−Bmx)", "T2+(C−Am)", and "T3+(C−Ay)" each are the state expression, "T1", "T2", and "T3" each are a partial expression included in the state expression, and "Ax", "Am", "Ay", "Bmx", "Bmy", and "C" each are a constant term included in the state expression,
    in such a manner that the state expression is changed to be a right part of the arrow in the used transformation rule; and
    (a) executing the second preparing step by setting a layer identified by the layer number "x" as the second reference layer when the state expression is updated by using the transformation rule [i],
    (b) executing the disconnecting step when the state expression is updated by using the transformation rule [ii].

18. A computer-executable program that is executed on a computer to provide an aid in design for selecting an initial construction of a two-terminal circuit in a multilayer semiconductor integrated circuit device that includes a plurality of signal paths at one or more of the plurality of layers for connecting the two terminals with a restricted part at one or more layers, the restricted part being formed either in a connected or a disconnected state, the initial construction enabling a two-terminal circuit whose circuit state is switched between a signal-transmittable state and a signal-untransmittable state to be constructed repeatedly at least a predetermined number of times by changing a state of one or more restricted parts in a target layer each time, the program making the computer execute the steps of:
  an obtaining step of obtaining information that indicates the predetermined number of times "N";
  a first calculating step of calculating a number of signal paths "A" that constitute a first candidate circuit that is represented by first design information to which a change operation according to obtaining designation information that designates a target layer and one of a connecting step for changing the design information to place a restricted part in a connecting state and a disconnect step for changing the design information to place a restricted part in a disconnect state can be alternately applied at least the number of times "N";
  a second calculating step of calculating a number of signal paths "B" that constitute a second candidate circuit that is represented by second design information to which a change operation according to alternative procedures of,
    (1) changing the design information indicating that one signal path includes a restricted part in the target layer to be in a disconnected state and restricted parts in layers other than the target layer to be in the connected state, so as to indicate that the signal path includes the restricted part in the target layer to be in the connected state; and
    a preparing step of changing the design information indicating that one signal path includes a restricted part in a reference layer that is different from the target layer to be in the disconnected state and restricted parts in layers other than the reference layer to be in the connected state, so as to indicate that the signal path includes the restricted part in the target layer to be in the disconnected state, and (2) a disconnecting step of changing the design information indicating that one signal path includes restricted parts in all the layers to be in the connected state, so as to indicate that the signal path includes the restricted part in the target layer to be in the disconnected state; and a first preparing step of changing the design information indicating that one signal path includes a restricted part in the target layer and a restricted part in a first reference layer that is different from the target layer to be in the disconnected state and restricted parts in layers other than the target layer and the first reference layer to be in the connected state, so as to indicate that the signal path includes the restricted part in the target layer to be in the connected state; and a second preparing step of changing the design information indicating that one signal path includes a restricted part in a second reference layer that is different from the target layer to be in the disconnected state and restricted parts in layers other than the second reference layer to be in the connected state, so as to indicate that the signal path includes the restricted part in the target layer to be in the disconnected state;

procedures (1) and (2) can be alternately applied an unlimited number of times; and a selecting step of (a) selecting, as the initial construction, a construction of the first candidate circuit in a case where the number of signal paths "A" is smaller than the number of signal paths "B", and (b) selecting, as the initial construction, a construction of the second candidate circuit in a case where the number of signal paths "A" is not smaller than the number of signal paths "B".

19. A computer-executable program that is executed on a computer to provide an aid in design for selecting, against a first standard cell including a two-terminal circuit in a multilayer semiconductor integrated circuit device that includes a plurality of signal paths at one or more of the plurality of layers for connecting the two terminals with a restricted part at one or more layers, the restricted part being formed either in a connected or a disconnected state, that is presently being selected, a second standard cell that differs from the first standard cell only in that a signal transmission state of a two-terminal circuit included therein is being switched, the design method using alternative information identifying an alternative standard cell that includes a two-terminal circuit whose signal transmission state differs from the signal transmission state of the two-terminal circuit included in the second standard cell by changing a state of restricted parts in a target layer of the two-terminal circuit, each of the plurality of layers being set as the target layer, the program making the computer execute the steps of:
obtaining designation information that designates the target layer; and
selecting, as the second standard cell, the alternative standard cell identified by the alternative information for the designated target layer.

20. A computer-readable recording medium on which a program defined in claim 19 is recorded.

* * * * *